(12) United States Patent
Kuhr et al.

(10) Patent No.: US 7,799,598 B2
(45) Date of Patent: Sep. 21, 2010

(54) PROCESSING SYSTEMS AND METHODS FOR MOLECULAR MEMORY

(75) Inventors: Werner G. Kuhr, Denver, CO (US);
Ritu Shrivastava, Fremont, CA (US);
Antonio R. Gallo, Colorado Springs, CO (US); Kenneth J. Mobley, Colorado Springs, CO (US); Tom DeBolske, Santa Cruz, CA (US)

(73) Assignee: ZettaCore, Inc., Englewood, CO (US)

(*) Notice: Subject to any disclaimer, the term of this patent is extended or adjusted under 35 U.S.C. 154(b) by 0 days.

(21) Appl. No.: 12/048,427

(22) Filed: Mar. 14, 2008

(65) Prior Publication Data
US 2008/0219041 A1 Sep. 11, 2008

Related U.S. Application Data

(63) Continuation of application No. 11/118,042, filed on Apr. 29, 2005, now Pat. No. 7,358,113, which is a continuation-in-part of application No. 11/046,518, filed on Jan. 28, 2005, now abandoned, and a continuation-in-part of application No. 10/834,630, filed on Apr. 29, 2004, which is a continuation-in-part of application No. 10/766,304, filed on Jan. 28, 2004, now abandoned.

(51) Int. Cl.
*H01L 51/40* (2006.01)
(52) U.S. Cl. ........................................ 438/99
(58) Field of Classification Search .................. None
See application file for complete search history.

(56) References Cited

U.S. PATENT DOCUMENTS

| 4,547,273 | A | * | 10/1985 | Ayers | 205/440 |
| 4,908,114 | A | * | 3/1990 | Ayers | 204/252 |
| 5,141,604 | A | * | 8/1992 | Ayers | 205/637 |
| 5,650,061 | A | | 7/1997 | Kuhr et al. | |
| 5,820,922 | A | | 10/1998 | Ricco et al. | |
| 5,883,397 | A | | 3/1999 | Isoda et al. | 257/40 |
| 5,923,525 | A | | 7/1999 | Belyakov et al. | |
| 5,926,412 | A | | 7/1999 | Evans, Jr. et al. | |
| 6,017,696 | A | | 1/2000 | Heller | |

(Continued)

FOREIGN PATENT DOCUMENTS
DE 102 27 850 A1 1/2004

(Continued)

OTHER PUBLICATIONS

Roth, K. M., Thesis published in 2002, Chapter I overview pp. 1-285.

(Continued)

*Primary Examiner*—Charles D Garber
*Assistant Examiner*—Andre' C Stevenson
(74) *Attorney, Agent, or Firm*—Morgan, Lewis & Bockius LLP

(57) ABSTRACT

Molecular memories, i.e., memories that incorporate molecules for charge storage, are disclosed. Molecular memory cells, molecular memory arrays, and electronic devices including molecular memory are also disclosed, as are processing systems and methods for manufacturing molecular memories. Methods of manufacturing molecular memories that enable semiconductor devices and interconnections to be manufactured monolithically with molecular memory are also disclosed.

19 Claims, 39 Drawing Sheets

U.S. PATENT DOCUMENTS

| | | | |
|---|---|---|---|
| 6,208,553 B1 | 3/2001 | Gryko et al. |
| 6,212,093 B1 | 4/2001 | Lindsey |
| 6,272,038 B1 | 8/2001 | Clausen et al. |
| 6,290,839 B1 | 9/2001 | Kayyem et al. |
| 6,294,392 B1 | 9/2001 | Kuhr et al. |
| 6,324,091 B1 | 11/2001 | Gryko et al. |
| 6,326,215 B1 | 12/2001 | Keen |
| 6,348,707 B1 | 2/2002 | Linliu |
| 6,381,169 B1 | 4/2002 | Bocian et al. |
| 6,451,942 B1 | 9/2002 | Li et al. |
| 6,462,931 B1 | 10/2002 | Tang et al. |
| 6,484,394 B1 | 11/2002 | Heo et al. |
| 6,492,056 B1 | 12/2002 | Ovshinsky |
| 6,642,376 B2 | 11/2003 | Lindsey et al. |
| 6,657,884 B2 | 12/2003 | Bocian et al. |
| 6,674,121 B2 | 1/2004 | Misra et al. |
| 6,706,473 B1 | 3/2004 | Edman et al. |
| 6,728,129 B2 | 4/2004 | Lindsey et al. |
| 6,768,157 B2 | 7/2004 | Krieger et al. |
| 6,777,516 B2 | 8/2004 | Li et al. |
| 6,853,472 B2 | 2/2005 | Warner et al. |
| 6,855,417 B2 | 2/2005 | McCreery |
| 6,855,950 B2 | 2/2005 | McCreery |
| 6,921,475 B2 | 7/2005 | Kuhr et al. |
| 6,944,047 B2 | 9/2005 | Rotenberg et al. |
| 6,958,270 B2 | 10/2005 | Misra et al. |
| 7,005,237 B2 | 2/2006 | Lindsey |
| 7,019,391 B2 | 3/2006 | Tranz |
| 7,032,277 B2 | 4/2006 | Rolla et al. |
| 7,042,755 B1 | 5/2006 | Bocian et al. |
| 7,061,791 B2 | 6/2006 | Bocian et al. |
| 7,074,519 B2 | 7/2006 | Kuhr et al. |
| 7,253,466 B2 | 8/2007 | Misra et al. |
| 7,312,100 B2 | 12/2007 | Bocian et al. |
| 7,518,905 B2 | 4/2009 | Bocian et al. |
| 2001/0000492 A1 | 4/2001 | Figura |
| 2001/0010654 A1 | 8/2001 | Shau |
| 2002/0004278 A1 | 1/2002 | Gutsche |
| 2002/0027802 A1 | 3/2002 | Noble |
| 2002/0105897 A1 | 8/2002 | McCreery et al. |
| 2002/0154535 A1* | 10/2002 | Bocian et al. | 365/151 |
| 2002/0158295 A1 | 10/2002 | Armgarth et al. | 257/431 |
| 2002/0180446 A1 | 12/2002 | Kuhr et al. |
| 2003/0081463 A1 | 5/2003 | Bocian et al. |
| 2003/0082444 A1 | 5/2003 | Kuhr et al. |
| 2004/0007758 A1 | 1/2004 | McCreery |
| 2004/0115524 A1 | 6/2004 | Misra et al. |
| 2004/0150465 A1 | 8/2004 | Nishida et al. |
| 2004/0151912 A1 | 8/2004 | McCreery |
| 2005/0041494 A1 | 2/2005 | Bocian et al. |
| 2005/0048691 A1 | 3/2005 | Bocian et al. |
| 2005/0062097 A1 | 3/2005 | Misra et al. |
| 2005/0185447 A1 | 8/2005 | Kuhr et al. |
| 2005/0194627 A1 | 9/2005 | Nomoto et al. |
| 2005/0207208 A1 | 9/2005 | Bocian et al. |
| 2005/0236654 A1 | 10/2005 | Kijima et al. |
| 2005/0270820 A1 | 12/2005 | Mobley et al. |
| 2006/0151780 A1 | 7/2006 | Ufert |

FOREIGN PATENT DOCUMENTS

| | | |
|---|---|---|
| EP | 1 482 574 A2 | 12/2004 |
| WO | WO 01/03126 A2 | 1/2001 |
| WO | WO 02/077633 A1 | 10/2002 |
| WO | WO 03/052835 A1 | 6/2003 |
| WO | WO 03/071552 A | 8/2003 |

OTHER PUBLICATIONS

Luyken, R. J., et al., "Concepts for hybrid CMOS-molecular non-volatile memories" *Nanotechnology IOP Publishing UK.*, vol. 14, No. 2, 2003, pp. 273-276.

Kwok, K. S., "Materials for future electronics" *Materials Today, Elsevier Science*, Kidlington, GB, vol. 6, No. 12, Dec. 2003, pp. 20-27.

Gowda, et al., "Hybrid silicon/molecular memories-co-engineering for novel functionality" *International Electron Devices Meeting 2003 IEDM. Technical Digest.*, Washington, DC, Dec. 8-10, 2003, New York, NY:IEEE, US, pp. 537-540.

Roth K. M., et al. "Measurements of Electron-Transfer Rates of Charge-Storage Molecular Monolayers On Si(100). Toward Molecular/Semiconductor Information Storage Devices", *J. Am. Chem. Soc.; Journal of the American Chemical Society* Jan 15, 2003, vol. 125, No. 2, Jan. 15, 2003, pp. 505-517.

Gittins, et al., "A nonmetre-scale electronic switch consisting of a metal cluster and redox-addressable groups" *Nature, MacMillan Journals, Ltd.*, London, GB, vol. 408, Nov. 2, 2000, pp. 67-69.

Nishida Y., et al. "An Interpolating Sense Circuit for Molecular Memory", Department of Electrical and Computer Engineering, *CICC 2002*, 4 pp.

Schweikart, K-H, et al., "Design, synthesis, and characterization of prototypical multistate counters in three distinct architectures", *J. Mater. Chem.*, 2002, 12(4), pp. 808-828.

Ccc™ Spincoaters, Brewer Science, http://www.brewerscience.com/cee/products/cee100.html 8 pp.

"Bake Process Theory", *Cost Effective Equipment*, (no date), 4 pp.

MBraun, Inertgas Technology, MB OX-SE-3 Oxygen Probe, (no date), www.mbraun.com, 4 pp.

"Spin Coat Theory", Cost Effective Equipment, (no date), 6 pp.

"Spin Coating Patent Index", http://www.mse.arizona.edu/faculty/birnie/Coatings/PatenNdx.htm, Apr. 12, 2005, 10 pp.

Primaxx website pages, http://www.primaxxinc.com/products.html, Apr. 12, 2005, 30 pp.

P. Mumbauer, et al. "Mist Deposition in Semiconductor Device Manufacturing", Nov. 1, 2004, http://www.reed-electronics.com/semiconductor/index.asp?layout=articlePrint&articleID=CA476 . . . , 7 pp.

Xiangfeng D., et al. "Nonvolatile Memory and Programmable Logic from Molecule-Gated Nanowires", *Nanoletters* 2(5) (2002), pp. 487-490.

Li, C., et al. "Data Storage Studies on Nanowire Transistors with Self-Assembled Porphyrin Molecules", *J. Phys. Chem. B*. 2004, 108, pp. 9646-9649.

Roth K. M., et al. "Molecular Approach Toward Information Storage Based on the Redox Properties of Porphyrins in Self-Assembled Monolayers", *J. Vac. Sci. Tech. B 2000*, 18, pp. 2359-2364.

Gryko, D., et al., "Synthesis of "Porphyrin-Linker-Thiol", Molecules with Diverse Linkers for Studies of Molecular-Based Information Storage", *J.Org. Chem. 2000*, 65, pp. 7345-7355.

Gryko, D., et al., "Synthesis of Thiol-Derivatized Ferrocene-Porphyrins for Studies of Multibit Information Storage", *J. Org. Chem. 2000*, 65, pp. 7356-7362.

Clausen C.,et al., "Snythesis of Thiol-Derivatized Porphyrin Dimers and Trimers for Studies of Architectural Effects on Multibit Information Storage", *J. Org. Chem. 2000*, 65, pp. 7363-7370.

Clausen C., et al., "Investigation of Tightly Coupled Porphyrin Arrays Comprised of Identical Monomers for Multibit Information Storage," *J.Org. Chem. 2000*, 65, pp. 7371-7378.

Li J., "Synthesis of Thiol-Derivatized European Porphrinic Triple-Decker Sandwich Complexes for Multibit Molecular Information Storage", *J. Org. Chem. 2000*, 65, pp. 7379-7390.

Gryko D. et al. "Thiol-Derivatized Porphyrins for Attachment to Electoactive Surfaces", *J. Org. Chem. 1999*, pp. 8635-8647.

Gryko, D. "Studies Related to the Design and Synthesis of a Molecular Octal Counter", *J. Mat. Chem.*, 2001, 11(4), pp. 1162-1180.

Roth K. M., et al., Characterization of Charge Storage in Redox SAMs, *Langmuir*, 2002, 18(10): pp. 4030-4040.

Roth K. M., et al., "Comparison of Electron-Transfer and Charge-Retention Characteristics of Porphyrin-Containing Self-Assembled Monolayers Designed for Molecular Information Storage", *J. Phys. Chem. B.*, 2002, 106, pp. 8639-8648.

Liu, Z., et al., "Molecular Memories That Survive Silicon Device Processing and Real-World Operation", *Science* vol. 302, Nov. 28, 2003, pp. 1543-1545.

Roth K. M., "Charge-Retention Characteristics of Self-Assembled Monolayers of Molecular-Wire-Linked Porphyrins on Gold", *American Chemical Society*, 2003, pp. 51-61.

Seth et al. "Investigation of Electronic Communication in Multi-Porphyrin Light-Harvesting Arrays", (1994) *J. Am. Chem. Soc.*, 116: pp. 10578-10592.

Seth et al Soluble Synthetic Multiporphyrin Arrays. 3. Static Spectroscopic and Electrochemical Probes of Electronic Communication, (1996), *J. Am. Chem. Soc.*, 118: pp. 11194-11207.

Strachan et al. "Effects of Orbital Ordering on Electronic Communication in Multiporphyrin Arrays" (1997), *J. Am. Chem. Soc.*, 119: pp. 11191-11201.

Li et al. "Effects of Central metal ion (Mg, Zn) and Solvent on Singlet Excited-State Energy Flow in Porphyrin-Based Nanostructures", (1997), *J. Mater. Chem.*, 7: pp. 1245-1262.

Strachan et al. "Synthesis and Characterization of Tetrachlorodiarylethyne-Linked Porphyrin Dimers. Effects of Liner Architecture on Intradimer Electronic Communication" (1998), *Inorg. Chem.*, 37: pp. 1191-1201.

Yang et al. Interplay of Orbital Tuning and Linker Location in Controlling Electronic Communication in Porphyrin Arrays (1999), *J. Am. Chem. Soc.*, 121: pp. 4008-4018.

Roth et al. Molecular Approach Toward Information Storage Based on the Redox Properties of Porphyrins in Self-Assembled Monolayers, (2000) *Vac. Sci. Technol. B 18*: pp. 2359-2364.

Roth et al. "Measurements of Electron-Transfer Rates of Charge-Storage Molecular Monolayers on Si(100). Toward Hybrid Molecular/Semiconductor Information Storage Devices" (2003), *J. Am. Chem. Soc. 125*: pp. 505-517.

Advanced Inorganic Chemistry, 5th Ed., Cotton & Wilkinson, John Wiley & Sons, 1988, chapter 26.

Advanced Organic Chemistry, 5th Edition, Cotton & Wilkenson, John Wiley & Sons, 1988, p. 38.

Organometallics, A Concise Introduction, Elschenbroich et al., 2nd Ed., 1992, VCH.

Comprehensive Organometallic Chemistry II, A Review of the Literature 1982-1994, Abel et al. Ed., vol. 7, Chapters 7, 8, 10 & 11, Pergamon Press.

Robbins et al., "Syntheses and Electronic Structures of Decamethylmetallocenes", (1982), *J. Chem. Soc. 104*: pp. 1882-1893.

Gassman t al., "(Trifluoromethyl) cyclopentadienide: A Powerful Electron-Withdrawing Ligand for Transition-Metal Complexes", (1986), *J. Am. Chem. Soc. 108*: pp. 4228-4229.

Connelly et al., "Chemical Redox Agents for Organometallic Chemistry", *Chem. Rev.* (1996) 96: pp. 877-910.

Geiger et al., "The Electron-Transfer Reactions of Polynuclear Organotransition Metal Complexes", Advances in Organometallic Chemistry 24: p. 87-130.

Jiang et al. "Double-decker Yttrium(III) Complexes with Phthalocyaninato and Porphyrinator Ligands", J. Porphyrins Phthalocyanines (1999) 3: pp. 322-328.

Arnold et al. "Mixed Phthalocyaninato-Porphyrinato Europium(III) Triple-decker Sandwich Complexes Containing a Conjugated Dimeric Porphyrin Ligand", Chemistry Letters (1999), pp. 483-484.

PCT/US 06/61522 Int'l Search Report and Written Opinion, Mar. 26, 2008.

European Search Report for European Patent Application No. 05779254.1, Aug. 7, 2008.

Japanese Office Action of Jul. 29, 2008 (English and Japanese translation).

Japanese Office Action of Apr. 24, 2009 (English and Japanese translation).

International Search Report and Written Opinion for PCT/US2005/003133 mailed Jul. 5, 2005, 11 pgs.

International Search Report and Written Opinion for PCT/US05/15070 mailed Jun. 26, 2008, 7 pgs.

Office Action for 11/246,874 mailed Nov. 30, 2006, 7 pgs.

Office Action for 11/118,042 mailed Jun. 1, 2007, 12 pgs.

Office Action for 10/834,630 mailed Oct. 1, 2008, 9 pgs.

Office Action for 10/834,630 mailed Mar. 20, 2009, 7 pgs.

Office Action for 10/834,630 mailed Aug. 19, 2009, 8 pgs.

Chinese Office Action for 200580003411.5 mailed Feb. 6, 2009, 9 pgs.

\* cited by examiner

— —X— — independently selected from:

| | |
|---|---|
| – CHR$^1$ – | – CRR – CR = |
| = CR – | = CR – CRR = |
| – CR = | = CR – CR = |
| – N = | – CR = CR – |
| = N – | – (CRR)$_p$ – |
| – NR – | |

C = Carbon

HA = Heteroatom

∿ = Single or Double Bond

----Q---- = Together with – C ∿ HA ∿ C – form independently selected 5 or 6 membered rings, optionally substituted with 1, 2, or 3 R$^2$ groups, such that the compound is electronically conjugated q = 0 or 1

| ---y--- is independently selected from | |
|---|---|
| $-(CR_2)_2-$ | $-(CR_2)_3-$ |
| $-(CR_2)_3-$ | $=CR-CR_2-CR_2-$ |
| $-CR=CR-$ | $-CR_2-CR_2-CR=$ |
| $=CR-CR=$ | $=CR-CR=CR-$ |
| $=CR-CR_2-$ | $-CR=CR-CR=$ |
| $-CR_2-CR=$ | $-CR_2-NR-CR_2-$ |
|  | $=CR-NR-CR_2-$ |
|  | $=CR-NR-CR=$ |
|  | $-CR=N-CR_2-$ |
|  | $-CR=N-CR=$ |
|  | $-CR_2-N=CR_2-$ |

PROCESSING SYSTEMS AND METHODS FOR MOLECULAR MEMORY

RELATED APPLICATIONS

This application is a continuation of U.S. patent application Ser. No. 11/118,042, filed Apr. 29, 2005 now U.S. Pat. No. 7,358,113, entitled "Processing Systems and Methods for Molecular Memory", which in turn is a continuation-in-part application of: (A) U.S. patent application Ser. No. 11/046,518, filed Jan. 28, 2005 now abandoned, entitled "Molecular Memory Devices and Methods", which is a continuation-in-part application of U.S. patent application Ser. No. 10/766,304, filed Jan. 28, 2004 now abandoned, entitled "Molecular Memory Arrays and Devices"; and (B) U.S. patent application Ser. No. 10/834,630, filed Apr. 29, 2004, entitled "Systems, Tools and Methods for Production of Molecular Memory." All of these applications are incorporated by reference herein in their entirety.

This application is related to U.S. patent application Ser. No. 11/118,043, filed Apr. 29, 2005, entitled "Molecular Memory", now U.S. Pat. No. 7,324,385, and U.S. patent application Ser. No. 11/246,874, filed Oct. 7, 2005, entitled "Molecular memory devices and methods", now U.S. Pat. No. 7,307,870. All of these applications are incorporated by reference herein in their entirety.

TECHNICAL FIELD

The disclosed embodiments relate generally to molecular memories, i.e., memories incorporating molecules for charge storage. More particularly, the disclosed embodiments relate to molecular memory cells, molecular memory arrays, electronic devices including molecular memory, and processing systems and methods for producing molecular memories.

BACKGROUND

Advances in semiconductor processing and device design have resulted in computing devices being incorporated in a seemingly endless variety of tools and machines, ranging from conventional programmable computers to communication equipment and entertainment devices. Irrespective of its end purpose, a computing device typically includes a central processing unit (CPU), random access memory (RAM), and an addressing and communication mechanism enabling data exchange between the CPU and the RAM. In a computing device, data is stored, communicated and manipulated in the form of signals (e.g., voltage, current, optical and the like). The CPU contains circuitry for logically manipulating the signals, whereas the memory contains circuitry for storing the signals before, during and after the CPU's manipulation of those signals.

Conventional CPUs, memory devices and data communication mechanisms are mass produced as solid-state electronic devices. Although sometimes referred to as "semiconductor devices", solid-state electronic devices rely on the electrical behavior of multiple types of solid materials, including metals, semiconductors, and insulators. The techniques and equipment for producing solid-state devices have improved dramatically over time to enable the production of devices such as switches, capacitors, resistors, and interconnections with sub-micron scale features.

Today, memory devices implement hundreds of megabits of storage in a single integrated circuit. These devices include volatile memory (e.g., dynamic random access memory (DRAM) and static random access memory (SRAM)), non-volatile memory (e.g., electrically erasable programmable read only memory (EEPROM), flash EPROM, ferroelectric DRAM), and the like. Memory manufacturing systems and processes continue to push the limits of fine-geometry patterning and fabrication technology.

Performance of the memory components of a computing device is becoming an increasingly important determinant of overall system performance. Larger quantities of memory enable a greater variety of applications and functions to be implemented by the computing device and may reduce or eliminate the need for separate mass storage devices. Higher speed memory supports higher CPU processing frequencies, making the computing devices more useful for complex or real-time tasks. Denser memory devices support a growing variety of battery-powered electronic devices, such as laptop computers, PDAs, multifunction cellular telephones, and the like. At the same time, many of these applications benefit from reduced power consumption.

In many cases, improvements in semiconductor processing technology have led to the manufacture of denser, larger, faster and more power efficient memory devices. In many cases, the solid-state electronic behavior of the devices improves as the devices become smaller. Unfortunately, conventional memory, such as silicon-based DRAM memory, has reached a point where continued reduction in the size of conventional semiconductor memory cells is expected to adversely affect at least some of these important parameters and add undesirably to costs.

One reason for the reduced speed and increased power consumption at smaller dimensions is that memory cells usually implement a capacitor for each stored bit of information. A capacitor is a charge storage device formed by conductive plates that are separated by an insulator. As capacitors become smaller the quantity of charge that can be stored is reduced. To serve as a reliable storage device in a memory cell, a capacitor needs sufficient capacity to hold a signal at a level that can be reliably detected as data. Moreover, conventional capacitors lose their stored charge over time through the switch or transistor that is attached to each memory location. Transistors are inherently "leaky" devices and some of the charge stored in a capacitor dissipates or leaks over time. Memory cells based on smaller capacitors are more sensitive to leakage problems because they simply have less charge that can be lost before the stored data becomes irretrievable. They are also subject to reduced reliability.

To overcome the transient nature of capacitive storage, memory devices use refresh circuitry that frequently reads out a stored signal, amplifies it to a higher level, and stores it back into the capacitor. As the physical area allotted to the capacitor is decreased, it becomes increasingly difficult to maintain the same charge storage capacity in the smaller available area. Unless the leakages can be reduced in conjunction with the reduced storage capacity, the rate at which the capacitor must be refreshed increases. In turn, higher capacitor refresh rates reduce the percentage of time that a memory cell is available for reading and writing data. Moreover, a greater percentage of the total power consumption of the memory device is then used to refresh the memory. Even when the device is in a dormant or inactive state, traditional DRAM requires continuous refreshing and therefore continuous power consumption. Accordingly, researchers are actively seeking new ways of storing data signals that overcome the problems associated with smaller lithographic features and complex capacitor geometries in conventional capacitor-based memory cells.

Memory cell designers have attempted to maintain low refresh rates in smaller memory cells by boosting the amount of capacitance that can be formed in a given amount of chip area. Boosting capacitance often involves increasing the surface area of the capacitor's charge holding material, which is very difficult to do when the overall size of the capacitor is shrinking. While designers have had some success at controlling surface area by forming the charge holding material into three-dimensional trench and stacked capacitor designs, it is unlikely that these techniques alone can be relied on to create sufficient capacitances in smaller cells. The solid-state electronic behaviors upon which cell performance is predicated begin to break down as the dimensions of various cell features become smaller such that a capacitor can no longer store sufficient charge for sufficient time to be useful in a memory cell.

One potential way to mitigate these problems is via molecular devices that implement some or all components of an electronic device or system with molecular scale structures and components. These molecular scale structures and components exhibit molecular rather than solid-state behavior, which can provide enhanced performance in many instances. Moreover, because molecules retain their essential properties down to the individual molecule level, molecular-scale components and device structures can be scaled (or shrunk) as future processing tools and technologies are developed.

Widespread use of molecules in electronic devices (e.g., switches, capacitors, conductors, and the like) depends on the development of attachment chemistries and processes that achieve high yield at reasonable throughputs and costs. To date, however, equipment vendors and tool development engineers have not developed efficient tools and processes for applying attachment chemistries that can be used in molecular electronic device manufacture. For widespread use, molecular scale components require repeatable processes that are able to attach desired chemical species to substrates, other device structures, and each other. In addition, robust processes for forming molecular structures are needed to enable new types of components (e.g., micron or sub-micron size electrochemical cells for charge storage) to be implemented in conjunction with semiconductor components.

It is desirable for molecular device manufacturing techniques to be compatible with existing semiconductor industry processes and to use existing semiconductor industry tools or improvements thereof. However, molecular device processing is sensitive to many variables and conditions that do not have the same impact on semiconductor processing. For example, water is present throughout most semiconductor manufacturing processes as a cleaning fluid and in the form of ambient humidity. Water, however, can have destructive effects on some molecular processes because water molecules interfere with the attachment chemistry or destroy the active molecules. Similarly, thin native oxide layers and ultra-low contaminant levels are tolerable in semiconductor processes because the bulk effects of these aberrant features are minimal in comparison to the overall device function. In contrast, when devices are manufactured with molecular-scale features, these molecular-scale defects can become significant.

Another problem faces memory designers trying to increase information density (e.g., the amount of information that can be stored in a given area of a chip containing memory). With the practical constraints of current DRAM technology, each memory cell with a conventional solid-state capacitor can only store one bit of information. Accordingly, it would be desirable to have a memory (and processing systems and methods therefor) with improved information storage density, e.g., by using a memory cell that can reliably store more than two discrete states.

In view of the above, there is a need for improved memory devices. In particular, there is a need for molecular memory cells, molecular memory arrays, and electronic devices including molecular memory. In addition, there is a need for more efficient tools and processes for manufacturing molecular memories. Further, there is a need for molecular memory that can be manufactured using techniques that are compatible with existing semiconductor manufacturing practices so that semiconductor devices and interconnections can be manufactured monolithically with molecular memory.

SUMMARY

The present invention addresses the needs described above.

One aspect of the invention involves an apparatus that includes a coating unit configured to deposit redox-active molecules on a partially fabricated semiconductor wafer; an enclosed chamber that contains the coating unit; one or more gas sensors that monitor one or more gases in the enclosed chamber; and a control system that manages the operation of the coating unit.

Another aspect of the invention involves an apparatus that includes a heating unit configured to anneal a partially fabricated semiconductor wafer at temperatures between 350 and 450° C.; an enclosed chamber that contains the heating unit; one or more gas sensors that monitor one or more gases in the enclosed chamber; and a control system that manages the operation of the heating unit.

Another aspect of the invention involves an integrated apparatus that includes a coating unit configured to deposit redox-active molecules on a partially fabricated semiconductor wafer; a heating unit configured to anneal a partially fabricated silicon wafer at temperatures between 350 and 450° C.; one or more enclosed chambers that contain the coating unit and the heating unit; one or more gas sensors that monitor one or more gases in the one or more enclosed chambers; and a control system that manages the operation of the coating unit and the heating unit.

Another aspect of the invention involves an apparatus that includes a coating unit configured to deposit an electrolyte on a partially fabricated semiconductor wafer; an enclosed chamber that contains the coating unit; one or more gas sensors that monitor one or more gases in the enclosed chamber; and a control system that manages the operation of the coating unit.

Another aspect of the invention involves a method of making an array of molecular storage devices on a partially fabricated semiconductor wafer by forming an array of working electrodes; forming one or more auxiliary counter electrodes for the array of molecular storage devices; attaching storage molecules to the working electrodes; forming one or more electrolytes for the array of molecular storage devices; and forming one or more counter electrodes for the array of molecular storage devices.

Another aspect of the invention involves a method that comprises depositing redox-active molecules on the surface of a partially fabricated semiconductor wafer in a first monitored gas ambient; chemically attaching some of the redox-active molecules to a plurality of working electrode surfaces on the wafer in a second monitored gas ambient; removing chemically unattached redox-active molecules from the wafer; forming an electrolyte on the wafer; and depositing a conductor on the electrolyte.

BRIEF DESCRIPTION OF THE DRAWINGS

For a better understanding of the aforementioned aspects of the invention as well as additional aspects and embodiments thereof, reference should be made to the Description of Embodiments below, in conjunction with the following drawings in which like reference numerals refer to corresponding parts throughout the figures.

FIGS. 27a-27i are schematic cross sections illustrating a method of making molecular storage devices with auxiliary counter electrodes in accordance with one embodiment of the present invention.

FIG. 29a depicts a redox-active molecule comprising two redox active subunits, a porphyrin and a ferrocene. FIG. 29b is similar yet depicts the possible substituents. FIG. 29c depicts a polymer of the structure in FIG. 29b, wherein h is an integer of at least two.

FIG. 30c depicts Z-dimension linear polymers of independently selected redox-active molecules 3000 with independently selected linkers 3010 on the electrode 3015. n is an integer of 0 or more, with from 1 to 8 being preferred, and the attachment moieties are not depicted. FIG. 30b depicts Z-dimension linear polymers as in FIG. 30a with cross-linking 3015. As described below, branched Z-dimension polymers are also contemplated, with 1 or multiple branch points. FIG. 30c depicts X-Y dimension linear redox-active molecule polymers with multiple attachment moieties 3020; also contemplated are surfaces comprising different linear polymers of redox-active molecules, again, with either homopolymers or heteropolymers being useful. Branched redox-active molecule polymers, with optional cross-linking, are also possible.

FIG. 32a is a phthalocyanine derivative, FIG. 32b is a porphyrin derivative, and FIG. 32c is an expanded porphyrin.

In FIG. 33b, a 12 membered ring, A, B, C and D can be independently selected from single and double bonds. In FIG. 33c, the cyclen has a "bridge" between two of the heteroatoms, with each A-B being independently selected from the group consisting of —$CR_2$—$CR_2$—, —CR=CR—, —$CR_2$—$CR_2CR_2$—, —CR=CR—$CR_2$—, —$CR_2$—CR=CR—; $CR_2$—NR—$CR_2$—, —CR=N—$CR_2$— and —$CR_2$—N=CR—. FIGS. 33D-33G depict a variety of particular structures with available substituent positions. FIG. 33H depicts the "loss" of one of the "arms" of the cyclen derivative; as will be appreciated by the teachings here, a variety of additional cyclen based derivatives may also alter the valency of the bonds and remove R groups. FIG. 33I is a macrocyclic proligand with 5 donor heteroatoms. In some instances, larger rings are used and result in polynucleate complexes. Again, as described herein, any or all of these macrocyclic proligands and complexes, or mixtures thereof, as well as mixtures with other types of ReAMs, may be used as monomers in polymerization reactions.

DESCRIPTION OF EMBODIMENTS

Figure 1:
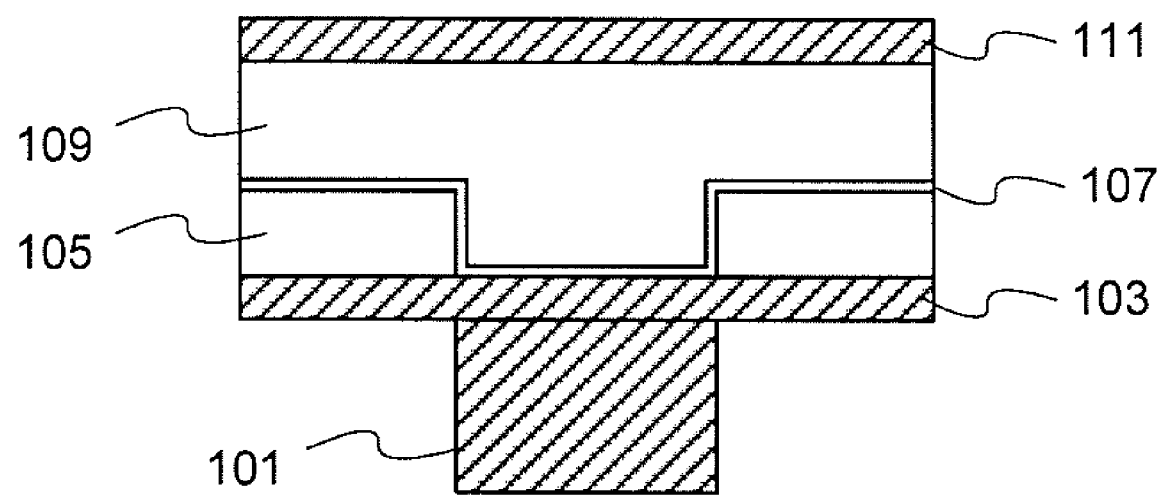
FIG. 1 is a schematic cross-section of a molecular storage device in accordance with one embodiment of the present invention.

Molecular memory and processing systems and methods therefor are described. Reference will be made to certain embodiments of the invention, examples of which are illustrated in the accompanying drawings. While the invention will be described in conjunction with the embodiments, it will be understood that it is not intended to limit the invention to these particular embodiments alone. On the contrary, the invention is intended to cover alternatives, modifications and equivalents that are within the spirit and scope of the invention as defined by the appended claims.

The present invention is described particularly with respect to molecular memory that implements charge storage using molecular storage devices. Molecular memories have been manufactured and demonstrated. However, the teachings of the present invention are readily applied to a wide variety of molecular electronic devices including molecular switches, molecular logic, molecular data processors, and the like. Accordingly, it is contemplated that one can readily adapt the specific teachings and examples to the manufacture of a wide variety of devices in which some or all of the device components include molecular-scale structures.

Moreover, in the following description, numerous specific details are set forth to provide a thorough understanding of the present invention. However, it will be apparent to one of ordinary skill in the art that the invention may be practiced without these particular details. In other instances, methods, procedures, components, and systems that are well-known to those of ordinary skill in the art are not described in detail to avoid obscuring aspects of the present invention.

DEFINITIONS

As used herein:

The term "oxidation" refers to the loss of one or more electrons in an element, compound, molecule, or chemical substituent/subunit. In an oxidation reaction, electrons are lost by atoms or molecule(s) involved in the reaction. The charge on these atoms or molecule(s) must then become more positive. The electrons are lost from the species undergoing oxidation and so electrons appear as products in an oxidation reaction. An oxidation is taking place in the reaction $Fe^{2+}$ (aq)→$Fe^{3+}$ (aq)+e− because electrons are lost from the species being oxidized, $Fe^{2+}$ (aq), despite the apparent production of electrons as "free" entities in oxidation reactions. Conversely the term reduction refers to the gain of one or more electrons by an element, compound, molecule, or chemical substituent/subunit.

An "oxidation state" refers to the electrically neutral state or to the state produced by the gain or loss of electrons to an element, compound, molecule, or chemical substituent/subunit.

The term "multiple oxidation states" means more than one oxidation state. The oxidation states may reflect the gain of one or more electrons (reduction) or the loss of one or more electrons (oxidation).

The terms "different and distinguishable" when referring to two or more oxidation states means that the net charge on the entity (atom, molecule, aggregate, subunit, etc.) can exist in at least two different states. The states are said to be "distinguishable" when the difference between the states is greater than the thermal energy.

The term "tightly coupled" when used in reference to a subunit of a multi-subunit (e.g., polymeric) storage molecule refers to positioning of the subunits relative to each other such that oxidation of one subunit alters the oxidation potential(s) of the other subunit. In some embodiments, the alteration is sufficient such that the (non-neutral) oxidation state(s) of the second subunit are different and distinguishable from the non-neutral oxidation states of the first subunit. In some embodiments, the tight coupling is achieved by a covalent bond (e.g., single, double, triple, etc.). However, in certain embodiments, the tight coupling can be through a linker, via an ionic interaction, via a hydrophobic interaction, through coordination of a metal (e.g., a sandwich coordination compound), or by simple mechanical juxtaposition. It is understood that the subunits could be so tightly coupled that the redox processes are those of a single supermolecule with multiple oxidation states.

In an electrochemical context, the term "electrode" refers to a part of an electrochemical cell that allows electrons to be transferred to and/or from reactants (e.g., redox-active molecules such as storage molecules) in the electrochemical cell. Preferred electrodes are metals or conductive organic molecules. For some electrodes (e.g., W, Ti, Ta, and Si), there may be a layer of native oxide or intentionally grown oxide on the surface of the electrode. This oxide may still permit electrons to be transferred to and/or from reactants in the electrochemical cell (e.g., via tunneling or because of pinholes in the oxide). The electrodes can be manufactured to virtually any 2-dimensional or 3-dimensional shape (e.g. discrete lines, pads, planes, spheres, cylinders, etc.). In other contexts, an electrode refers to a conductor used to make electrical contact with part of a circuit.

The term "fixed electrode" is intended to reflect the fact that the electrode is essentially stable and unmovable with respect to the storage medium. That is, the electrode and storage medium are arranged in an essentially fixed geometric relationship with each other. It is of course recognized that the relationship alters somewhat due to expansion and contraction of the medium with thermal changes or due to changes in conformation of the molecules comprising the electrode and/or the storage medium. Nevertheless, the overall spatial arrangement remains essentially invariant. This term is intended to exclude systems in which the electrode is a movable "probe" (e.g., a writing or recording "head", an atomic force microscope (AFM) tip, a scanning tunneling microscope STM tip, etc.).

The term "working electrode" is used to refer to an electrode that is used to set or read the state of a storage medium and/or storage molecule.

The term "reference electrode" is used to refer to an electrode that provides a reference (e.g., a particular reference voltage) for measurements made using the working electrode. In preferred embodiments, the reference electrodes in a molecular memory are at the same potential although in some embodiments this need not be the case.

The term "counter electrode" is used to refer to an electrode that provides current to the working electrode of an electrochemical cell, for instance by forming an electrical connection to the electrolyte of the electrochemical cell. When describing some embodiments of electrochemical cells in molecular storage devices, the term "counter electrode" is used interchangeably with "reference electrode" because this electrode is used in these embodiments to both supply current to the working electrode and to provide a reference potential against which the potential of the working electrode can be measured.

The term "auxiliary counter electrode" is used to refer to an electrode that is used to increase the speed of the reaction at a working electrode beyond the speed possible with just a counter electrode. The auxiliary counter electrode reduces the impact of the electrical impedance of an electrochemical cell's electrolyte and/or low current density of the counter electrode, which can limit the overall speed of the reaction at the working electrode, by providing a temporary charge reservoir to be used during the oxidation or reduction of the molecules on the working electrode. An auxiliary counter electrode may have one or more of the following properties: (1) it is located closer to the working electrode than the counter electrode, (2) it has fast redox-active molecules electrically coupled to it, which may or may not be the same molecules as those attached to the working electrode, (3) it is biased so that a desired amount of current can be supplied to the reaction at the working electrode, and (4) it may itself be redox active (e.g., copper metal, which may undergo an electrochemical reaction).

The term "electrolyte" is used to refer to a medium for ionic conduction in an electrochemical cell. An electrolyte may be composed of one or more components, which may be liquids, gels, solids, or combinations thereof. Exemplary electrolytes include, without limitation: a polymer matrix and an ionic liquid; an ion-conducting glass or ceramic; an ion-conducting transition metal oxide, and a solid electrolyte.

The term "electrically coupled" when used with reference to a storage molecule (or, more generally, a redox-active molecule) and/or storage medium and electrode refers to an association between that storage medium or molecule and the electrode such that electrons move from the storage medium/molecule to the electrode or from the electrode to the storage medium/molecule and thereby alter the oxidation state of the storage medium/molecule. Electrical coupling can include direct covalent linkage between the storage medium/molecule and the electrode, indirect covalent coupling (e.g., via a linker), direct or indirect ionic bonding between the storage medium/molecule and the electrode, or other bonding (e.g., hydrophobic bonding). In addition, no actual bonding may be required and the storage medium/molecule may simply be contacted with the electrode surface. There also need not necessarily be any contact between the electrode and the storage medium/molecule where the electrode is sufficiently close to the storage medium/molecule to permit electron tunneling between the medium/molecule and the electrode.

The term "redox-active unit", "redox-active molecule" (ReAM) or "redox-active subunit" refers to a molecule or component of a molecule that is capable of being oxidized or reduced by the application of a suitable voltage.

The term "subunit", as used herein, refers to a component of a molecule.

The terms "storage molecule" and "memory molecule" refer to a molecule having one or more oxidation states that can be used for the storage of information (e.g., a molecule comprising one or more redox-active subunits). Preferred storage molecules have two or more different and distinguishable non-neutral oxidation states.

The term "storage medium" refers to a composition comprising two or more storage molecules. The storage medium can contain only one species of storage molecule or it can contain two or more different species of storage molecule. In preferred embodiments, the term "storage medium" refers to a collection of storage molecules. Preferred storage media comprise a multiplicity (at least 2) of different and distinguishable (preferably non-neutral) oxidation states. The multiplicity of different and distinguishable oxidation states can be produced by the combination of different species of storage molecules, each species contributing to said multiplicity of different oxidation states and each species having a single non-neutral oxidation state. Alternatively or in addition, the storage medium can comprise one or more species of storage molecule having a multiplicity of non-neutral oxidation states. The storage medium can contain predominantly one species of storage molecule or it can contain a number of different storage molecules. The storage media can also include molecules other than storage molecules (e.g., to provide chemical stability, suitable mechanical properties, to prevent charge leakage, etc.).

The term "chemisorbed species" refers to a molecule chemically bonded to a substrate, including covalently bonded.

The term "electrochemical cell" refers to a device that converts chemical energy into electrical energy or vice versa when a chemical reaction (e.g., reduction/oxidation) is occurring in the device.

The term "molecular storage device" (MSD) refers to a micron or sub-micron size electrochemical cell that includes two or more electrodes and an electrolyte, with redox-active molecules electrically coupled to at least one of the electrodes.

The terms "memory cell" and "memory element" refer to a charge storage device (e.g., a capacitor in conventional memory or a molecular storage device in molecular memory) and its associated circuitry (e.g., a switching device such as a transistor). From another viewpoint, these terms refer to the smallest separately addressable circuit elements in which information is stored.

The term "memory array" refers to an array of memory cells. The terms "molecular memory array" and "molecular array" refer to an array of memory cells that use molecular storage devices.

The term "storage location" refers to a discrete domain or area in which a storage medium is disposed. When addressed with one or more electrodes, the storage location may form a storage cell.

"Addressing" a particular memory element refers to associating (e.g., electrically coupling) that memory element with an electrode in order to provide access to the memory element, such as for a read or write operation.

The terms "read" and "interrogate" refer to the determination of the state(s) of one or more memory elements.

The term "refresh" when used in reference to a molecular memory element refers to the application of a voltage to the storage molecule or storage medium of the memory element to reset the oxidation state of that storage molecule or storage medium to a predetermined state associated with the logic state of the memory element immediately prior to the refresh operation. The logic state of the memory element is preserved by the refresh operation.

The term "$E_{1/2}$" refers to the practical definition of the formal potential (E°) of a redox process as defined by $E_{1/2}=E°+(RT/nF)\ln(D_{ox}/D_{red})$ where R is the gas constant, T is temperature in K (Kelvin), n is the number of electrons involved in the process, F is the Faraday constant (96,485 Coulomb/mole), $D_{ox}$ is the diffusion coefficient of the oxidized species and $D_{red}$ is the diffusion coefficient of the reduced species.

A "voltage source" is any source (e.g., molecule, device, circuit, etc.) capable of applying a voltage to a target (e.g., an electrode).

The phrase "output of an integrated circuit" refers to a voltage or signal produced by one or more integrated circuit(s) and/or one or more components of an integrated circuit.

A "voltammetric device" is a device capable of measuring the current produced in an electrochemical cell as a result of the application of a voltage or change in voltage.

An "amperometric device" is a device capable of measuring the current produced in an electrochemical cell as a result of the application of a specific potential ("voltage") for a period of time.

A "potentiometric device" is a device capable of measuring potential across an interface that results from a difference in the equilibrium concentrations of redox molecules in an electrochemical cell.

A "coulometric device" is a device capable of measuring the net charge produced during the application of a potential field ("voltage") to an electrochemical cell.

An "impedance spectrometer" is a device capable of determining the overall impedance of an electrochemical cell.

A "sinusoidal voltammeter" is a voltammetric device capable of determining the frequency domain properties of an electrochemical cell.

In the context of molecular attachment, a "substrate" is a, preferably solid, material suitable for the attachment of one or more redox-active molecules. Substrates can be formed of materials including, but not limited to glass, plastic, carbon, silicon, germanium, minerals (e.g., quartz), semiconducting materials (e.g., doped silicon, silicon oxides, doped germanium, etc.), ceramics, metals, metal oxides or nitrides, etc. In other contexts, a substrate refers to: (a) a silicon wafer or (b) the body or base layer of an integrated circuit, onto which other layers are deposited, e.g., a silicon substrate or a sapphire substrate.

Molecular Memories

FIG. 1 is a schematic cross-section of a molecular storage device in accordance with one embodiment of the present invention.

The entire structure may be built on top of and electrically coupled to an electrode or bond pad of an underlying semiconductor device. For example, conductive via or plug 101 may reach down through passivation and planarization layers of a semiconductor device to make electrical contact with a source/drain region of an access transistor (803, shown in FIG. 8) or other active device. Conductive plug 101 may couple to a metal bond pad, or to the active region of a semiconductor device. In a particular example, plug 101 comprises tungsten, but may be manufactured using any metal, alloy, silicide, or other material that is available for implementing electrical connectivity.

Working electrode 103 may comprise, for example, aluminum, gold, silver, tungsten or other available conductor, such as copper, platinum, titanium nitride or polysilicon. Other suitable materials include: Ti, Ta, TaN, conducting oxides (e.g., IrO, RuO, OsO, RhO), and the like, or combinations thereof. In some embodiments, working electrode 103 is formed at the same time as other structures such as bond pads and interconnects for an integrated circuit. Processes and materials for forming plugs 101 and electrodes 103 are widely available in the semiconductor processing industry. In many integrated circuit processes, metal pads will be coated with insulating layer 105, which serves to protect and/or passivate working electrode 103. Insulating layer 105 may be implemented as a deposited oxide, silicon nitride, or the like. Layer 105 is patterned to expose a portion of working electrode 103, which may, in certain processes, be performed in the same operation used to expose portions of bonding pads of the integrated circuit. The exposed portion of working electrode 103 defines an "active area" for the attachment of storage molecules. In some embodiments, the structure is manufactured up through the formation and patterning of oxide 105 using industry standard process flows.

A thin layer 107 of storage molecules is formed on the active area of working electrode 103 and becomes attached and electrically coupled thereto. Layer 107 may range in thickness from 1 to 100 nanometers in particular examples. In some embodiments, layer 107 is a layer of chemisorbed molecules. In some embodiments, layer 107 is a self-assembled monolayer (SAM). In other embodiments, layer 107 may also be formed by, for example, selective deposition or other suitable processes, including in situ polymerization, as described below and in U.S. Ser. No. 10/800,147, hereby incorporated by reference. The attachment site for the molecules may be lithographically defined by patterning layer 105 over the conductive material as indicated. As a representative example only, an extensive library of porphyrins (~150 compounds) with specific linker components that are designed to form a covalent bond with a substrate (thereby forming a layer of chemisorbed species) is available as potential storage molecules for use in layer 107. Presently, these molecules comprise a number of different architectures, including, but not limited to, redox active moieties (ReAMs) in a variety of configurations, including monomeric and polymeric ReAMs, derivatives and polymers thereof, as further described below.

Once the molecules are attached, a thin (e.g., 1 to 200 nanometer) layer of material is applied to form electrolyte 109. Electrolyte 109 is the electrolyte for the electrochemical cell. A metal layer 111 is deposited by evaporation, sputtering, chemical vapor deposition, or other deposition technique on to electrolyte layer 109. Metal layer 111 forms a reference electrode and/or counter electrode of the electrochemical cell and, for example, may comprise any counter electrode material such as copper, silver, platinum and the like.

The electrolyte 109, which may be a liquid, gel, solid, or combination thereof, should be chemically compatible with the storage molecules and other conductors and insulators used in the molecular storage device, and with semiconductor processing. Electrolyte 109 facilitates the ionic transport of charge between the working electrode and other electrodes in the electrochemical cell (e.g., the reference electrode).

One advantage of the stacked architecture shown in FIG. 1 is that the bottom surface of the molecular storage device forms the electrode surface and storage molecules are able to form one or more layers of chemisorbed species on this surface. Also, electrolyte layer 109 coats the storage molecules, essentially encapsulating them and protecting them from subsequent steps. Further, the structure of FIG. 1 provides a way to implement a three-dimensional architecture in that subsequent layers of metal, insulator, molecules (e.g., molecules in a layer of chemisorbed species), and the like are added after manufacture of the underlying semiconductor-based microelectronic devices.

Figure 2A:
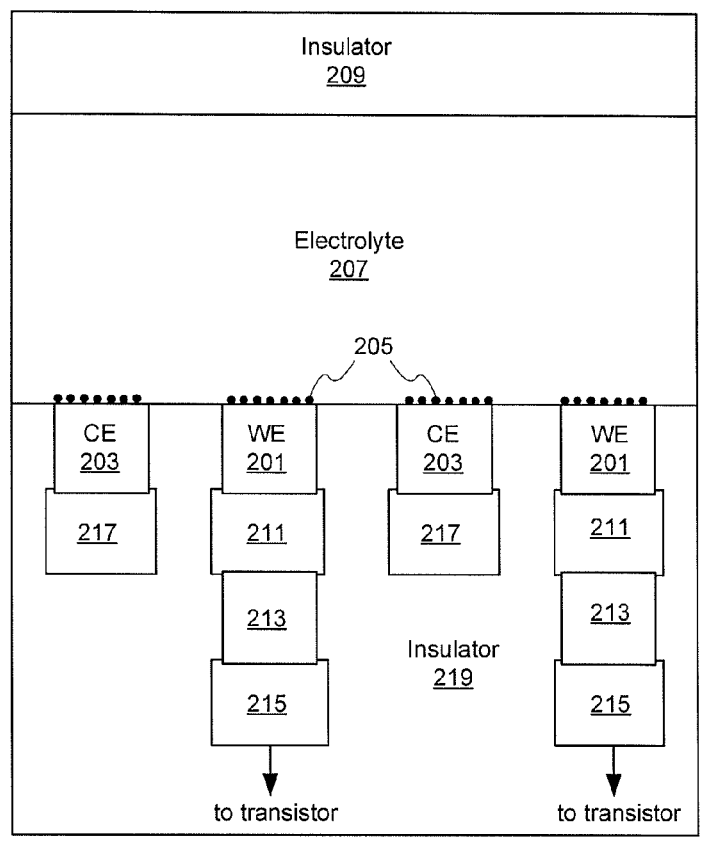
FIGS. 2a and 2b are schematic cross-sections of molecular storage devices in an array of molecular storage devices that are configured as electrochemical cells having redox-active molecules on both the working electrodes and the counter electrodes in accordance with one embodiment of the present invention.
Figure 2B:
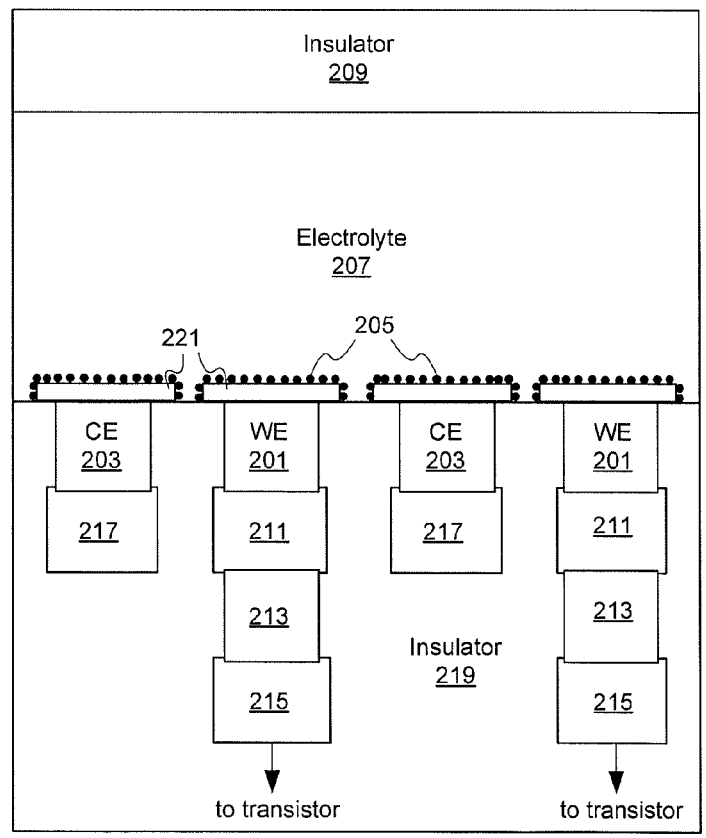

FIGS. 2a and 2b are schematic cross-sections of molecular storage devices in an array of molecular storage devices that are configured as electrochemical cells having redox-active molecules on both the working electrodes (WE) 201 and the counter electrodes (CE) 203 in accordance with one embodiment of the present invention.

Like the working electrode 103 in FIG. 1, the working electrodes 201 in these electrochemical cells can be built on top of and electrically coupled to an electrode or bond pad of an underlying semiconductor device. For example, conductive vias and/or plugs 211, 213, 215, etc. may reach down through the passivation and planarization layers (e.g., insulator 219) to make electrical contact with an access transistor (803, shown in FIG. 8) or other active device.

Like the working electrode 103 in FIG. 1, the working electrodes 201 in these electrochemical cells are electrically coupled to a thin layer of storage molecules 205. In some embodiments, the layer of storage molecules 205 is a chemisorbed layer.

In this embodiment, the micron or sub-micron size electrochemical cells use a common electrolyte layer 207 to contact the working electrodes 201 and the counter electrodes 203. In some embodiments, the bias to the counter electrodes 203 is supplied by conducting lines 217 (which extend out of the plane of FIG. 2).

In addition, the counter electrodes 203 in these electrochemical cells are electrically coupled to a layer of redox-active molecules 205. In some embodiments, the layer of redox-active molecules 205 on the counter electrodes 203 is a chemisorbed layer. In some embodiments, the counter electrodes 203 have the same layer of molecules 205 attached as the working electrodes 201 (e.g., in a chemisorbed layer). In other embodiments, the counter electrodes 203 have a different layer of fast redox-active molecules attached (not shown in FIG. 2) than those present on the working electrodes 201. In other embodiments, the counter electrodes 203 do not have any redox-active molecules attached (not shown in FIG. 2), and instead use the redox chemistry of the counter electrode material itself (e.g., copper). In FIG. 2a, the layer of chemisorbed storage molecules on the working electrodes 201 and the layer of chemisorbed redox-active molecules on the counter electrodes 203 are coplanar with each other, as are the working and counter electrodes 201 and 203, respectively.

As shown in FIG. 2b, in some embodiments, the distance between the counter electrodes 203 and the adjacent working electrodes 201 can be reduced by depositing, patterning, and etching a layer of conductive material 221 (e.g., doped polysilicon, nanocrystalline doped silicon, Cu, Ti, Ta, TiN, TaN, TiW, or W) over the surface containing the working electrodes 201 and counter electrodes 203 (e.g., doped polysilicon, nanocrystalline doped silicon, Cu, Ti, Ta, TiN, TaN, TiW, or W). Molecules 205 can then be deposited, attached, and electrically coupled to material 221, which becomes the new surface for the working electrodes 201 and the counter electrodes 203. In this embodiment, the layer of chemisorbed storage molecules on the working electrodes 201 and the layer of chemisorbed redox-active molecules on the counter electrodes 203 remain substantially coplanar with each other, as do the working and counter electrodes 201 and 203, respectively.

In both embodiments shown in FIG. 2a and FIG. 2b, the separation between the working electrodes 201 and the adjacent counter electrodes 203 is determined by the lithography used, rather than by the thickness of the electrolyte. Depending on the lithography and electrolyte used, these embodiments can reduce the impact of the electrical impedance of the electrolyte 207, which can limit the overall speed of the reaction at the working electrodes 201.

Figure 3A:
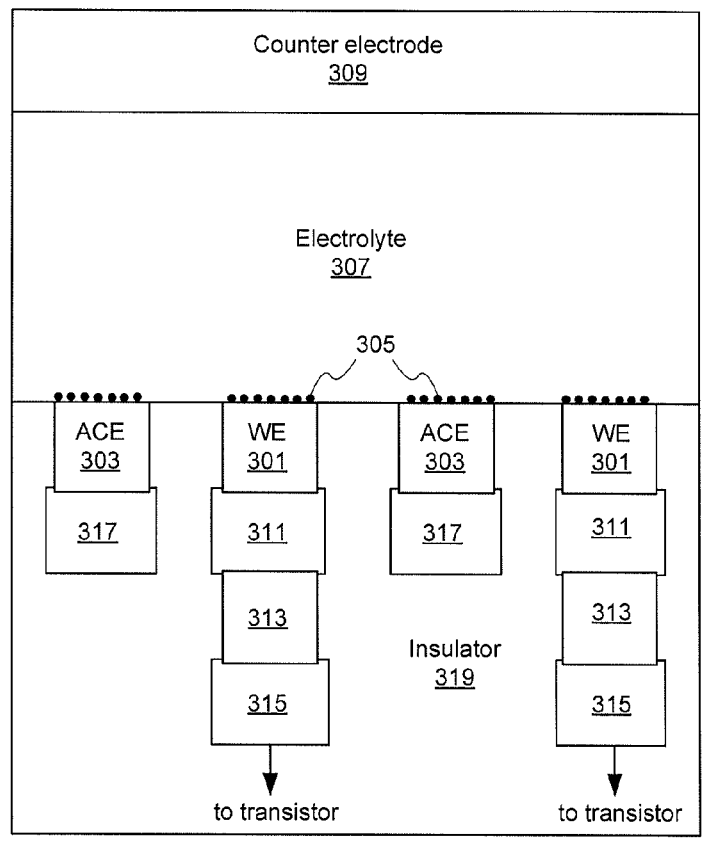
FIGS. 3a and 3b are schematic cross-sections of molecular storage devices in an array of molecular storage devices that are configured as electrochemical cells having a working electrode, a counter electrode, and one or more auxiliary counter electrodes in accordance with one embodiment of the present invention.
Figure 3B:
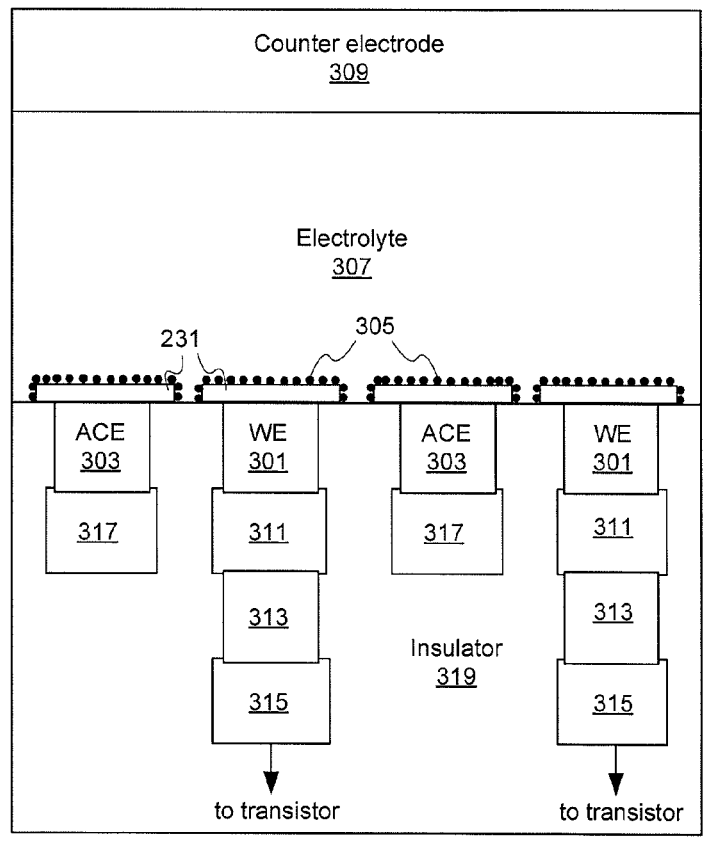

FIGS. 3a and 3b are schematic cross-sections of molecular storage devices in an array of molecular storage devices that are configured as electrochemical cells having a working electrode (WE) 301, a counter electrode 309, and one or more auxiliary counter electrodes (ACE) 303 in accordance with one embodiment of the present invention.

The working electrodes 301 in these electrochemical cells can be built on top of and electrically coupled to an electrode or bond pad of an underlying semiconductor device. For example, conductive vias and/or plugs 311, 313, 315, etc. may reach down through the passivation and planarization layers (e.g., insulator 319) to make electrical contact with an access transistor (803, shown in FIG. 8) or other active device.

The working electrodes 301 in these electrochemical cells are electrically coupled to a thin layer of storage molecules 305. In some embodiments, the layer of storage molecules 305 is a chemisorbed layer.

In this embodiment, the electrochemical cells use a common electrolyte layer 307 and a common counter electrode 309.

In addition, the electrochemical cells in this embodiment have one or more auxiliary counter electrodes 303. The main purpose of the auxiliary counter electrodes 303 is to increase the speed of the oxidation/reduction reaction at the working electrodes 301 beyond the speed possible when just counter electrode 309 alone is used. The auxiliary counter electrodes 303 reduce the impact of the electrical impedance of the electrolyte 307 and/or low current density of the counter electrode 309, which can limit the overall speed of the reaction at the working electrodes 301. The auxiliary counter electrodes 303 are typically located closer to the working electrodes 301 than the counter electrode 309. In some embodiments, the auxiliary counter electrodes 303 have the same layer of molecules 305 attached as the working electrodes 301 (e.g., in a chemisorbed layer). In other embodiments, the auxiliary counter electrodes 303 have a different layer of fast redox-active molecules attached (not shown in FIG. 3) than those present on the working electrodes 301. In other embodiments, the auxiliary counter electrodes 303 do not have any redox-active molecules attached (not shown in FIG. 3), and instead use the redox chemistry of the auxiliary counter electrode material itself (e.g., copper). In some embodiments, the auxiliary counter electrodes 303 are biased so that more current can be supplied to the reaction at the working electrodes 301. In some embodiments, the bias to the auxiliary counter electrodes 303 is supplied by conducting lines 317 (which extend out of the plane of FIG. 3).

As shown in FIG. 3b, in some embodiments, the distance between the attached counter electrodes 303 and the adjacent working electrodes 301 can be reduced by depositing, patterning, and etching a layer of conductive material 321 (e.g., doped polysilicon, nanocrystalline doped silicon, Cu, Ti, Ta, TiN, TaN, TiW, or W) over the surface containing the working electrodes 301 and auxiliary counter electrodes 303 (e.g., doped polysilicon, nanocrystalline doped silicon, Cu, Ti, Ta, TiN, TaN, TiW, or W). Molecules 305 can then be deposited, attached, and electrically coupled to material 321, which becomes the new surface for the working electrodes 301 and the auxiliary counter electrodes 303.

Figure 4:
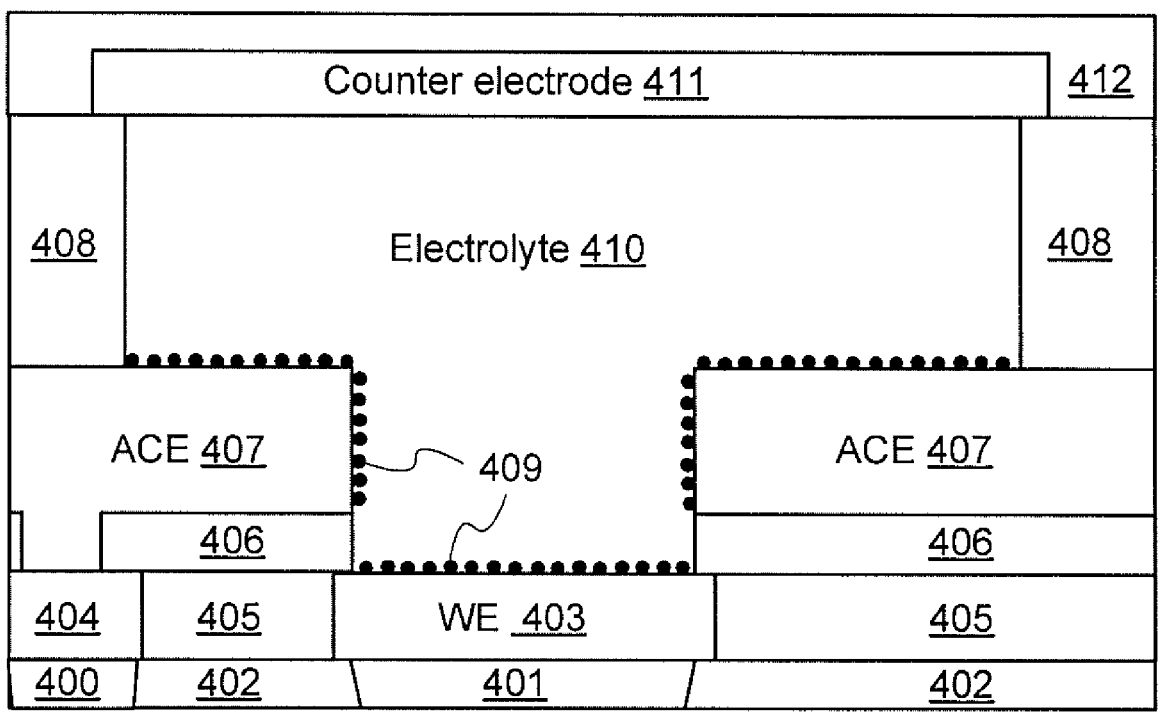
FIG. 4 is a schematic cross-section of a molecular storage device configured as an electrochemical cell having a working electrode, a counter electrode, and an auxiliary counter electrode in accordance with another embodiment of the present invention.

FIG. 4 is a schematic cross-section of a molecular storage device configured as an electrochemical cell having a working electrode, a counter electrode, and an auxiliary counter electrode in accordance with another embodiment of the present invention.

In this embodiment, working electrode 403 is formed on another conductor 401. Conductor 401 is part of a series of conductors that make electrical contact with an access transistor 803 or other active device. Working electrode 403 and conductor 401 are surrounded by insulators (e.g., $SiO_2$) 405 and 402, respectively. Insulating layer 406 (e.g., $SiO_2$) separates the working electrode 403 from the auxiliary counter electrode 407. Conductors 400 and 404 are used to bias the auxiliary counter electrode 407. Layers of redox-active molecules 409 (e.g., chemisorbed layers) are attached to the working electrode 403 and the auxiliary counter electrode 407. In this embodiment, electrolyte 410 and counter electrode 411 are not common to multiple electrochemical cells. Rather, each electrochemical cell has its own electrolyte and its own counter electrode. Insulating layer 408 (e.g., $SiO_2$) is used to form a well for electrolyte 410. Counter electrode 411 is encapsulated by sealing layer 412 (e.g., a polymer or an insulator such as SiN, $SiO_X$ and the like). A method for making this embodiment is discussed in more detail below with respect to FIG. 27.

The embodiment of a molecular storage device shown in FIG. 4 provides yet another structure that places one or more auxiliary counter electrodes 407 in close proximity to a working electrode 403. Those of ordinary skill in the art will appreciate that the structures shown in FIGS. 3 and 4 are merely exemplary of the many ways that an auxiliary counter electrode can be incorporated into an electrochemical cell in a molecular storage device.

Figure 5:
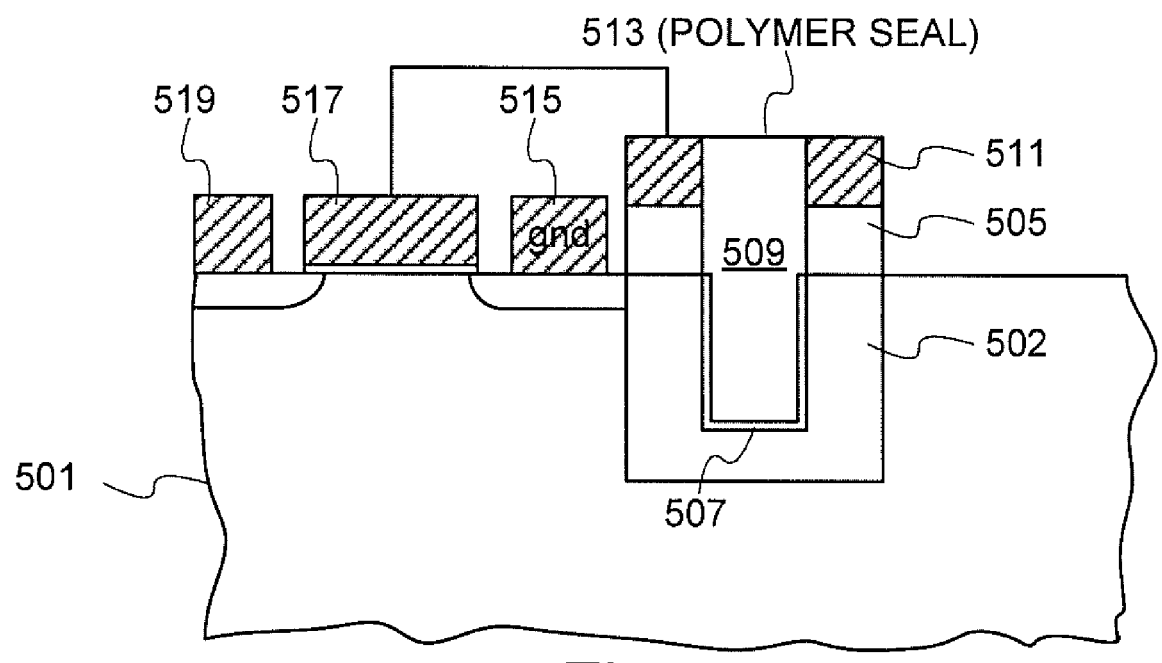
FIG. 5 is a schematic cross-section of a trench or "molehole" molecular storage device and its incorporation in a memory element component in accordance with one embodiment of the present invention.

FIG. 5 is a schematic cross-section of a trench or "molehole" molecular storage device and its incorporation in a memory cell component in accordance with one embodiment of the present invention.

In this embodiment, an electrochemical cell is formed in either a trench structure or a "molehole" structure (e.g., see U.S. patent application Ser. No. 10/046,499, filed Oct. 26, 2001, which is hereby incorporated by reference in its entirety). In some embodiments, a trench extends into substrate 501, through an overlying dielectric layer 505 (e.g., oxide) and counter electrode 511. The walls of the trench are exposed and provide a surface contact to which storage molecules 507 can be attached or otherwise assembled. Storage molecules 507 and electrolyte 509 are added and the structure can then be covered by a polymer 513 (or an insulator such as SiN, $SiO_X$ and the like) to seal the array.

The architecture shown in FIG. 5 can be formed in a manner that avoids the possibility of metal being deposited onto the molecular layer 507, thereby preventing damage. The inside of the trench forms the working and counter electrode surfaces, and molecules form one or more layers of chemisorbed species on the inside of the trench. Thus, the number of molecules can be increased by increasing the depth of the trench. Note that the relative heights of the working electrode 502 and the counter electrode 511 are not drawn to scale in FIG. 5. The height of the counter electrode 511 is typically greater than the height of the working electrode 502. In addition, rather than having the working electrode 502 formed in a heavily-doped region of the semiconductor substrate, the working electrode 502 can be formed by etching trenches or moleholes in metal-insulator-metal sandwich layers. These sandwich layers can be deposited on the semiconductor substrate or on some other surface created during back end of line (BEOL) processing of the semiconductor wafer. The height of each layer of metal determines the height of the trench, thereby allowing easy adjustment of the effective area of the two electrodes. Because the vertical dimension is used, many more molecules are available. This allows greatly enhanced sensitivity for a given cross-sectional area of the semiconductor wafer (the wafer being represented in FIG. 5 by substrate 501). In addition, the design of FIG. 5 easily accomplishes any variation in the relative sizes of each electrode.

In some embodiments, each counter electrode 511 is connected to the gate 515 of a, preferably p-channel, MOS transistor whereas the working electrode 502 is connected to a fixed potential, herein denoted as gnd 515. The voltage on the gate 517 will, thereby, be modulated by the oxidation state of the molecular layer 507, such that the state of molecular layer 507 can be determined by measuring the applied voltage on the source node 519 at which current begins to flow, or alternately by measuring the amount of current which flows when a fixed high potential is applied at node 519. When installed in a completed memory cell, this component would be written by the application of a write voltage to node 517 and read by means of the application of a probe voltage to node 519, thereby allowing for a non-destructive read mechanism.

Molecular storage devices such as those shown in FIGS. 1-5 are well suited for use in memory elements in molecular-based electronic devices and may be utilized in implementing high-capacity, high-density molecular memory arrays and devices with 1 Mbit or greater capacities.

In molecular storage devices, redox-active molecules coupled to a working electrode (e.g., a working electrode such as 103, 301, 403, or 502) are used to store bits. In some embodiments, each redox state can represent a bit or a combination of bits. The redox-active molecules attached to the electrode are part of a memory cell that can store one or more bits in various oxidation states. In some embodiments, the memory cell includes a fixed working electrode electrically coupled to a storage medium comprising one or more redox-active molecules and having a multiplicity of different and distinguishable oxidation states. Data is stored in the (preferably non-neutral) oxidation states by the addition or withdrawal of one or more electrons from the storage medium via the electrically coupled electrode. The oxidation state of the redox-active molecule(s) can be set and/or read using electrochemical methods (e.g., cyclic voltammetry), e.g., as described in U.S. Pat. Nos. 6,272,038, 6,212,093, and 6,208,553 and PCT Publication WO 01/03126, the disclosures of which are herein incorporated by this reference in their entirety. Of particular use are monomeric porphyrins with different types of tethers, ferrocene-derivatized porphyrins, wing-shaped trimeric porphyrins, directly linked dimeric and trimeric porphyrins, and double- and triple-decker porphyrins, as more fully described below.

Figure 6:
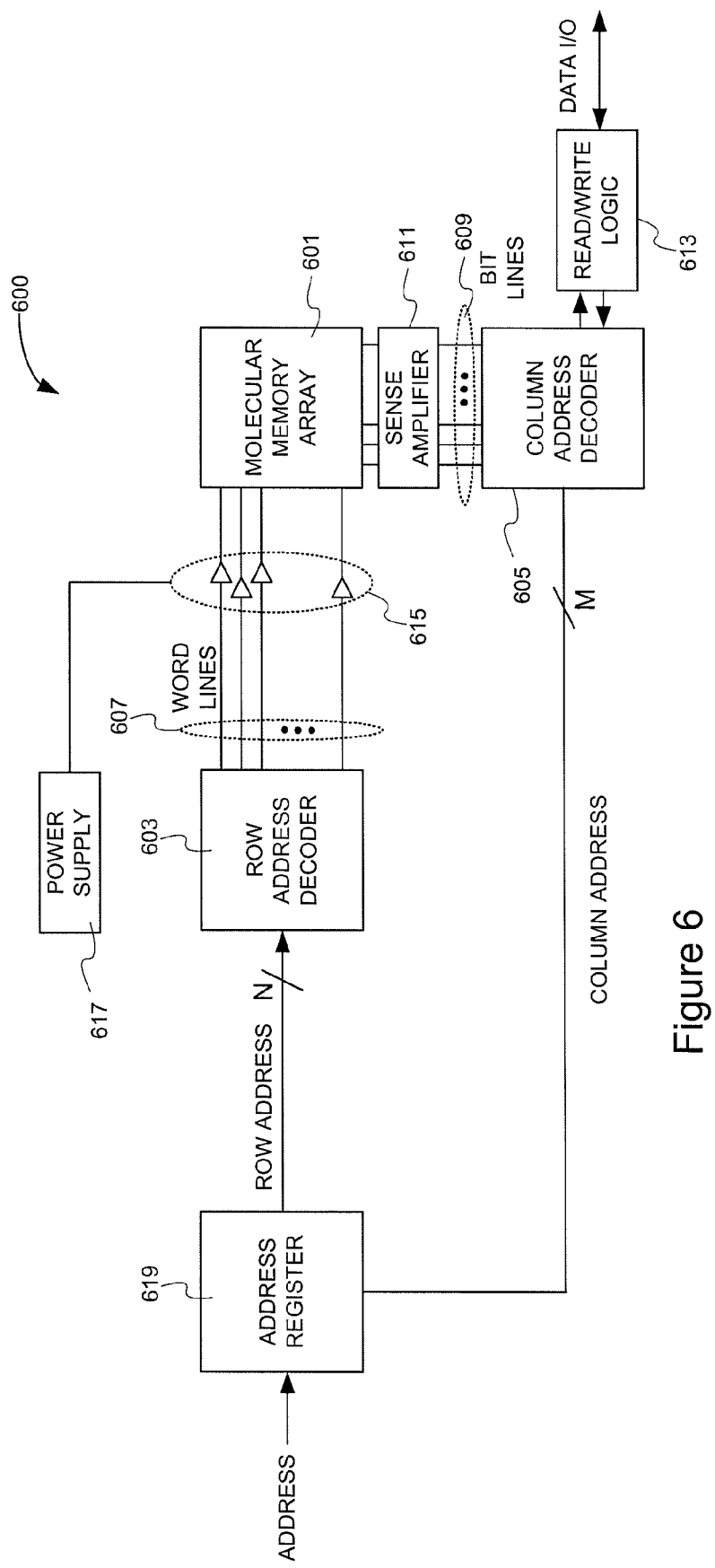
FIG. 6 is a schematic block diagram of a molecular memory incorporating a molecular memory array.

FIG. 6 is a schematic block diagram of a molecular memory 600 incorporating a molecular memory array 601. In some embodiments, molecular memory array 601 comprises an array of 2N rows and 2M columns. Each of the 2N rows is associated with a word line 607, while each of the 2M columns is associated with a bit line 609. In a typical application the word lines 607 and bit lines 609 will cross over or under each other. The location at which a word line and bit line cross is sometimes called an "intersection," even though the word line and bit line are not connected to each other. A molecular memory cell 800 (FIG. 8) is typically located at or near the intersection of each row and column. Molecular memory array 601 may include any number of molecular memory cells 800 arranged in any fashion that meets the needs of a particular application.

Memory 600 is operated by receiving an address into address register 619, which sends an N-bit row address into row address decoder 603 and an M-bit column address into column address decoder 605. Row address decoder 603 generates a signal on one word line 607. Word lines 607 may include word line driver circuitry 615 that drives a high current signal onto word lines 607. Because word lines 607 tend to be long, thin conductors that stretch across much of the chip surface, it requires significant current and large power switches to drive a word line signal. As a result, line driver circuits 615 are often provided with power supply 617 in addition to power supply circuits (not shown) that provide operating power for the other logic. Word line drivers 615, therefore, tend to involve large components. The high speed switching of large currents tends to create noise, stress the limits of power supplies and power regulators, and stress isolation structures.

In a conventional memory array there are often more columns (bit lines) than rows (word lines) because during refresh operations, each word line is activated to refresh all storage elements coupled to that word line. Accordingly, the fewer the number of rows, the less time it takes to refresh all of the rows. In some embodiments, molecular memory cell 800 can be configured to exhibit significantly longer data retention than typical capacitors, on the order of tens, hundreds, or thousands of seconds. Hence, the refresh cycle can be performed much less frequently (e.g., up to orders of magnitude less frequently) or omitted altogether. Accordingly, refresh considerations that actually affect the physical layout of a memory array can be relaxed and arrays of various geometries can be implemented. For example, molecular memory array 601 can readily be manufactured with a larger number of word lines 607, which will make each word line shorter. As a result, word line driver circuits 615 can be made smaller or eliminated because less current is required to drive each word line at a high speed. Alternatively or in addition, shorter word lines 607 can be driven faster to improve read/write access times. As yet another alternative, each row of memory locations can be provided with multiple word lines to provide a mechanism for storing multiple states of information in each memory location.

Sense amplifiers 611 are coupled to each bit line 609 and operate to detect signals on bit lines 609 that indicate the state of a memory cell 800 coupled to that bit line, and amplify that state to an appropriate logic level signal. In one embodiment, sense amplifiers 611 may be implemented with substantially conventional designs as such conventional designs will operate to detect and amplify signals from a molecular memory cell 800. Alternatively, unlike conventional capacitors, some molecular storage devices provide very distinct signals indicating their state.

Read/write logic 613 includes circuitry for placing the memory 600 in a read or write state. In a read state, data from molecular array 601 is placed on bit lines 609 (with or without, but typically with the operation of sense amplifiers 611), and captured by buffers/latches in read/write logic 613. Column address decoder 605 will select which bit lines 609 are active in a particular read operation. In a write operation, read/write logic 613 drives data signals onto the selected bit lines 609 such that when a word line is activated, that data overwrites any data already stored in the addressed memory element(s) 800.

A refresh operation is substantially similar to a read operation, however, the word lines 607 are driven by refresh circuitry (not shown) rather than by externally applied addresses. In a refresh operation, sense amplifiers 611, if used, drive the bit lines 609 to signal levels indicating the current state of the memory elements 800 and that value is automatically written back to the memory elements 800. Unlike a read operation, the state of bit lines 609 is not coupled to read/write logic 613 during a refresh. The refresh operation is only required if the charge retention time of the molecules used is less than the operational life of the device used, for example, on the order of 10 years for flash memory.

Figure 7:
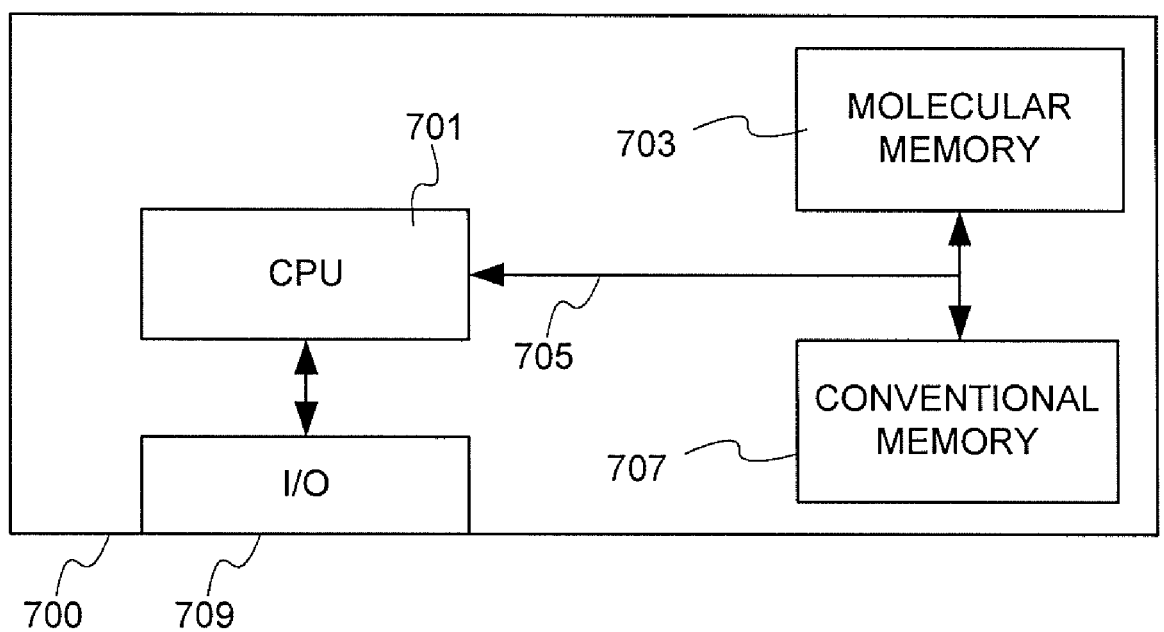
FIG. 7 is a schematic block diagram of a system on a chip (SOC) with embedded molecular memory in accordance with one embodiment of the present invention.

FIG. 7 is a schematic block diagram of a system on a chip (SOC) with embedded molecular memory in accordance with one embodiment of the present invention.

SOC 700 comprises a central processing unit 701 and molecular memory 703. A memory bus 705 couples CPU 701 and molecular memory 703 to exchange address, data, and control signals. Optionally, SOC 700 may also contain conventional memory 707 coupled to memory bus 705. Conventional memory 707 may include random access memory (e.g., DRAM, SRAM, SDRAM and the like), or read only memory (e.g., ROM, EPROM, EEPROM and the like). SOC 700 can include a memory controller (not shown) in addition to a memory bus 705 for coupling the CPU 701 to the molecular memory 703 and any other memory devices included in the SOC 700. SOC 700 may include one or more input/output (I/O) interfaces 709 that enable CPU 701 to communicate with external devices and systems. I/O interface 709 may be implemented by serial ports, parallel ports, radio frequency ports, optical ports, infrared ports and the like. Further, interface 709 may be configured to communicate using any available protocol, including packet-based protocols. As is well known in the art, a SOC can be incorporated and used in a wide variety of computing devices, including, without limitation, laptop computers, personal digital assistants (PDAs), cell phones, digital cameras and camcorders, embedded computers, and the like. Molecular memory 600 by itself or molecular memory 703 embedded in a SOC 700 can be readily incorporated and used in such computing devices, too.

Figure 8:
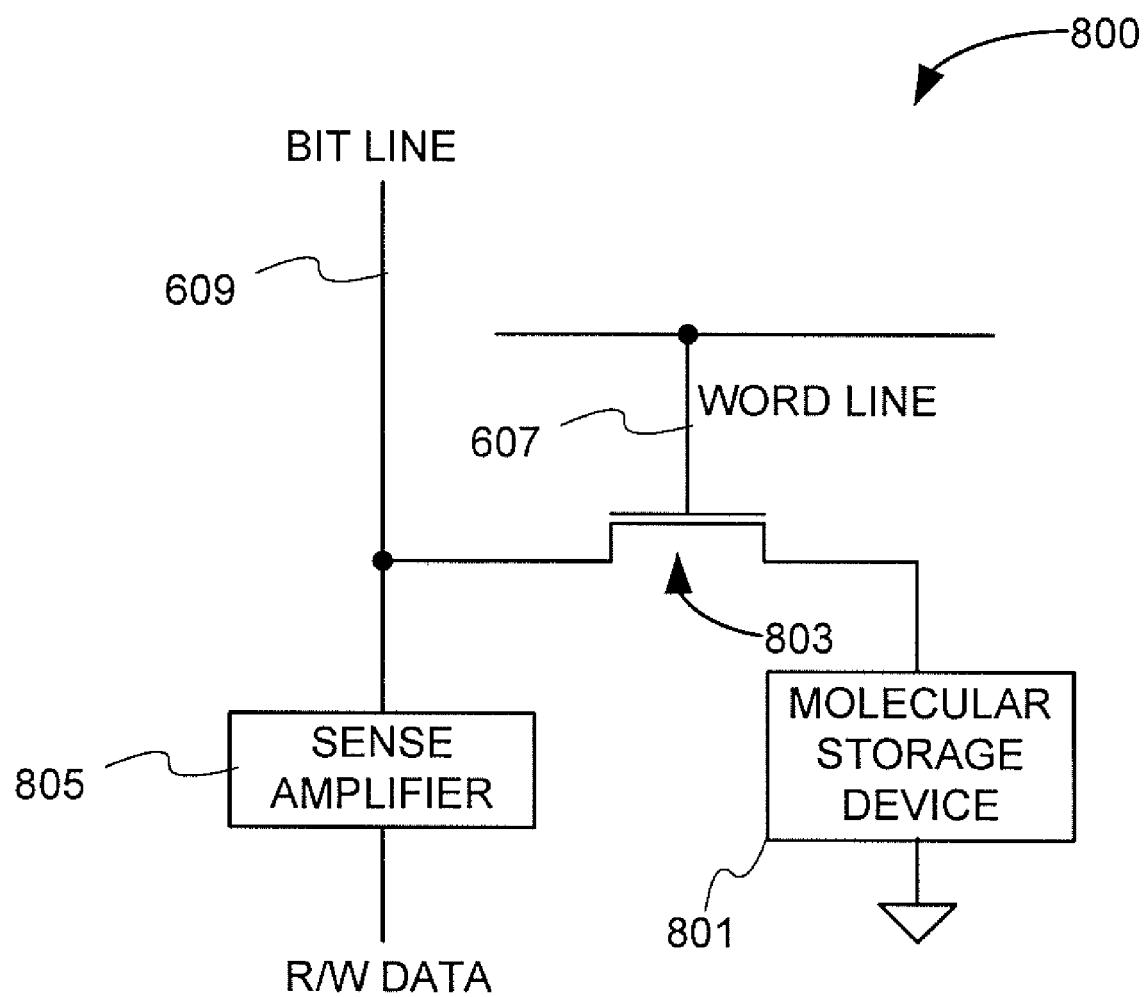
FIG. 8 is a schematic circuit diagram of a memory cell in accordance with one embodiment of the present invention.

FIG. 8 is a schematic circuit diagram of a memory cell 800 in accordance with one embodiment of the present invention. Memory cell 800 is akin to a widely used one transistor one capacitor (1T1C) memory cell design. However, cell 800 differs in that a molecular storage device 801, is employed rather than a conventional capacitor. In some embodiments, the molecular storage device 801 is implemented as a structure formed subsequent to and above a semiconductor substrate having active devices formed therein. In other embodiments, the molecular storage device 801 is implemented as a micron to nanometer sized hole or trench in a semiconductor substrate having active devices formed therein. The molecular storage device 801 is fabricated using processing techniques that are compatible with the semiconductor substrate and previously formed active devices in the semiconductor substrate. In some embodiments, the molecular storage device 801 includes an electrochemical cell having two or more electrode surfaces separated by an electrolyte. Storage molecules (e.g., molecules having one or more oxidation states that can be used for storing information) are coupled to an electrode surface within the electrochemical cell. Examples of storage molecules include monomeric porphyrins, ferrocene-derivatized porphyrins, trimeric porphyrins, porphyrin polymers or triple-decker sandwich porphyrins, among other compounds. Examples of suitable storage molecules are described in greater detail below.

Figure 9:
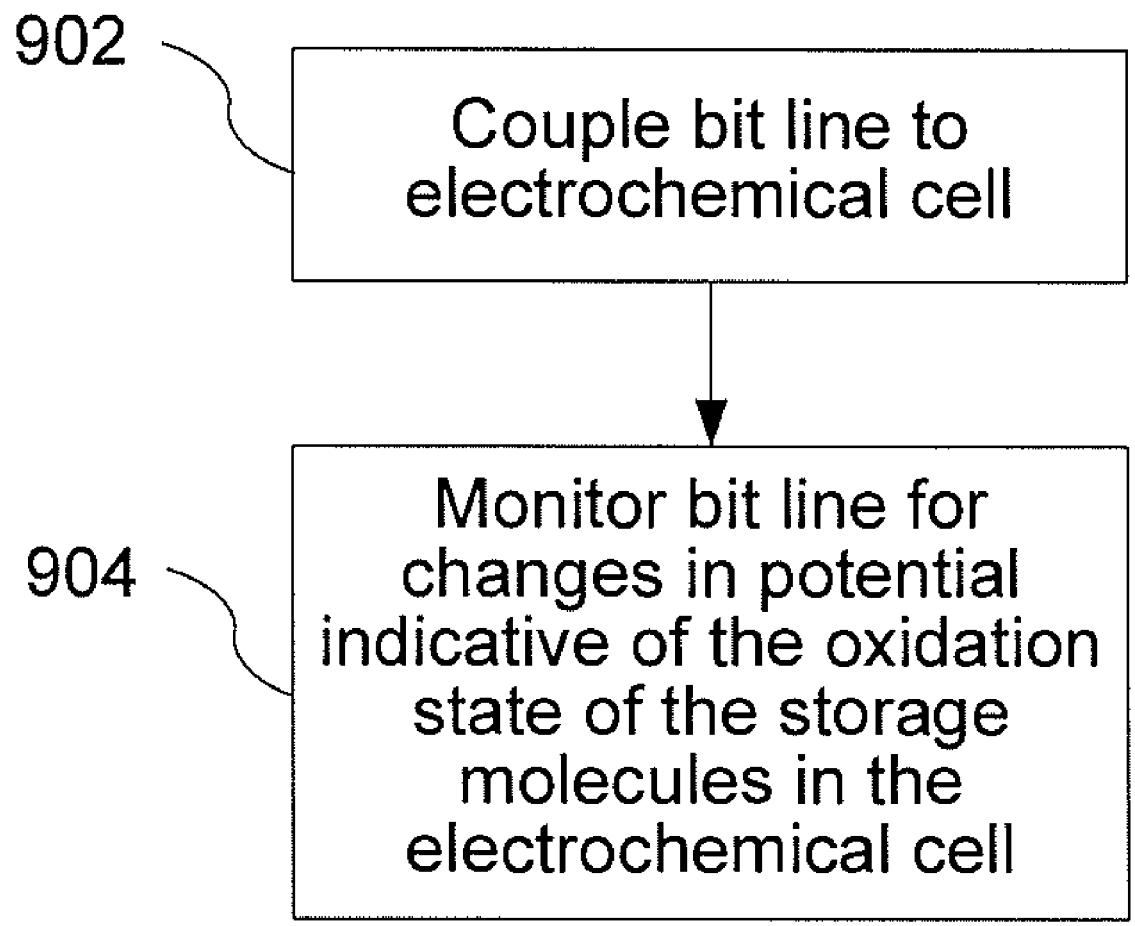
FIG. 9 is a flowchart representing a method of reading from a molecular memory in accordance with one embodiment of the present invention.

FIG. 9 is a flowchart representing a method of reading from a molecular memory in accordance with one embodiment of the present invention.

When a word line 607 is activated, access transistor 803 is placed in a conductive state thereby coupling (902) molecular storage device 801 to its associated bit line 609. In many cases, the signal generated by molecular storage device 801 is not sufficient to drive conventional logic devices. A sense amplifier 805 detects the signal generated by molecular storage device 801 and amplifies that signal to an appropriate logic level (i.e., a signal compatible with other system logic). For example, using porphyrin storage molecules, it is possible to construct molecular storage devices 801 with stable oxidation states at +0.55V, +0.48V, +0.39V, +0.17V, −0.05V and −0.18V (vs. Ag/Ag$^+$). More or fewer stable oxidation states may be provided in a given embodiment. The storage molecules can be placed in a selected one of these oxidation states by application of an appropriate voltage to bit line 609, while activating an appropriate word line 607. Once the molecular storage device 801 is placed in the desired oxidation state, it will remain in that oxidation state for tens, hundreds, thousands or an indefinite number of seconds in particular embodiments.

During reading, a word line 607 is activated and the molecular storage device 801 drives the bit line 609 to a voltage that indicates its oxidation state. In some embodiments, the bit line is precharged to a predetermined potential, then coupled to the electrochemical cell and monitored (904) for changes in potential indicative of the oxidation state of the storage molecules in the electrochemical cell. This is done in a manner very similar to a read operation in a conventional memory. When the access transistor 803 is activated (i.e., placed in a conductive state, forming a closed circuit), the molecular storage device (MSD) 801 is connected to the bit line 609. For example, if the bit line is precharged to a value that is more negative than the oxidation potential of the molecule (with reference to the top metal of the MSD or counter electrode), and that molecule is in an oxidized state, current will flow from the molecule to the bit line (and electrons will flow from the bit line to the molecule). This will result in an accumulation of charge on the bit line, where the magnitude of the charge is determined by the number of molecules in the MSD and the oxidation state of each molecule (Q=nFN, Faraday's Law). The appearance of that charge will change the voltage on the bit line 609 (V=Q/C), and that change in voltage can be distinguished by a voltage-sensing amplifier, as conventionally used in the art.

The bit line voltage during a read operation may vary from the oxidation state voltages due to parasitic effects and loading of the read circuitry, however, the circuitry is arranged to allow the stable oxidation states to be read distinctly. The bit line voltage may be read directly by external logic, or may be amplified to more conventional logic levels by sense amplifier 805. In particular implementations, the sense amplifier 805 may include multiple reference points (e.g., a multi-state sense amplifier) so that it produces stable multi-valued signals on the bit line. Alternatively, sense amplifier 805 may include analog-to-digital functionality that produces a plurality of logic-level binary outputs in response to the multi-value voltage signal read from a particular memory cell 800.

Figure 10:
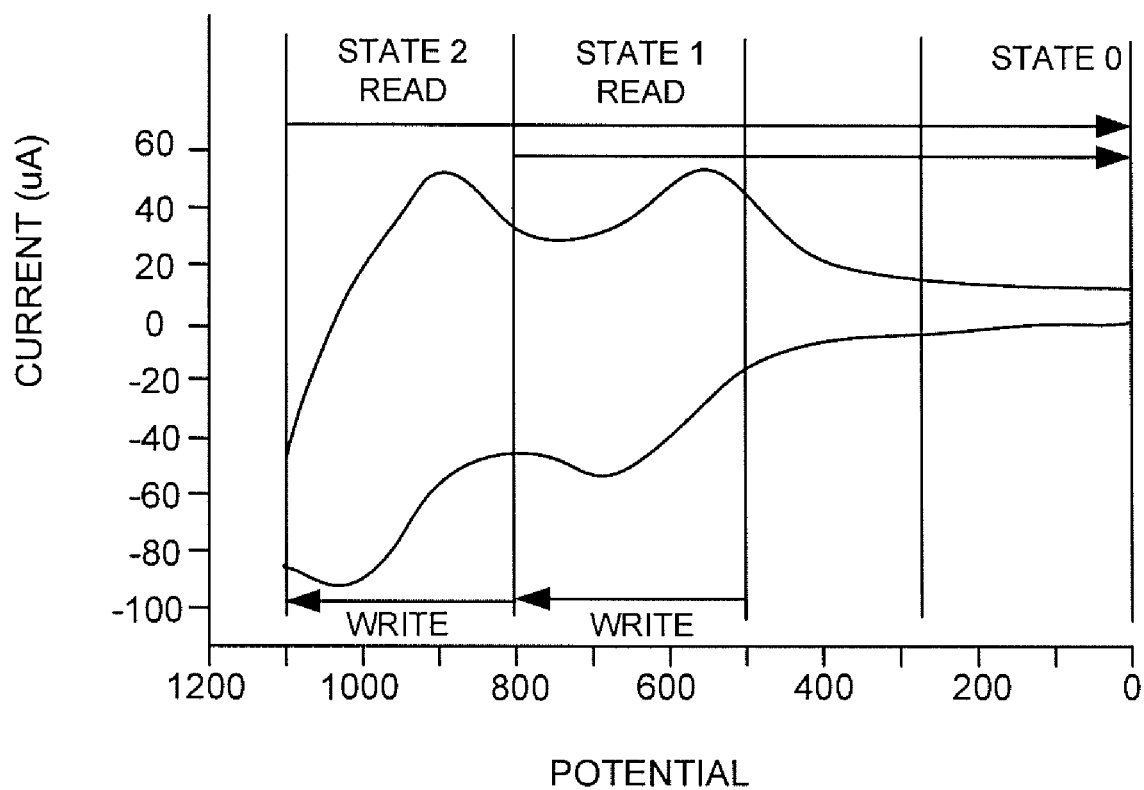
FIG. 10 is an exemplary cyclic voltammogram that illustrates a current-voltage characteristic of a three-state (two oxidized states plus ground state) monomeric porphyrin storage molecule.

One advantage of molecular storage devices 801 is that molecular storage can be adapted to store multiple bits of data at each location by selection of the storage molecules. FIG. 10 is an exemplary cyclic voltammogram that illustrates a current-voltage characteristic of a three-state (two oxidized states plus ground state) monomeric porphyrin storage molecule. The peaks and valleys correspond to distinct oxidation states that can be used for storing information. In the example of FIG. 10, two peaks (plus the unoxidized state) correspond to three distinct states and therefore a molecular storage device 801 that is capable of storing three states of information. Each oxidation state can be set or written to sequentially, in order. The magnitude of the charge read at 0V reflects the number of states oxidized, which can then be translated into the bit pattern written.

Figure 11:
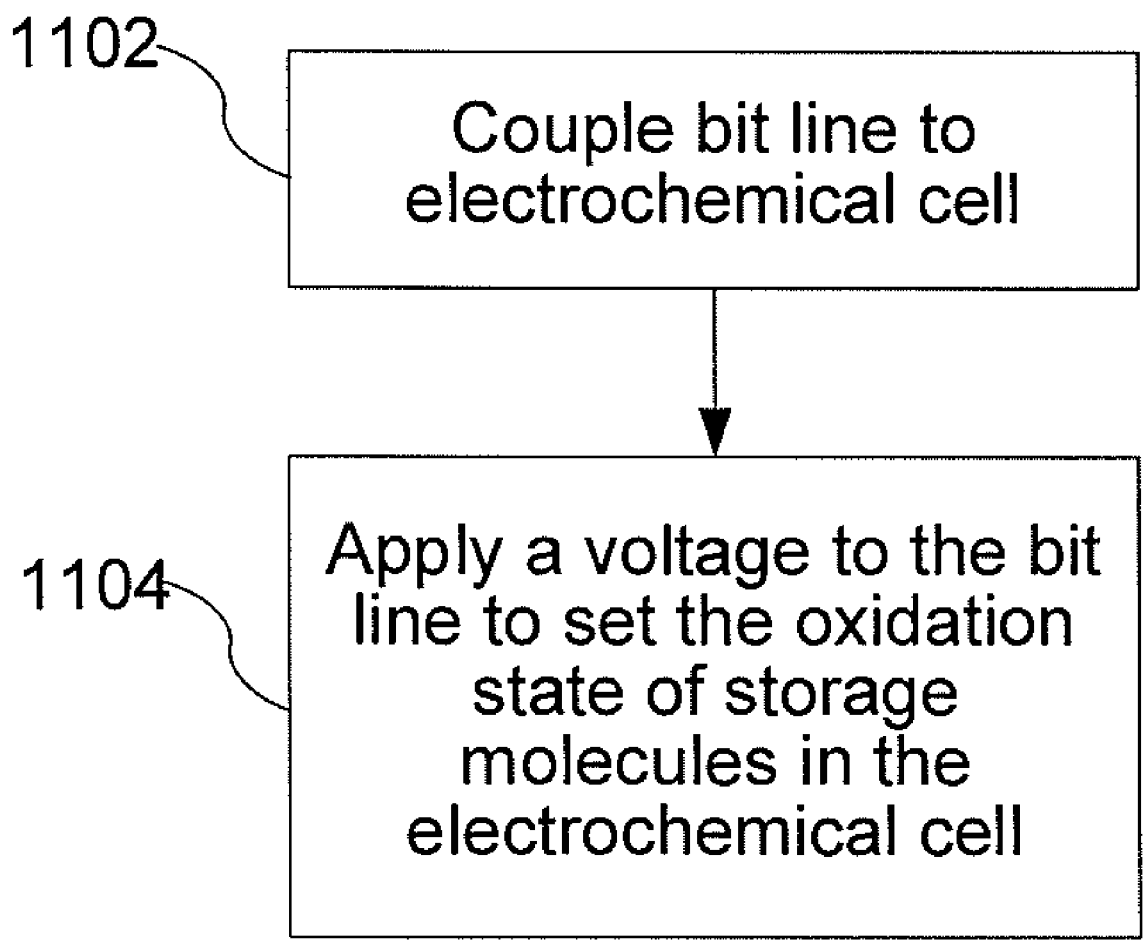
FIG. 11 is a flowchart representing a method of writing to a molecular memory in accordance with one embodiment of the present invention.

FIG. 11 is a flowchart representing a method of writing to a molecular memory in accordance with one embodiment of the present invention.

In order to write a state into the molecular storage device 801, the bit line 609 is coupled (1102) to the molecular storage device 801 and a voltage is applied (1104) to the bit line 609 to create the desired oxidation state of the storage molecules. Typically, the voltage applied to the bit line 609 will be somewhat more positive than the $E_{1/2}$ of the molecule used in the MSD 801 to compensate for resistive and capacitive losses in the writing circuitry. The losses associated with the writing circuitry are measurable and consistent, and so can be readily compensated.

In the specific example of FIG. 10, the bias potential denoted by the horizontal axis represents the potential on the working electrode relative to the applied potential at the counter (or reference) electrode (e.g., 111, 309, 411, or 511), given a specific reaction at the counter electrode. Thus, the location of the curve along the horizontal axis is determined by the electrochemical reaction which takes place at the counter electrode. This reference voltage is determined by the chemical equilibrium potential, as conventionally illustrated by the Nernst equation. Conventionally, this is defined as 0V, and all voltages are referenced to this potential. It should be noted that the chemical composition of the counter electrode and electrolyte determines this voltage and that the voltage is adjustable over a wide range (e.g, by choice of reactant and reactant concentrations at the counter electrode). In the example of FIG. 10, a 500 mV signal on the working electrode, as thus defined, is insufficient to cause oxidation, whereas an 800 mv signal is sufficient to cause oxidation of the first discrete oxidation state. To write a second state to the same storage device 801, the bias potential on the working electrode (e.g., 111, 309, 411, or 511) is set at or above 1100 mV. An 800 mV signal is insufficient to cause oxidation of the second state, whereas an 1100 mV signal is sufficient to cause oxidation of the second discrete oxidation state. Hence, the first and second bits can be written sequentially.

After a write operation, the storage molecules will tend to remain at their oxidation state. In essence, the electrons added, or removed, by the write process are tightly bound to the storage molecules. As a result, charge stored in storage molecules is slower to leak away as compared to charge stored in a conventional capacitor. Once the storage molecules are written to a given oxidation state, they can be read by either voltage-mode sense amplifiers or current-mode sense amplifiers.

As shown in FIG. 10, one characteristic of storage molecules is that, as a linear voltage ramp is applied to molecular storage device 801, the current magnitude will vary distinctively as the oxidation state of the storage molecules changes and charge is thereby removed from or absorbed by the molecules. Each peak in the current-voltage curve shown in FIG. 10 corresponds to a particular transition between specific oxidation states. If the storage molecules are already in a particular oxidation state, little or no current will pass when a "read voltage" that would otherwise result in a transition to that particular state is applied to the device. For example, the molecular storage device 801 can be read by applying zero volts between the counter electrode (e.g., 111, 309, 411, or 511) and the working electrode (e.g., 103, 301, 403, or 502) and measuring the amount of charge produced. A relatively large amount of charge (i.e., the current integrated over time) indicates a second logic state (e.g., State 2 in FIG. 10); a relatively low amount of charge indicates a first logic state (e.g., State 1 in FIG. 10); and little or no charge indicates the fully reduced state (e.g., State 0 in FIG. 10). Thus, by applying a known potential to the device and evaluating the sign and total quantity of charge removed from or absorbed by the molecules, the original oxidation state of the molecules can be uniquely discerned. Similarly, the oxidation state of the storage molecules after a write is determined by the magnitude of the write voltage coupled to the bit line 609.

This reading methodology is partially or wholly destructive in that application of a potential during reading will alter the oxidation state of at least some storage molecules in molecular storage device 801. Accordingly, in some embodiments, a read operation is followed by a write back to the molecular storage device 801 to restore the oxidation state of the storage molecules.

Figure 12:
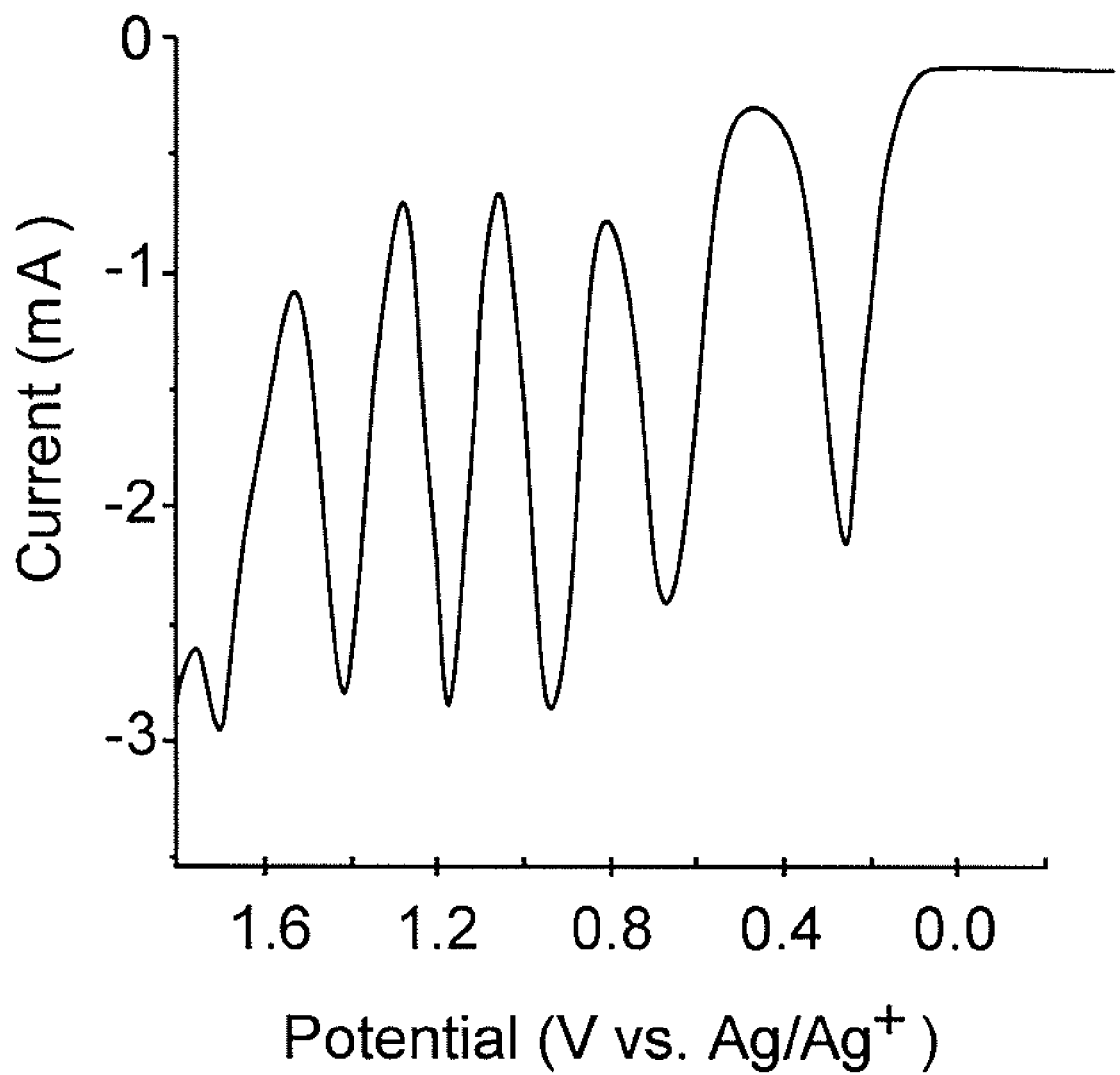
FIG. 12 depicts an exemplary current-voltage voltammogram curve for a storage molecule having multiple distinct oxidation states.

FIG. 12 depicts an exemplary current-voltage voltammogram curve for a storage molecule having multiple distinct oxidation states. Each oxidation state is indicated by a peak in the curve. Molecular storage offers expansion in information density because storage molecules can be designed with a number of distinct oxidation states. In this way, the information density of a memory array increases. By implementing read/write logic, sense amplification mechanisms and the like that support molecular storage, these multiple oxidation states can be put to use in practical memory devices.

Figure 13:
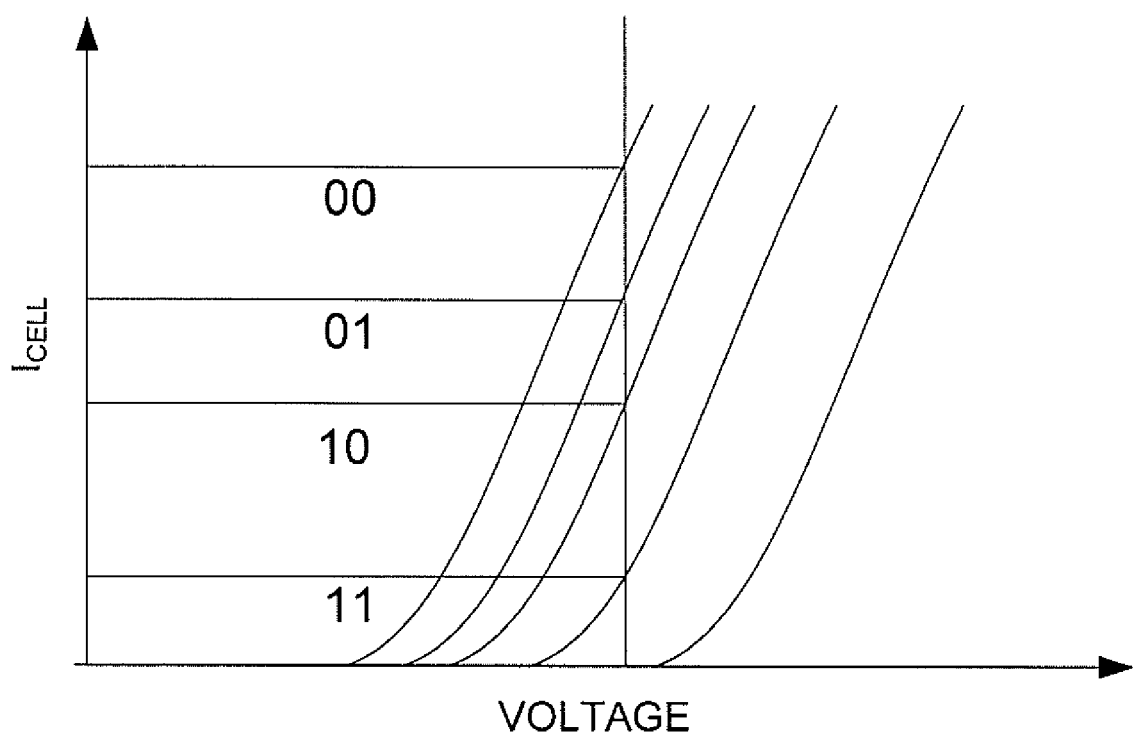
FIG. 13 is an exemplary current versus voltage curve for the memory element component of FIG. 5, which utilizes a storage molecule having multiple distinct oxidation states.

FIG. 13 is an exemplary current versus voltage curve for the memory element component of FIG. 5, which utilizes a storage molecule having multiple distinct oxidation states. At any particular voltage applied to the source node 519 of the, preferably p-channel, transistor gated by the voltage on gate 517, the current is determined by the various oxidation states. Accordingly, reading the oxidation state of molecules 507 can be accomplished by applying a particular voltage to the node 519, measuring the current, and mapping the measured current to an appropriate logic state for the number of bits stored in the memory element component illustrated in FIG. 5.

Figure 14A:
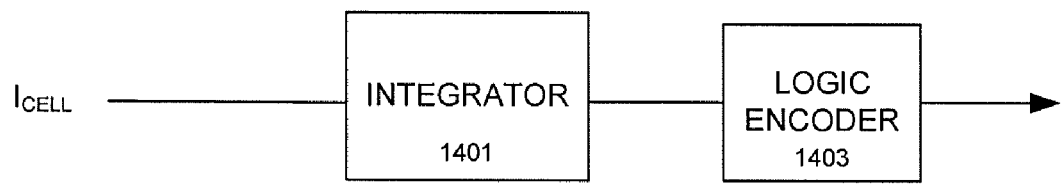
FIGS. 14a and 14b are schematic block diagrams of two arrangements for reading the logic state of a molecular memory cell in accordance with two embodiments of the present invention.
Figure 14B:
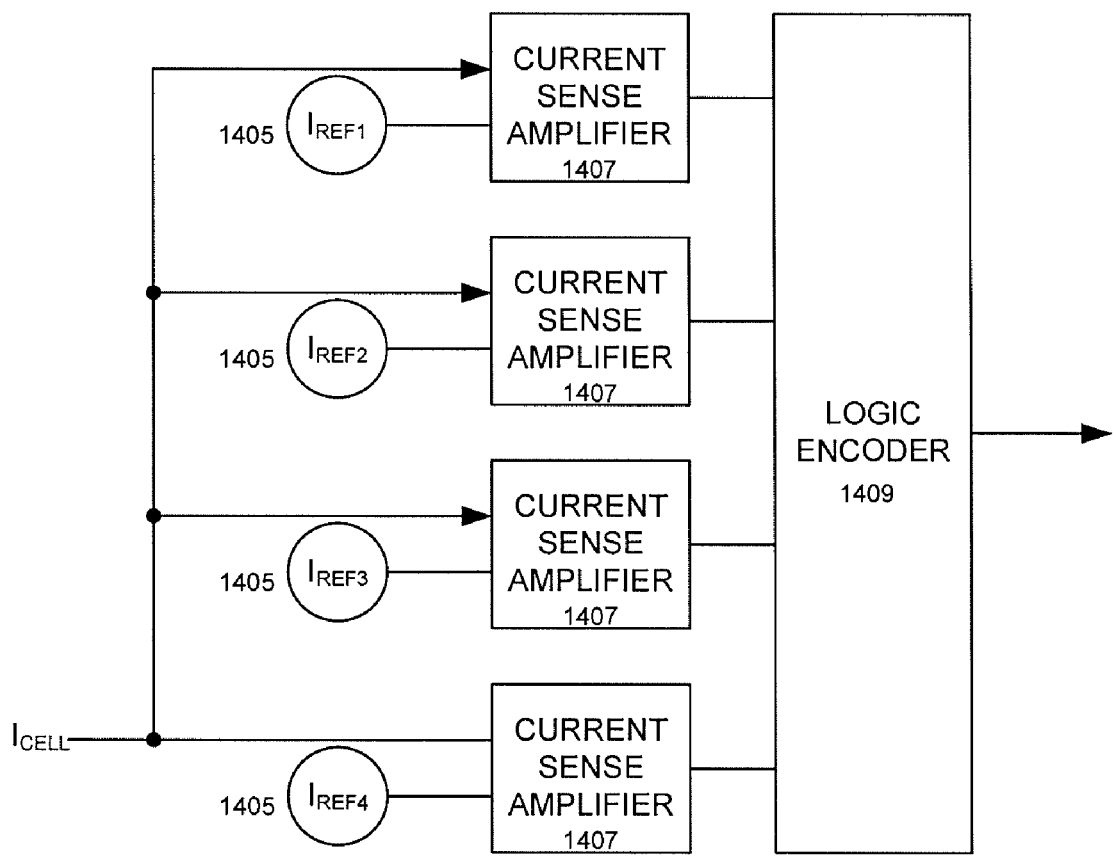

FIGS. 14a and 14b are schematic block diagrams of two arrangements for reading the logic state of a molecular memory cell in accordance with two embodiments of the present invention. Both arrangements are applicable to a multi-state molecular memory.

In FIG. 14a, the cell current ($I_{CELL}$) is coupled to an integrator 1401. Cell current may be directly from a bit line 609, or may instead be pre-amplified. A pre-amplifier may be included within the integrator 1401 or provided separately. The integrator 1401 develops an analog signal indicative of the oxidation state of the molecular memory cell. Logic encoder 1403 receives the analog signal from the integrator and maps it to logic signals, which may include level shifting, inverting, or processing with other combinatorial logic to meet the needs of a particular application.

The arrangement in FIG. 14b implements parallel current sensing and may be used, for example, with the memory element component shown in FIG. 5. The cell current ($I_{CELL}$) is coupled to current-mode sense amplifiers 1407. Cell current may be directly from a bit line 609, or may instead be pre-amplified. A pre-amplifier may be included within each current mode sense amplifier 1407 or provided separately. Each sense amplifier 1407 has a unique current reference 1405 that indicates a threshold current value for a particular logic state. Each sense amplifier 1407 generates a binary signal indicating whether the cell current exceeded the reference current. Logic encoder 1409 receives the binary signals and maps them to logic signals, which may include level shifting, inverting, or processing with other combinatorial logic to meet the needs of a particular application.

Figure 15:
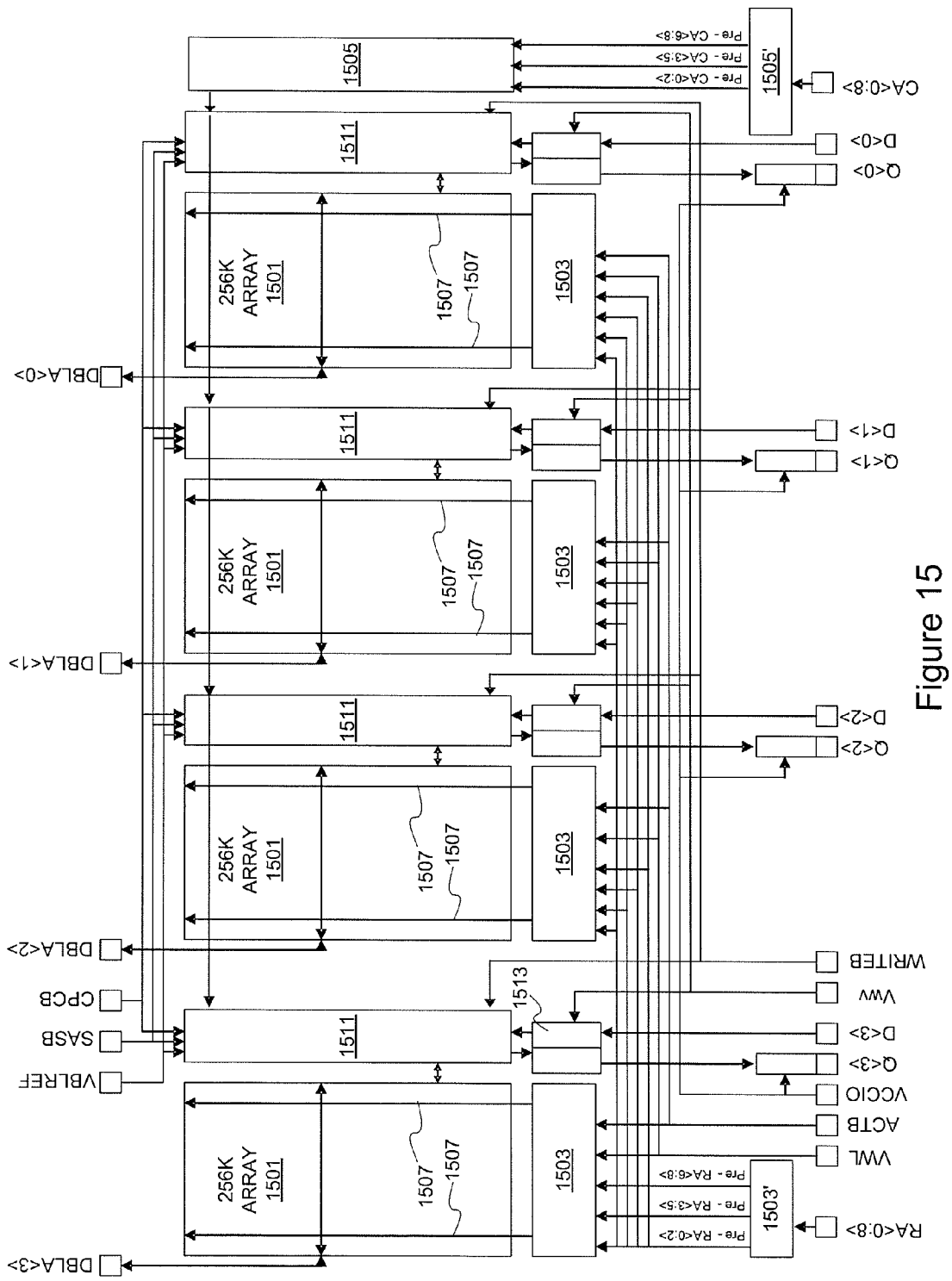
FIG. 15 is a schematic diagram of a molecular memory and supporting interface and control logic in accordance with one embodiment of the present invention.

FIG. 15 is a schematic diagram of a molecular memory and supporting interface and control logic in accordance with one embodiment of the present invention.

FIG. 15 illustrates a 1 Mbit implementation combining many of the molecular storage device features described herein in a practical large capacity memory. A layout like that shown in FIG. 15 follows industry standard pin out to the extent practicable. However, where multiple states are stored in each cell, it may be desirable to provide multiple pin outs so that data can be read out in parallel and the read out consumes fewer clock cycles. The particular implementation shown in FIG. 15 uses four banks of molecular memory cell arrays 1501 where each bank implements 256K memory locations arranged as 512 rows and 512 columns. The entire memory shown in FIG. 15 has 512 rows and 2048 columns or 1048576 locations (i.e., a 1 Mbit memory). Other arrangements of any size can be readily substituted for the particular arrangement shown in FIG. 15. To ease illustration, common chip inputs such as power supply voltages and ground are omitted.

In this embodiment, a nine bit row address is supplied by an external device on the RA<0:8> input to row pre-decoder 1503'. Row pre-decoder 1503' partially decodes the row address and supplies the partially decoded output to each of row decoders 1503. A row decoder 1503 is supplied for each bank whereas the row pre-decoder 1503' is typically shared amongst all of the banks. Row pre-decoder 1503' enables row decoders 1503 to be smaller and generally faster because they are processing addresses that are partially decoded. In the particular embodiment of FIG. 15, row decoders 1503 include word line driver circuitry for each word line. Column addresses are provided to the CA<0:8> input pin to a column address pre-decoder 1505'. Column address pre-decoder 1505' supplies pre-decoded addresses to column decoder 1505, which generates the completely decoded column addresses.

In this embodiment, each molecular memory array 1501 includes 512 word lines 1507. A particular bank is selected for reading and/or writing by an appropriate signal placed on one of the DBLA lines shown in the upper portion of FIG. 15, which activates the bit line addressed by the column decoder 1505. A bit line reference voltage VBLREF is supplied to each of the sense amplifier modules 1511. The bit line reference voltage can be used for voltage-mode sense amplification, or used to drive serial or parallel current-mode sense amplification.

In this embodiment, each molecular memory array 1501 is provided with a sense amplification module 1511 that includes sense amplification circuitry coupled to the 512 bit lines of memory array 1501. Sense amplification module 1511 may also include write pass gates which enable data being written to molecular memory array 1501 to bypass the sense amplifiers, as well as pre-charge pass gates which enables a bit line pre-charge signal (if used) to bypass the sense amplifiers. The bit line pre-charge voltage determines the state to which the cell will be driven when the word line is activated during a read cycle.

In this embodiment, data buffers 1503 serve to drive data signals onto bit lines during write operations, and to read data signals from bit lines during read operations. Logic encoder 1405 for encoding multiple bits of data may be included in data buffer module 1503. Write data is received on the D<> inputs and read data output is placed on the Q<0>-Q<3> outputs. Although the implementation of FIG. 15 is generalized, it is apparent that DRAM circuit techniques and functional components can be adapted to operate a molecular memory. This, in turn, permits existing circuit techniques to be leveraged into high-density molecular storage devices.

Processing Systems

Figure 16:
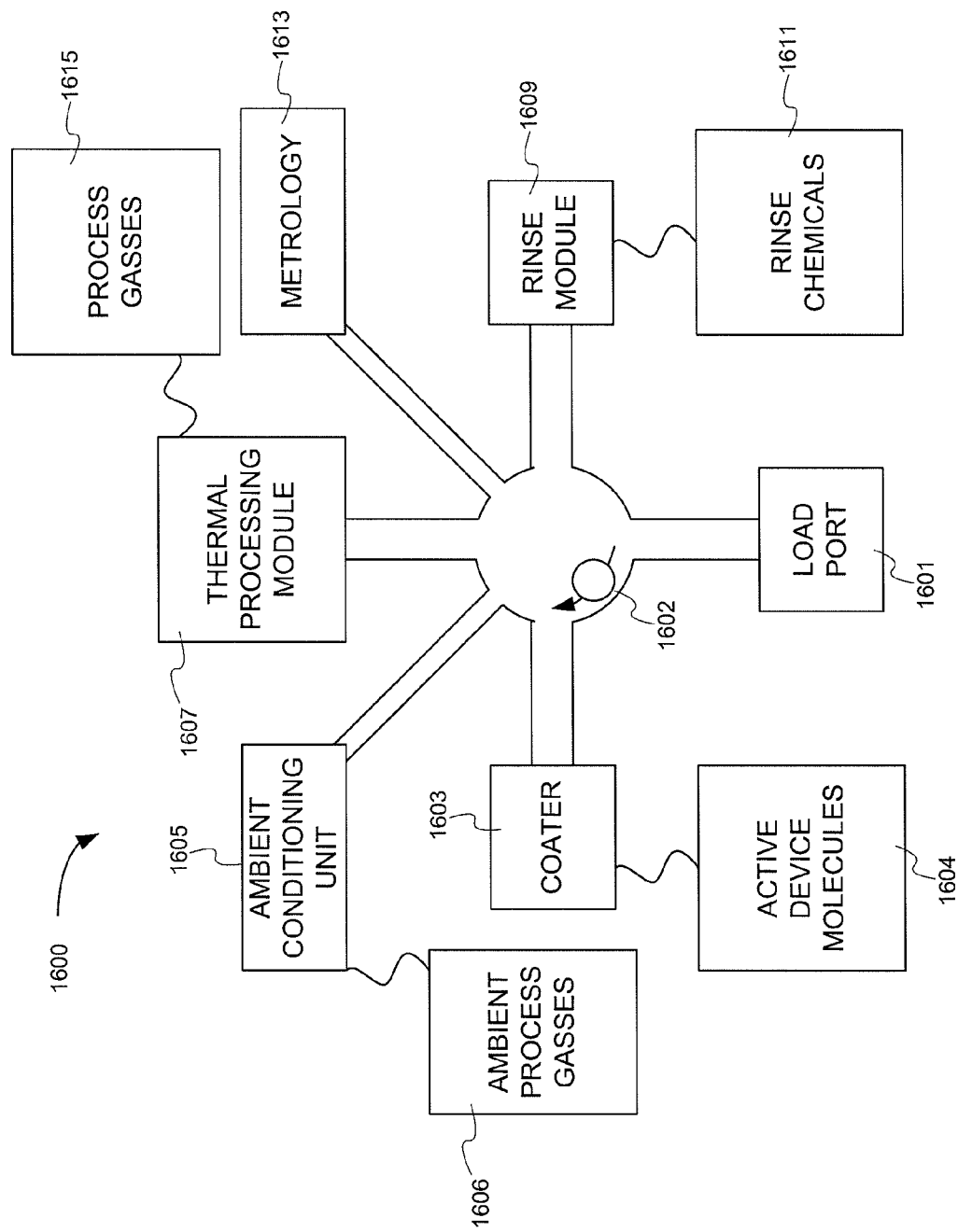
FIG. 16 is a schematic diagram of a molecular attachment processing tool in accordance with one embodiment of the present invention.

FIG. 16 is a schematic diagram of a molecular attachment processing tool in accordance with one embodiment of the present invention.

FIG. 16 illustrates an integrated processing tool having multiple functional modules coupled by robotic substrate transport mechanisms. An integrated tool approach allows the ambient environment to be carefully monitored and regulated to control contaminant levels, humidity levels, temperature, and the like. For example, ambient conditioning unit 1605 desirably comprises dehumidification to maintain a constant low humidity level, temperature controls, and mechanical, chemical and/or electrofiltration to remove particles above about 0.1 micrometers in size. Optionally, ambient conditioning unit 1605 may use desiccants and particle agglomeration mechanisms to further improve and control ambient environmental conditions.

The configuration and arrangement of processing modules of the integrated tool 1600 in FIG. 16 is for purposes of illustration only as any available tool configuration may be used. Alternatively, process modules may be provided separately in a non-integrated environment with multiple independent processing stations. A non-integrated tool may require that each of the tools be placed in a similarly controlled environment and that the transport between process locations be performed using sealed, environmentally controlled carriers.

The apparatus of FIG. 16 is specifically adapted to support processes for attaching active device molecules (e.g., storage molecules) 1604. These processes are particularly well suited for integrated processing because, unlike many semiconductor processes, they can be performed sequentially without requiring a photo-patterning step. Photo-patterning is one of the more difficult processes to integrate because of the bulky specialized equipment involved as well as the frequency with which human intervention is required to operate and maintain the equipment. Accordingly, it is contemplated that a molecular manufacturing tool may integrate even more processes than is practical in other semiconductor manufacturing tools.

In the embodiment shown in FIG. 16, partially processed substrates enter the tool through load chamber 1601, which serves as an air lock to protect the internal ambient environment within the tool. Substrates may be loaded one at a time or in batches.

Transport mechanism 1602 moves substrates between process modules as well as into and out of process modules. Coater 1603 comprises a spin coating module in a particular implementation, although sprayers, vapor coaters, dipping and the like may be used in particular applications. In a particular implementation of the present invention, the coater 1603 may be coupled to a supply 1604 of a solution containing active device molecules, although other mechanisms such as vapor deposition can be used to dispense the active molecules. As stated previously, the coater 1603 may be maintained in a low humidity, ultrapure environment maintained by ambient conditioning unit 1605 and ambient gasses 1606 to prevent contamination. Other equipment also lends itself to environmental control for etching operations, chemical vapor deposition processes and the like. It is desirable in many applications to provide fresh chemicals from supply 1604 for each substrate being coated. This avoids depletion of the chemicals and lowers the risks of contamination associated with reusing chemicals.

Once coated with molecules, substrates are transported by transport mechanism 1602 to a thermal process module 1607. Thermal process module 1607 provides heating and/or cooling using hot plates, convection heaters, infrared heaters, microwave heaters, or other available thermal control systems. The attachment reaction kinetics of selective chemisorption attachment processes are often affected by temperature such that the attachment efficiency is increased, process time reduced, and/or attachment quality improved by allowing the attachment processes to occur over a period of time at temperature. The temperature may be constant or may be varied over time according to a programmed profile to meet the needs of a particular application. By way of specific example, substrates may be maintained at 400 degrees Celsius for a minimum of two minutes when alcohol-linked porphyrins are used as the active device molecules. Thermal processing also serves to drive off solvents that may be used in the solution carrying the active device molecules. Thermal processing module 1607 may also cool substrates after processing at elevated temperatures before the substrates are transferred to a subsequent module.

Figure 17A:
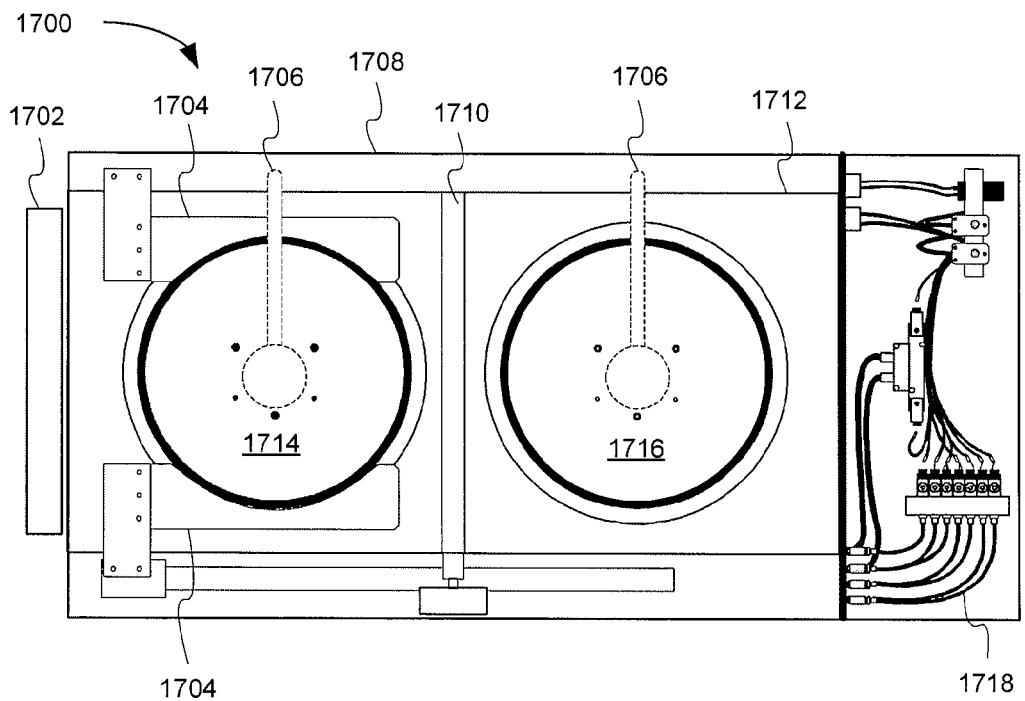
FIGS. 17a and 17b are schematic diagrams of top and side views, respectively, of a thermal processing unit in accordance with one embodiment of the present invention.
Figure 17B:
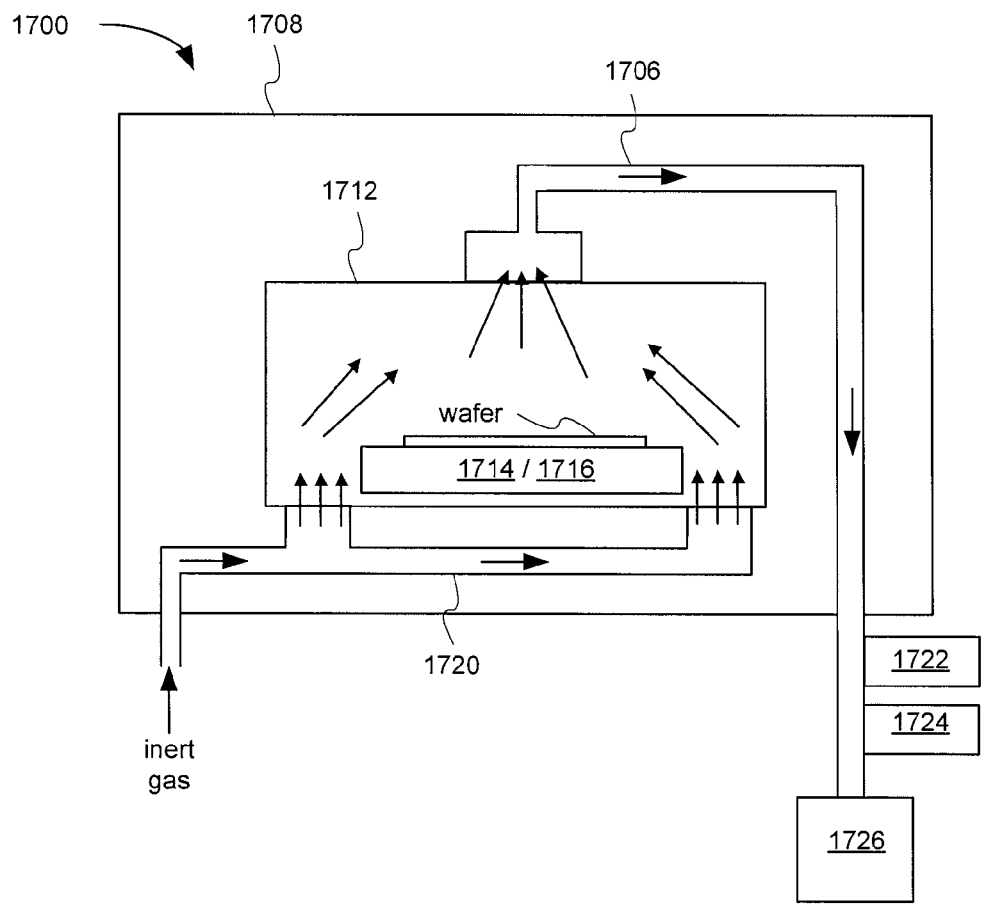

FIGS. 17a and 17b are schematic diagrams of top and side views, respectively, of a thermal processing unit in accordance with one embodiment of the present invention. The thermal processing unit 1700 can either be a thermal processing module 1607 in an integrated molecular attachment processing tool 1600 or it can be a separate stand-alone unit.

Thermal processing unit 1700 has an outer container 1708 that encloses a bake plate 1716 and a cool plate 1714. In some embodiments, both the bake plate 1716 and the cool plate 1714 are enclosed within an inner container 1712 to minimize leakage of air into the heating and cooling areas. The entry door 1702 is sealed (e.g., with an O-ring) and resembles a vacuum load lock to prevent air from getting into the system. In some embodiments, a gas supply system 1720 provides an inert gas stream (e.g., Ar or $N_2$) to purge the ambient surrounding each plate. A gas monitoring and collection system 1706 typically includes water sensor 1722, oxygen sensor 1724, and a vacuum pump 1726. An external computer (e.g., 2000) controls power, temperature profiles, ambient gases, and water and oxygen monitoring. The computer also controls mechanical functions of the unit (e.g., operating entry door 1702, shuttle arms 1704, and bake shutter 1710 with computer-controlled pneumatics 1718).

Bake plate 1716 is capable of reaching 500° C. More typically, bake plate 1716 is used to heat wafers to 350-450° C. for 2-20 minutes, depending on the molecule and electrode material. Bake plate 1716 can also be used for other lower temperature processes, such as solvent drying. Cool plate 1714 is used to cool the wafer after exiting the bake area. The cool plate area also serves as a buffer area between the entry area and the bake area, which is a potential source of water and oxygen contamination. In some embodiments, the bake area and the cool area are separated by an inner door/shutter 1710 that is only open during transport of the wafer.

In some embodiments, the chamber surrounding bake plate 1716 is evacuated to high vacuum levels, typically below $1 \times 10^{-5}$ Torr, to eliminate water and oxygen. This allows for integration in cluster tools for subsequent metal deposition.

Returning to the discussion of FIG. 16, transfer mechanism 1602 transfers substrates from thermal processing module 1607 to rinse module 1609. Rinse module 1609 comprises a spin rinser in a particular implementation that sprays a rinsing solution from supply 1611 onto the substrate surface while the substrate spins. The rinsing solution comprises, for example, solvents such as ethers (tetrahydrofuran) or nitrites (acetonitrile) and the like. The rinsing solution is selected to remove molecules that did not chemically attach, thereby leaving the active device areas (e.g., 2401, FIG. 24) populated with molecules while clearing other device areas. After rinsing, substrates may be returned to thermal processing unit 1607 for drying.

Figure 18:
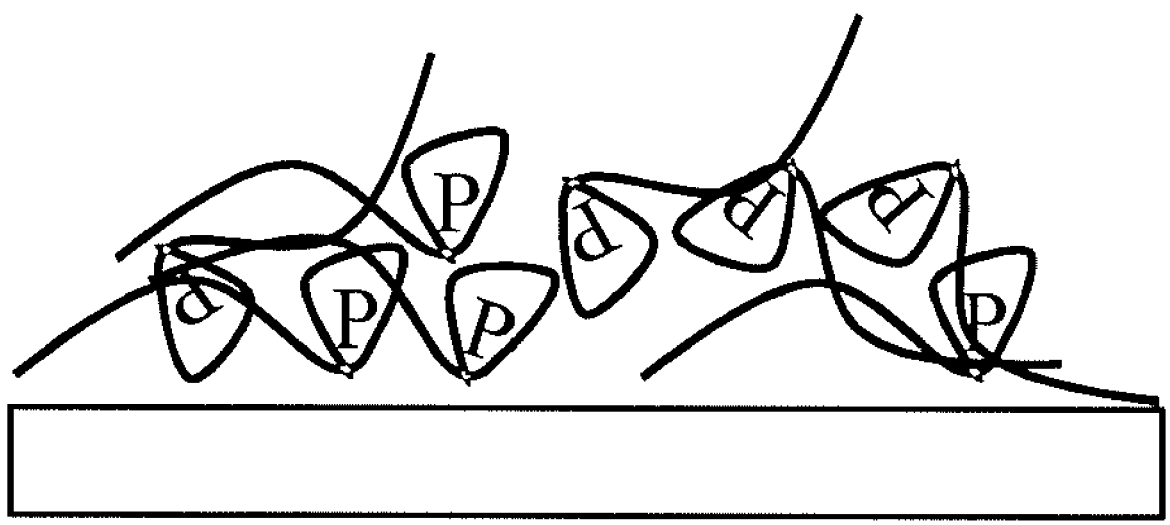
FIG. 18 is a schematic illustration of storage molecules with poor chemisorption to an electrode surface.
Figure 19:
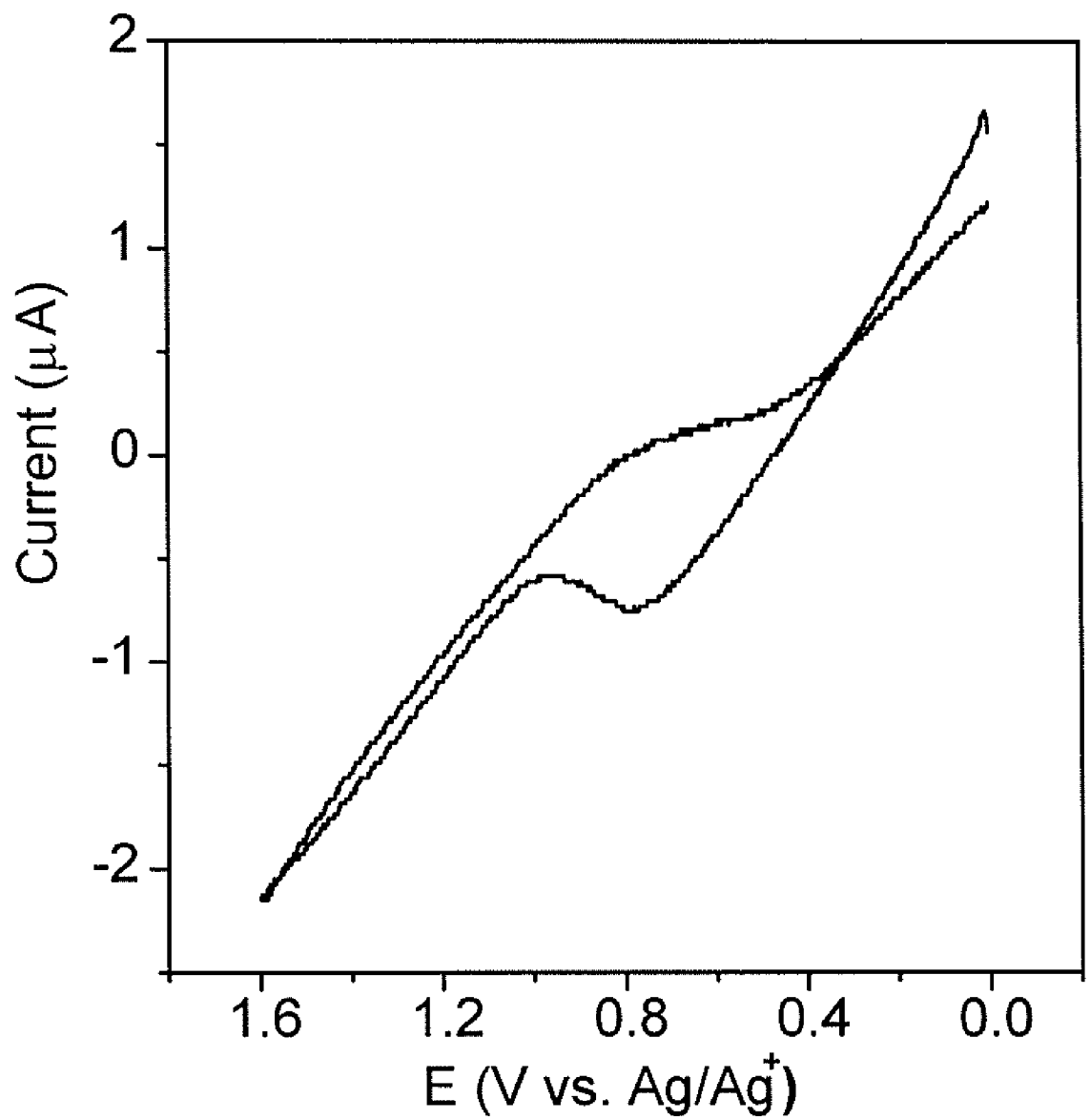
FIG. 19 depicts an exemplary current-voltage curve for storage molecules with poor attachment to an electrode surface.

Optionally, one or more metrology modules 1613 may be included to evaluate the quality of the attached active device molecules. Metrology module 1613 may involve visual observation and qualification of processed substrates, and/or may include electrical characterization of processed substrates. FIG. 18 is a schematic illustration of storage molecules with poor chemisorption to an electrode surface. As shown in FIG. 18, poorly attached redox-active molecules may exhibit poor alignment, distribution, and attachment. While these features are difficult to observe visually, they are electrically apparent. FIG. 19 depicts an exemplary current-voltage curve for storage molecules with poor attachment to an electrode surface. By comparison of FIG. 19 with FIG. 12, for example, it is apparent that poor attachment is readily detectable. Alternative metrology methods such as ellipsometry or other photonic methods to detect the presence of a well formed layer of chemisorbed species may be incorporated into the cluster tool. In many cases, this type of metrology can be used to detect process aberrations before the substrates have exited the processing tool. It may be desirable to incorporate a rework module (not shown) that will strip off the poorly attached molecules and reactivate the surface of the active areas (e.g., 2401) of a malformed substrate. In this manner, unacceptable process variations and failures can be detected and corrected automatically or semi-automatically before the substrates have been removed from the processing tool.

Processed substrates are removed from the processing tool via load port 1601. Once the chemisorption chemistry steps are completed, the substrates are less sensitive to contamination. However, it may be desirable to place substrates in an environmentally controlled carrier for transport to subsequent process locations.

The attachment process tool in FIG. 16 may include single wafer process modules (e.g., coater 1603 and rinser 1609), batch process modules (e.g., thermal processing module 1607), or a combination thereof. (In some embodiments, such as unit 1700, thermal processing module 1607 is a single wafer module, too.) It is contemplated that various processes may be implemented as batch processes even within an integrated environment. Single-substrate processing offers some benefits with respect to process control; however, batch processing tends to be less expensive.

Figure 20:
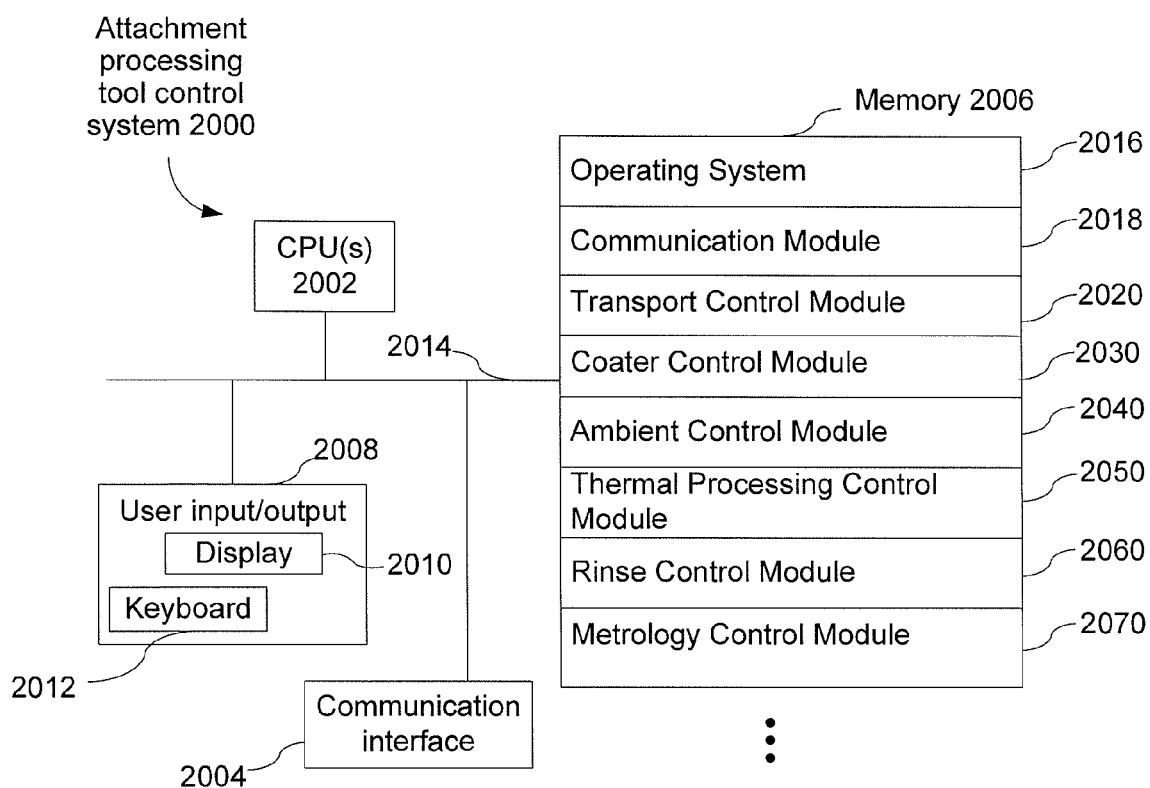
FIG. 20 is a block diagram illustrating a molecule attachment processing tool control system in accordance with one embodiment of the present invention.

FIG. 20 is a block diagram illustrating a molecule attachment processing tool control system in accordance with one embodiment of the present invention. Control system 2000 typically includes one or more processing units (CPUs) 2002, one or more network or other communications interfaces 2004, memory 2006, and one or more communication buses 2014 for interconnecting these components. Control system 2000 optionally may include a user interface 2008 comprising a display device 2010 and a keyboard 2012. Memory 2006 may include high speed random access memory and may also include non-volatile memory, such as one or more magnetic disk storage devices. Memory 2006 may optionally include one or more storage devices remotely located from the CPU 2002. In some embodiments, the memory 2006 stores the following programs, modules and data structures, or a subset or superset thereof:

- an operating system 2016 that includes procedures for handling various basic system services and for performing hardware dependent tasks;
- a communication module 2018 that is used for connecting control system 2000 to other computers (e.g., other control systems used for memory fabrication) or devices via one or more communication interfaces 2004 (wired or wireless); the communication interfaces may include a network interface (for connecting to the Internet, a local area network, or the like), an RS232 interface, or any other suitable interface;
- a transport control module 2020 that manages the operation of load port 1601 and transport mechanism 1602;
- a coater control module 2030 that manages the operation of coater 1603;
- an ambient control module 2040 that monitors (e.g., via oxygen, water, and temperature sensors) and controls the processing ambient within and between (e.g., via ambient conditioning unit 1605) the various modules in tool 1600;
- a thermal processing control module 2050 that manages the operation of the thermal processing module 1607;
- a rinse control module 2060 that manages the operation of rinser 1609; and
- a metrology control module 2070 that manages the characterization of processed substrates in one or more metrology modules 1613.

Figure 21:
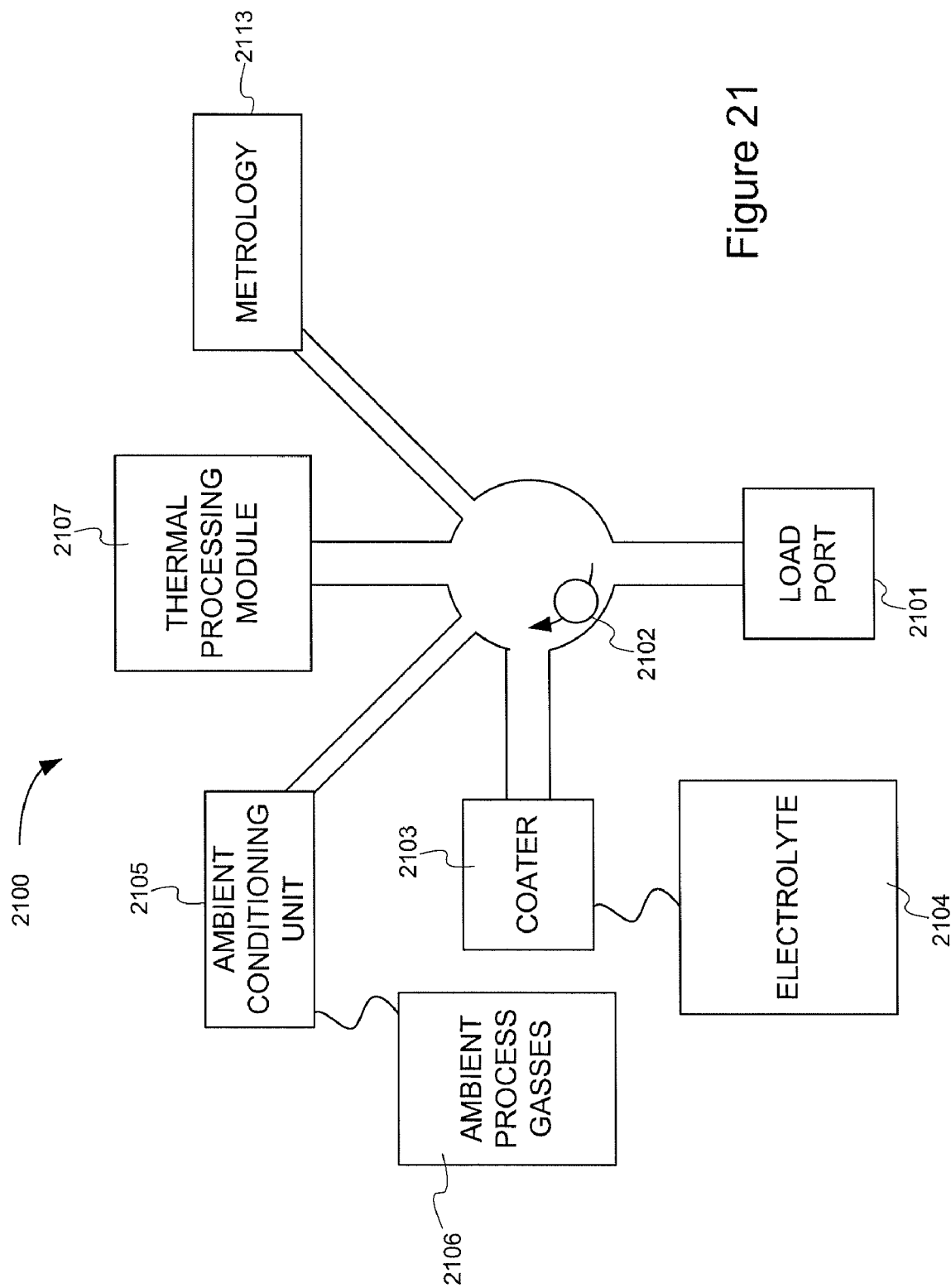
FIG. 21 is a schematic diagram of an electrolyte processing tool in accordance with one embodiment of the present invention.

FIG. 21 is a schematic diagram of an electrolyte processing tool in accordance with one embodiment of the present invention.

As part of making an array of electrochemical cells, an electrolyte is applied to the substrate surface over the attached active device molecules. The electrolyte processing tool 2100 can be used either in-line with the molecule application tool 1600, or as a standalone tool. In some embodiments, the electrolyte is a gel that is similar in composition and consistency to a photoresist. For gel electrolytes, photoresist application tools can be adapted to apply an electrolyte gel thickness on the order of 200 nm (or even substantially thicker or thinner), bake it and transfer it to the next step in the process.

FIG. 21 illustrates an electrolyte processing tool 2100 that would typically be used subsequent to the attachment tool 1600. Alternatively, the electrolyte processing tool 2100 can be integrated with the attachment tool 1600 or coupled to the attachment tool 1600 so that substrates can be automatically transferred (e.g., by robotic transfer mechanisms) between the tools. In some embodiments, electrolyte formation involves application of a conformal layer of electrolyte solution or gel to cover the active device molecules. The electrolyte supply 2104 is maintained in an environmentally controlled storage container so that it can be delivered through coater 2103 with consistent temperature, concentration and uniformity. Example materials that are suitable electrolyte components include polyethylene oxide, propylene carbonate, ethylene carbonate and the like. The spin speed and spin speed profile of coater 2103 are adjusted based on the viscosity and flow characteristics of the electrolyte to provide suitable coverage and final thickness of the electrolyte for a particular application. See the discussion below of FIG. 25 and Table 2 for additional details regarding electrolyte materials and processing conditions.

Transfer mechanism 2102 moves substrates from coater 2103 to thermal processing module 2107, which includes, for example, hot plates, convection heating, infrared heaters, microwave heating, or other suitable controlled thermal mechanism(s) for heating and/or cooling the substrates. Thermal processing is used to drive off solvents or carrier liquids to increase the viscosity of a gel electrolyte. Thermal processing may also polymerize or partially polymerize a gel electrolyte to improve mechanical stability in certain applications. Thermal processing may be performed in the ambient atmosphere provided by ambient conditioning unit 2105, or alternatively provided by ambient process gasses supplied directly to thermal processing module 2107. A typical thermal treatment cycle would involve soaking the substrates at 65 degrees Celsius for about one minute.

Optionally, metrology unit 2113 may be used to physically, optically, or electronically characterize partially processed substrates while they remain in the protected environment of the electrolyte formation tool 2100. Tests performed by metrology unit 2113 can be similar to those performed by metrology unit 1613 described in reference to FIG. 16. Integrated rework units (not shown) may be included to rework product determined to be unacceptable by metrology unit 2113.

Figure 22:
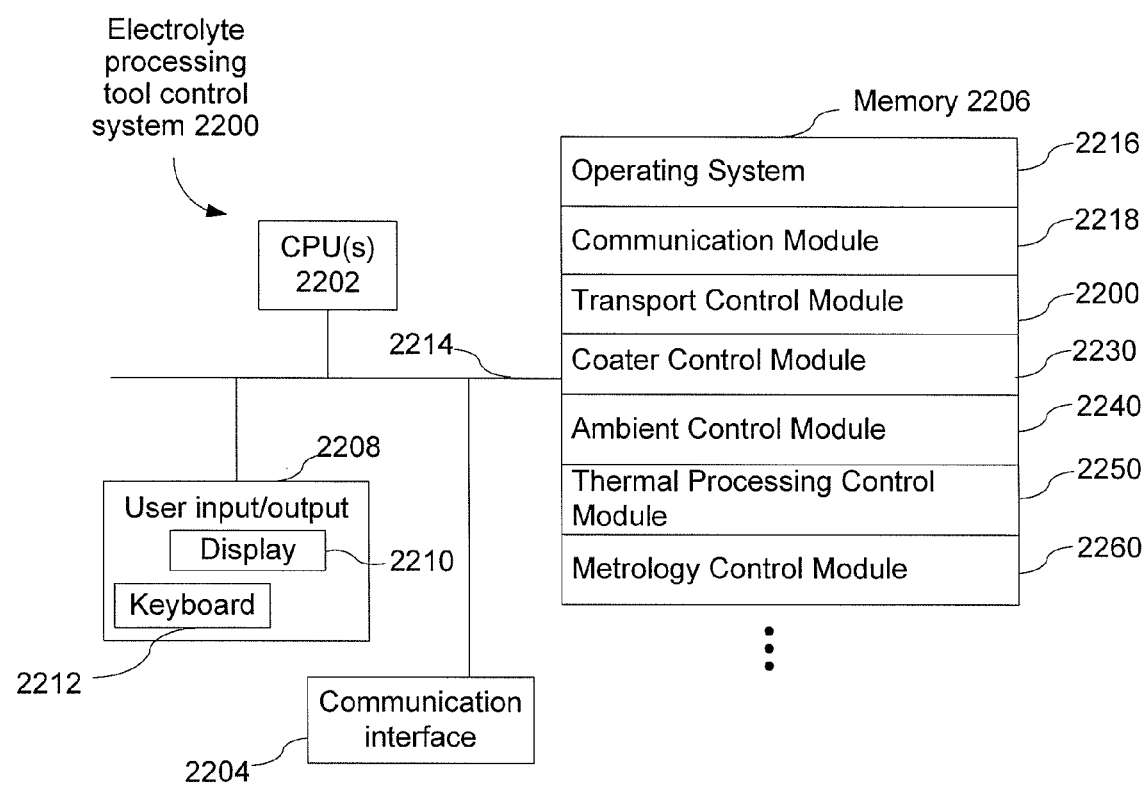
FIG. 22 is a block diagram illustrating an electrolyte processing tool control system in accordance with one embodiment of the present invention.

FIG. 22 is a block diagram illustrating an electrolyte processing tool control system in accordance with one embodiment of the present invention. The aspects of FIG. 22 that are analogous to those in FIG. 20 are not described again here. The memory 2206 in control system 2200 stores the following programs, modules and data structures, or a subset or superset thereof:

- an operating system 2216, as described above;
- a communication module 2218, as described above;
- a transport control module 2220 that manages the operation of load port 2101 and transport mechanism 2102;
- a coater control module 2230 that manages the operation of coater 2103;
- an ambient control module 2240 that monitors (e.g., via oxygen, water, and temperature sensors) and controls the processing ambient within and between (e.g., via ambient conditioning unit 2105) the various modules in tool 2100;
- a thermal processing control module 2250 that manages the operation of the thermal processing module 2107; and
- a metrology control module 2260 that manages the characterization of processed substrates in one or more metrology units 2113.

Referring to FIGS. 20 and 22, each of the above identified modules and applications corresponds to a set of instructions for performing a function described above. These modules (i.e., sets of instructions) need not be implemented as separate software programs, procedures or modules, and thus various subsets of these modules may be combined or otherwise re-arranged in various embodiments. In some embodiments, memory 2006 or 2206 may store a subset of the modules and data structures identified above. Furthermore, memory 2006 or 2206 may store additional modules and data structures not described above.

Although FIGS. 20 and 22 show control systems 2000 and 2200 as a number of discrete items, FIGS. 20 and 22 are intended more as functional descriptions of the various features which may be present in control systems 2000 and 2200 rather than as a structural schematic of the embodiments described herein. In practice, and as recognized by those of ordinary skill in the art, items shown separately could be combined and some items could be separated. For example, some items shown separately in FIGS. 20 and 22 could be implemented on single computers and single items could be implemented by one or more computers. The actual number of computers used to implement control systems 2000 and 2200 and how features are allocated among them will vary from one implementation to another.

Figure 23:
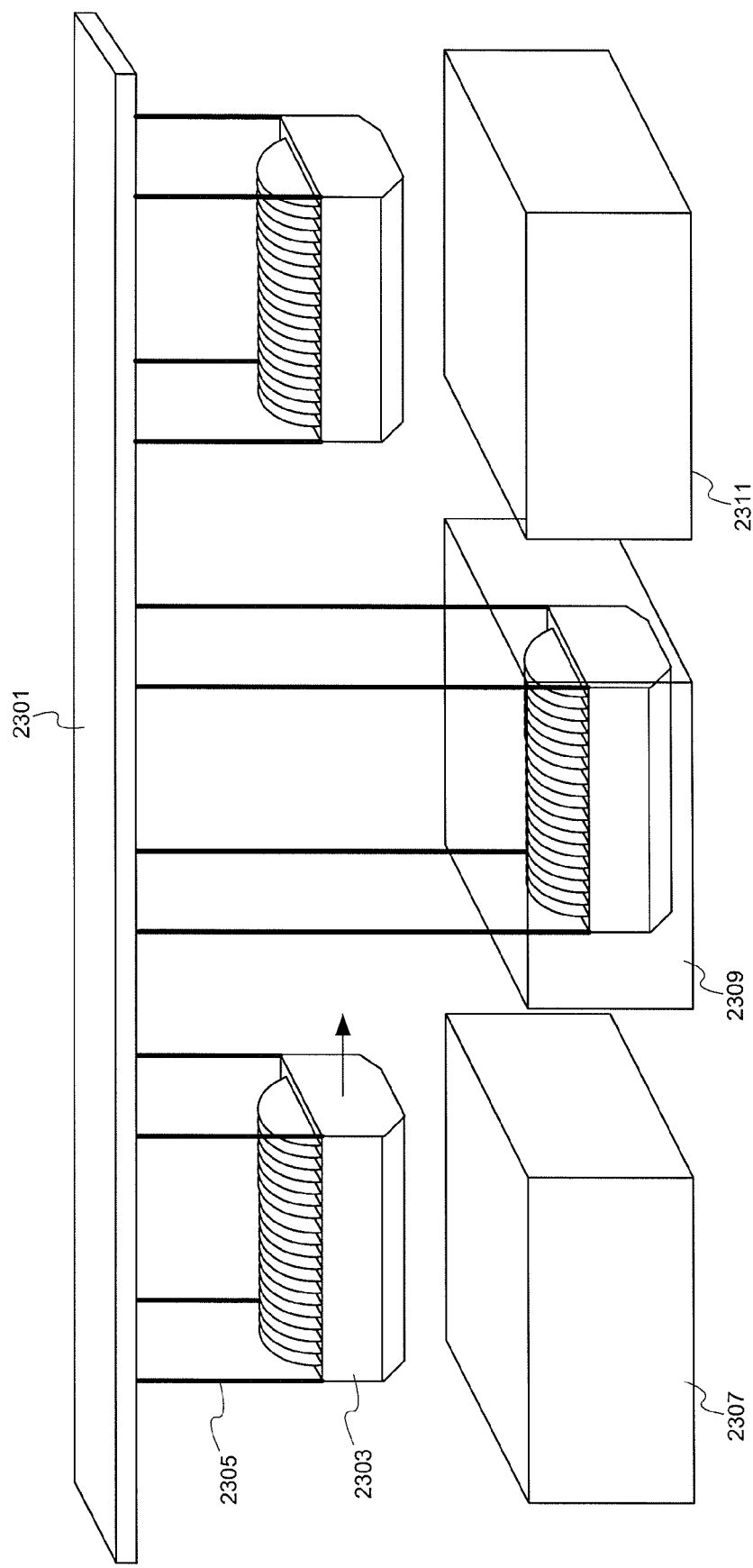
FIG. 23 is a schematic diagram of a portion of a batch processing tool in accordance with one embodiment of the present invention.

FIG. 23 is a schematic diagram of a portion of a batch processing tool in accordance with one embodiment of the present invention.

Batch processing techniques process multiple substrates at the same time and tend to have cost advantages over single-wafer processes. For example, production tools that are designed to rinse 25 to 100 substrates (or more) at a time in large tanks or spray rinsers can be modified to be used as a large reaction vessel for the attachment of molecules. Thus, a large tank full of a solution containing active device molecules (e.g., storage molecules) can be prepared and maintained at an appropriate temperature, and a large number of wafers can be processed at the same time. These automatic tools have the advantage of in-line wafer cleaning and drying stations capability.

In FIG. 23, a robotic transfer mechanism comprising an overhead track 2301 loads and transfers wafers from the inline cassette (not shown) to a fluorocarbon polymer carrier 2303 (or other inert carrier) designed to be used in contact with molecule and solvent solutions. As many as 100 wafers can be loaded at a time in large production tools, although smaller capacity such as 25-wafer batches are desirable in many applications.

A robot arm 2305 transports carrier 2303 and lowers it into a temperature controlled inert tank 2307 filled with a solution of the molecules. In some embodiments, the boat 2303 and wafers are then left in the tank for a predetermined length of time sufficient for the completion of the attachment chemical reactions. In some embodiments, if the attachment reactions require high temperatures, the wafers may be transferred to an oven (not shown in FIG. 23) after dipping in the solution containing molecules. After chemical attachment, the robotic arm 2305 lifts the carrier 2303 and transfers the carrier 2303 to rinse tank 2309. Rinse tank 2309 is filled with solvent or other suitable reagent to facilitate the removal of molecules not attached to the surface. Typically, rinse tank 2309 can be agitated or stirred with bubbling inert gas or ultrasonic energy. After a suitable time, the robotic arm 2305 lifts up the boat again and transfers it to a final rinse tank 2311. Final rinse tank 2311 contains a solvent or other suitable reagent for rinsing. After rinsing, the carrier 2303 and wafers may be dried in a controlled ambient atmosphere (e.g., nitrogen) to reduce contamination.

Batch processing has some potential negative characteristics. First, from the contamination point of view, it is easy to contaminate the entire wafer load if unwanted chemicals or other contaminants are inadvertently introduced into any tank. Also, an environmental containment system that controls ambient atmosphere should be provided around all of the process stations and transport mechanism, which can be expensive to create and difficult to maintain as compared to single-substrate systems. Given the expected surface concentration of active charge sites, this contamination level would not have to be large. In addition, valuable and expensive chemicals may attach on the backside of the wafer as well as on the boat or cassette. This can happen if for instance, the specific attachment tether is chemically active on the surface that wafer-processing leaves on the back side of wafers in the production run (e.g., oxides, nitrides, etc.) of materials that are used in current production line tools (e.g., quartz).

A small percentage of molecules in solution actually wind up attached to the active area surface (e.g., the working electrode surface) in a finished molecular storage device. Consider that saturation coverage of even the smallest active device molecules currently being used for molecular device manufacturing occupy roughly $1 \times 10^{14}$ molecules per square centimeter of surface area, and the fact that saturation concentration in solution is roughly 50 millimolar. For a single wafer tool, assuming each substrate requires 5 ml of molecule solution, there is approximately 250 mg of molecules applied to an 8" wafer. Yet $1 \times 10^{14}$ molecules per square centimeter implies that nanograms of material are actually attached to the surface. Hence, a large quantity of potentially useful active device molecules is rinsed away in the subsequent cleaning steps.

In the batch tool case, the potential for waste is more dramatic. Assuming the same solubility of the solution, a typical 30-liter tank would contain approximately 20-30 grams of molecules. It would require many hundreds of thousands of wafers processed through this tank to even approach gram quantity of depletion, let alone kilograms. It is more likely that contamination in the tank would make the solution worthless before depleting this quantity of material.

Thus, it is valuable in both single-substrate and batch process tools to incorporate a method to recover the solution after molecular attachment to the surface and rework the solutions to make them usable for further processing on subsequent wafers. As part of this recycling effort, chemical purification methods to ensure high quality and non-competing chemical reactions to the surface of attachments have already been developed and are being scaled to required volumes for large-scale manufacturing. Thus, a simple collection strategy on these tools, such as effluent collection on the spinner single wafer tool or tank storage of used solution in the bulk process tools, can be used. The collected solutions are sent back to the laboratory for purification and re-dissolution of the molecules to the correct solution concentration. Quality assurance programs (purity, ionic strength, etc.) are used for process control and reproducibility considerations.

Processing Methods

FIGS. 24a-24d illustrate a portion of a molecular electronic device at various stages of processing in accordance with one embodiment of the present invention.

In some embodiments, the active device molecules (e.g., storage molecules) are attached using selective chemisorption processes. This generally refers to processes that match surface characteristics of a device substrate or structure with attachment properties of molecules. This is accomplished by manipulating the surface properties of the substrate and/or device structures so that the active device molecules will naturally tend to attach in a desired fashion. Selective chemisorption allows the molecules to attach selectively to a particular type of surface (for example, gold, silicon, various metals and oxides), which can avoid masking and patterning operations. Further, selective chemisorption processes can encourage the active device molecules to pack tightly on a surface, and to align in a desired manner on the surface so that the molecules exhibit one or more desired behaviors. In some cases, selective chemisorption results in molecules with a uniform orientation on a surface. In some cases, selective chemisorption can be used to produce self-assembled monolayers. As discussed herein, an initial chemisorption step can be done, followed by in situ polymerization of ReAMs.

An important advantage of selective chemisorption processes is that devices with molecular scale features and components can be manufactured using tools and equipment that are designed for much larger dimensions. Molecules can be applied using batch processes to an entire wafer (e.g., by spin-coating, spraying, gas-phase coating, and/or dipping) and will attach to only those surfaces for which they are designed. Unattached molecules are simply washed away from the other "inactive" surfaces. In this manner, semiconductor tools for coating, etching and photo-patterning can be used to define larger structures than the molecular devices while selective chemisorption processes are used to define the molecular-scale features.

Figure 24A:
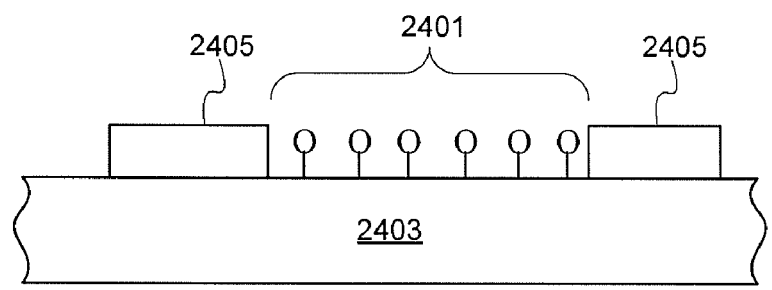
FIGS. 24a-24d illustrate a portion of a molecular electronic device at various stages of processing in accordance with one embodiment of the present invention.

In FIG. 24a, an active area 2401 has been defined using micron or sub-micron scale technology such as photolithography, self-aligned etching, and the like. A first device component 2403 comprises a type of material to which active devices molecules (e.g., porphyrins) will attach in a subsequent chemisorption process. A second device component 2405 comprises a type of material to which active device molecules will not attach.

Figure 24B:
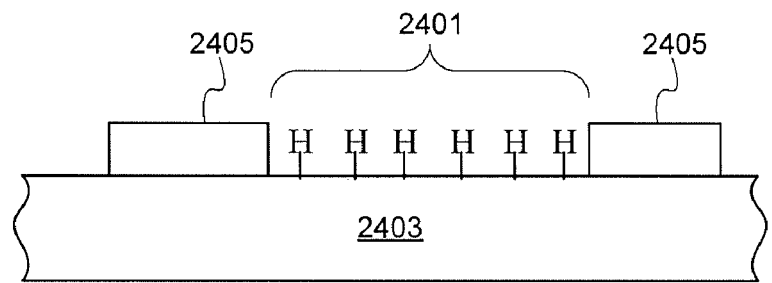

In some embodiments, the active area 2401 includes a plurality of attachment sites that are oxidized to form a thin oxide layer. This oxide layer may be a native oxide formed when the surface of material 2403 is exposed to oxygen. The oxygen atoms bond to the potential attachment sites, which will prevent or inhibit bonding of active device molecules. As shown in FIG. 24b, in some embodiments, the active area 2401 is treated in a passivation process to replace some or all of the oxygen atoms with hydrogen atoms. Passivation might be accomplished by soaking substrates in a hydrogen or forming gas atmosphere at a moderate temperature for a period of time sufficient to displace the oxygen with hydrogen. In other embodiments, the thin oxide layer is maintained and molecules are subsequently attached to the thin oxide layer.

It is significant to note that a typical surface will present a relatively small number of possible attachment sites as compared to the total number of molecules at the surface within the active area 2401. This means that an active area will likely comprise a much larger number of inactive molecules than active device molecules. Accordingly, all of the processes used in the attachment of active device molecules may be optimized to yield high attachment rates and low contamination. Contaminants include any species that interfere with attachment and/or have a non-beneficial behavior in the molecular electronic device.

The passivated surface in FIG. 24b may be activated by exposure to heat, light, radiation, and/or other available surface activation means. The "X" designations in FIG. 24c indicate activated attachment sites. Activation may involve the use of rapid thermal processing techniques used in the semiconductor industry. Activation serves to leave the sites in a state that will readily bond to an active device molecule. Activation may be performed in an inert environment such as ultrapure argon, nitrogen, vacuum and the like. In some cases, activation may be unnecessary as when the active device molecules have sufficient innate attachment strength.

Figure 24C:
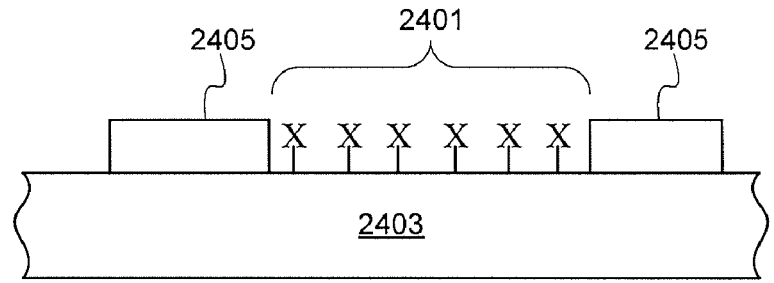
Figure 24D:
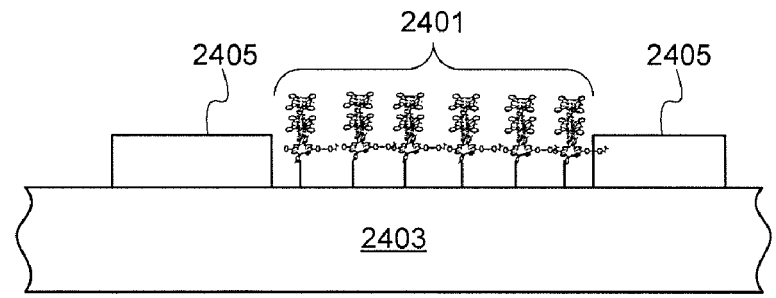

The activated surface of FIG. 24c or the passivated surface of FIG. 24b is coated with a solution containing the active device molecules. In a specific embodiment, the solution comprises alcohol-linked porphyrin molecules that are applied by spin coating, spray coating, vapor phase coating, or a similar process. The active area may be exposed to heat, electromagnetic energy, radiation, or other actinic energy to encourage attachment of the active device molecules.

To inhibit deactivation of the activated surface, the atmosphere of the processing environment before during and after the chemical attachment processes is carefully controlled. Although a conventional photoresist or HMDS (Hexamethyldisilazane) spin coating tool may be used to apply the active device molecule solution, the tool is modified to enclose the workpiece in a low humidity environment that is substantially free of chemical species that would bond to attachment locations. These species include hydrogen, oxygen, most metal atoms, and water, although the particular species that must be filtered will vary in each application in a predictable manner based on the particular active device molecules and materials being used.

Figure 25:
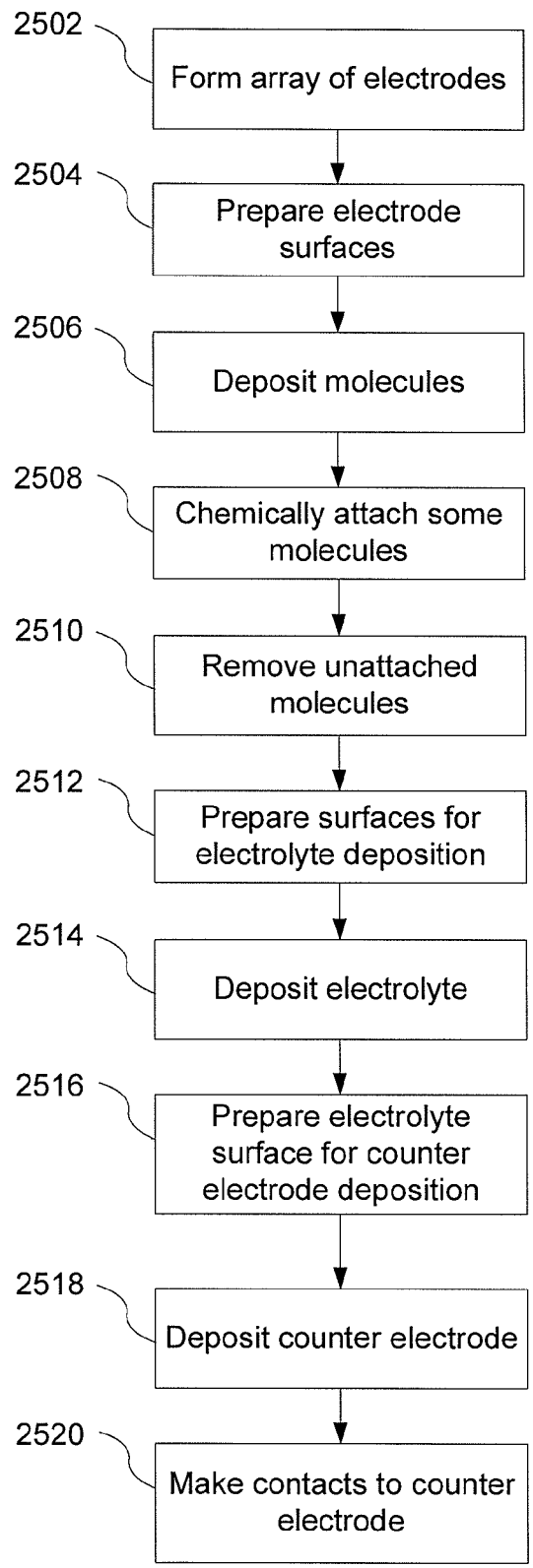
FIG. 25 is a flowchart representing a method of making an array of molecular storage devices in accordance with one embodiment of the present invention.

FIG. 25 is a flowchart representing a method of making an array of molecular storage devices in accordance with one embodiment of the present invention. This method may be used, for example, to make the molecular storage devices shown in FIG. 2.

Conventional BEOL semiconductor processing methods are used to form (2502) an array of working electrodes (e.g., 301) and, in some embodiments, auxiliary counter electrodes (e.g., 303) on a partially processed semiconductor wafer (e.g., a wafer that already has the transistors formed in the substrate and one or more levels of interconnect fabricated). Exemplary working electrode and/or auxiliary counter electrode materials include, without limitation, tungsten, titanium, tantalum, aluminum, doped polycrystalline or nanocrystalline silicon, copper, oxides of the foregoing elements, titanium nitride, tantalum nitride, tungsten nitride, and titanium tungsten. In addition, insulators (e.g., 319) and conductors that make electrical connections to the working electrodes (e.g., 311, 313, and 315) and, in some embodiments, to the auxiliary counter electrodes (e.g., 317) are also prepared using well-known BEOL semiconductor processing methods that need not be described in detail.

In some embodiments, chemical mechanical polishing (CMP) is used to prepare an array of smooth working electrode and auxiliary counter electrode surfaces (e.g., FIG. 3a). In some embodiments, a layer of conductive material (e.g., 321) is deposited, patterned, and etched over the surface containing the working electrodes 301 and auxiliary counter electrodes 303 to create new surfaces for these electrodes that are closer together (e.g., FIG. 3b).

In some embodiments, the electrode surfaces are prepared (2504) for the deposition of active device molecules (e.g., storage molecules). In some embodiments, the partially processed wafer with exposed electrode surfaces is cleaned in a very dilute (0.1%) HF solution for 30 seconds and then successively dipped in acetone, water and isopropyl alcohol rinses. In some embodiments, the electrodes are given a brief sputter etch. In some embodiments, for tungsten electrodes, a thin (~2 nm) layer of tungsten oxide is grown on the electrode surface with an oxygen plasma.

The active device molecules are physically deposited (2506) on the wafer. There are many ways to perform this deposition.

In some embodiments, the molecules are contained in a liquid carrier solvent that is sprayed onto the wafer (e.g., using coater 1603 or a stand alone coater that is enclosed in a controlled processing ambient). The wafer is then heated to evaporate the liquid and leave the molecules on the wafer surface. Exemplary solvents include, without limitation, xylene, cyclohexanone, diglyme, tetrahydrofuran, chlorobenzene, and dichlorobenzene. Heating is typically done between 60 and 120° C., depending on the solvent used. Exemplary processing ambients include vacuum or an inert gas such as argon or nitrogen. In some embodiments, sensors are used to monitor water and oxygen in the processing ambient. An exemplary stand-alone coater is a modified Brewer Science Cee 100 spin coater (www.brewerscience.com/cee/products/cee100.html)) that is contained in an airtight enclosure that includes water and oxygen sensors. During deposition, the ambient water concentration is typically less than 1 ppm and the ambient oxygen concentration is typically less than 1 ppm.

In some embodiments, the molecules are contained in a low boiling point solvent (e.g., xylene, cyclohexanone, diglyme, chlorobenzene, or dichlorobenzene) that is sprayed with an atomizer onto the wafer (e.g., using coater 1603 or a stand alone coater that is enclosed in a controlled processing ambient). The use of an atomizer promotes evaporation of the solvent during deposition so that little or no subsequent heating is needed to remove the solvent. An exemplary atomizer is a Spraying Systems Co. No. 1/8JJAU Air Atomizing Nozzle (e.g., see http://service.spray.com/Literature_PDFs/b553_humidification.pdf). Argon or nitrogen is typically used to produce the aerosol. Control of the processing ambient during aerosol deposition is the same as that described above for spray deposition.

In some embodiments, an ink jet printing technique can be used to deposit the molecules on the wafer. Like the atomizer, the use of a high pressure ink jet of molecule-containing solution promotes evaporation of the solvent during deposition so that little or no subsequent heating is needed to remove the solvent. One advantage of the ink jet technique is that molecule solution can be saved by only applying the solution over the active areas of the chips and not over the entire wafer surface by judicial programming of the ink jet head as it passes over the wafer surface.

In some embodiments, sublimation can be used to deposit the molecules on the wafer without the use of solvents. For example, porphyrin crystals can be heated (typically up to 450° C.) in an inert atmosphere until the molecules sublime and deposit on a nearby wafer surface.

The active device molecules (e.g., 305) are chemically attached (2508) to the electrode surfaces (e.g., 301 and 303).

In some embodiments, thermal processing unit 1700, either alone or as part of an integrated molecular attachment processing tool 1600 is used to chemically attach the molecules. The attachment process is carried out in a controlled environment, typically with as little oxygen and water as possible. In some embodiments, oxygen and water are removed by mild heating (e.g., at less than 150° C.) in an inert atmosphere (e.g., Ar or $N_2$) to remove oxidants prior to raising the temperature to carry out the actual chemistry of attachment. During the mild heating, the ambient water concentration is typically reduced to less than 3 ppm and the ambient oxygen concentration is typically reduced to less than 10 ppm. During the high-temperature heating, the ambient water concentration is typically less than 200 ppm and the ambient oxygen concentration is typically less than 80 ppm. During the cool-down period following high-temperature heating, the ambient water concentration is typically less than 50 ppm and the ambient oxygen concentration is typically less than 40 ppm.

The temperature and time required to chemically attach the molecules to the electrode surface (e.g., as a layer of chemisorbed species) depends on the molecule, the attachment linker, and the surface itself. Table 1 provides exemplary chemical attachment processing conditions for a range of surface and molecules.

TABLE 1

Exemplary chemical attachment processing conditions

| Surface | Molecule | Temperature (° C.) | Time (minutes) |
| --- | --- | --- | --- |
| Silicon <100> | A | 180 | 200 |
| | A | 300 | 60 |
| | A | 350 | 20 |
| | A | 375 | 10 |
| | A | 400 | 6 |
| | A | 425 | 2 |
| | A | 450 | 2 |
| | B | 300 | 60 |
| | B | 350 | 20 |
| | B | 375 | 10 |
| | B | 400 | 6 |
| | B | 425 | 2 |
| | B | 450 | 2 |
| | C | 400 | 2 |

TABLE 1-continued

Exemplary chemical attachment processing conditions

| Surface | Molecule | Temperature (° C.) | Time (minutes) |
|---|---|---|---|
| nanocrystalline Si | A | 350 | 20 |
| | A | 375 | 10 |
| | A | 400 | 6 |
| | A | 425 | 2 |
| | B | 350 | 20 |
| | B | 375 | 10 |
| | B | 400 | 6 |
| | B | 425 | 2 |
| Tungsten | B | 350 | 20 |
| | B | 350 | 10 |
| | B | 350 | 8 |
| | B | 350 | 5 |
| | B | 375 | 10 |
| | B | 400 | 10 |
| | B | 400 | 8 |
| | B | 400 | 4 |
| | B | 400 | 2 |
| | B | 425 | 10 |
| | B | 425 | 8 |
| | B | 425 | 6 |
| | B | 425 | 4 |
| | B | 425 | 2 |
| TiN | B | 350 | 20 |
| | B | 350 | 10 |
| | B | 350 | 8 |
| | B | 350 | 5 |
| | B | 375 | 10 |
| | B | 400 | 10 |
| | B | 400 | 8 |
| | B | 400 | 4 |
| | B | 400 | 2 |
| | B | 425 | 10 |
| | B | 425 | 8 |
| | B | 425 | 6 |
| | B | 425 | 4 |
| | B | 425 | 2 |
| TiW | B | 400 | 4 |
| | B | 400 | 2 |
| | B | 425 | 2 |
| WN | B | 400 | 4 |
| | B | 400 | 2 |
| | B | 425 | 2 |
| Ti | B | 400 | 4 |
| | B | 400 | 2 |
| | B | 425 | 2 |
| Al | B | 400 | 4 |
| | B | 400 | 2 |
| | B | 425 | 2 |
| $SiO_2$ | ferrocene phosphonate | 180 | 200 | where:
molecule A is Zn(II)-5,10,15-trimesityl-20-[4-(hydroxymethyl)phenyl] porphyrin;
molecule B is Zn(II)-5,10,15-tri-p-tolyl-20-[4-(hydroxymethyl)phenyl] porphyrin; and
molecule C is Cu(II)-5,10,15-tri-p-tolyl-20-[4-(hydroxymethyl)phenyl] porphyrin.

Unreacted molecules (e.g., molecules on insulator 319) are removed (2510) by rinsing and drying the wafer. In some embodiments, the rinse is sprayed onto the wafer (e.g., using rinse 1609 or a stand alone rinse that is enclosed in a controlled processing ambient). Exemplary solvents for the rinse include, without limitation, tetrahydrofuran, toluene, and xylene. Rinsing is typically done for 10-60 seconds per rinse for 5-10 rinses. Rinsing is preferably done in an inert ambient (e.g., Ar or N2). An exemplary stand-alone rinse is a modified Brewer Science Cee 100 spin coater that is contained in an airtight enclosure that includes water and oxygen sensors. After rinsing, the wafer may be returned to thermal processing unit 1700 for drying. Drying is typically done at 60° C. for 30 seconds.

In some embodiments, the molecules on the electrode surfaces (e.g., 305) and the other exposed surfaces (e.g., the surface of insulator 319) are prepared (2512) for the deposition of the electrolyte (e.g., 307). In some embodiments, this preparation includes applying adhesion promoters (e.g., AP200, AP225, AP221, AP001, or AP 310 from Silicon Resources, Inc (www.siliconresources.com)). In some embodiments, the wafers are rinsed to remove volatile organic compounds that may have accumulated on the surfaces. This rinse may be needed if there is a significant delay between attaching the molecules 305 and depositing the electrolyte 307.

An electrolyte (e.g., 307) is deposited (2514) on the wafer. There are many ways to perform this deposition.

The electrolyte can be applied by coater 2103 in an integrated electrolyte processing tool 2100 or by a stand-alone coater in a controlled processing ambient (e.g., with less than 1 ppm water and less than 1 ppm oxygen). Various types of coaters can be used, including, without limitation: spin coaters, spray coaters, atomizing coaters, dip coaters, inkjet coaters, doctor blade coaters, curtain coaters, sputter coaters, chemical vapor deposition coaters, and physical vapor deposition coaters. An exemplary stand-alone coater is a Brewer Science Cee 100 spin coater that is contained in an airtight enclosure that includes water and oxygen sensors.

In some embodiments, the electrolyte includes a polymer matrix and an ionic liquid. In some embodiments, the polymer matrix and the ionic liquid are placed in a solvent and the combined solution (which typically contains less than 5% electrolyte) is deposited on the wafer.

After deposition, the wafer is heated (e.g., in thermal processing unit 2107 or in a stand-alone unit 1700) in a controlled environment (e.g., with less than 1 ppm water and less than 1 ppm oxygen) to remove the solvent. A wide variety of heat sources can be used, including, without limitation, a hot plate, an oven, an IR heat lamp (e.g., in the coater), and a microwave oven. Table 2 provides exemplary electrolytes and processing conditions.

TABLE 2

Exemplary electrolyte components and processing conditions

Solvents

Cyclohexanone
Diethyl succinate
4-Methyl-2-pentanone
2-Butanone
Cyclopentanone
N,N-Dimethyl-propionamide-Distilled
N,N-Dimethylacetamide
N,N-Dimethylformamide
Propylene glycol monomethyl ether acetate
g-butyrolactone
g-butyrolactone
Toluene
1,4-Dimethylbenzene (xylene)
1-Methyl-2-pyrrolidinone
methyl THF
chloroform
Propylene carbonate
triethylphosphate
glutaronitrile
bis-2-chloro ethyl ether
Tetrahydrofuran
Tetrahydrofurfuryl Alcohol
Dimethyl succinate Distilled
4-Heptanone
Polymer Matrix Materials

TABLE 2-continued

Exemplary electrolyte components and processing conditions

Poly(vinyl difluoride) (PVDF)
Copolymer of Poly(vinyl difluoride) and
Hexafluoropropylene (PVDF-HFP) in its many
formulations, such as
Arkema Kynar PVDF 741
Arkema Kynar Flex 2801
Arkema Super Flex
Arkema Power Flex
Polyimides such as
Polyesters and copolymers
Polyacrylonitriles and copolymers
Polyalkenes and copolymers
Polyamides
Poly(amide-imides)
Poly(amide-esters)
Polyimides
Polyazomethines
Polybenzoxazoles
Polybenzimidazoles
Polysiloxanes
Polysiloxane copolymers
Poly(methyl silsesquioxanes)
Ionic Liquids 1-butyl-1-methyl-pyrrolidinium bis(trifluromethylsulfonyl) imide (BMPTFMSI)
1-hexyl-3-methyl-imidazolium tris(pentafluroethyl) triflurophosphate (HMIPFETFP)
1-hexyl-3-methyl-imidazolium bis(trifluromethyl sulfonyl)imide (HMITFMSI)
Trihexyl(tetradecyl)-phosphonium tris(pentafluroethyl) triflurophosphate (THTDPPFETFP)
1-butyl-1-methyl-pyrrolidinium tris(pentafluroethyl) triflurophosphate (BMPPFETFP)
Trihexyl(tetradecyl)-phosphonium bis(trifluromethylsulfonyl)imide (THTDPTFMSI)

Formulations

| | |
|---|---|
| ionic liquid to polymer ratio | 80:20 |
| | 70:30 |
| | 60:40 |
| | 50:50 |
| | 40:60 |
| | 30:70 |
| | 20:80 |
| polymer wt % in solvent | 0.50 |
| | 1.00 |
| | 1.50 |
| | 2.00 |
| | 2.50 |
| | 5.00 |

| Deposition Conditions | First RPM | Time (sec) | Second RPM | Time (sec) |
|---|---|---|---|---|
| (Acceleration - 10,000 RPM/sec/sec) | 100 | 30 | 1000 | 30 |
| (First RPM and Second RPM refer to | 100 | 30 | 2000 | 30 |
| two steps done in sequence. In some | 100 | 30 | 3000 | 30 |
| cases, just one RPM is used.) | 100 | 30 | 4000 | 30 |
| | 100 | 30 | 1000 | 60 |
| | 100 | 30 | 2000 | 60 |
| | 100 | 30 | 3000 | 60 |
| | 100 | 30 | 4000 | 60 |
| | 1000 | 30 | | |
| | 2000 | 30 | | |
| | 3000 | 30 | | |
| | 4000 | 30 | | |
| | 1000 | 60 | | |
| | 2000 | 60 | | |
| | 3000 | 60 | | |
| | 4000 | 60 | | |

| Post-Deposition Heat Treatment | temp (° C.) | time (min) |
|---|---|---|
| | 25 | 1080 |
| | 25 | 300 |
| | 25 | 120 |
| | 60 | 10 |
| | 60 | 5 |
| | 60 | 3 |
| | 70 | 10 |
| | 70 | 5 |
| | 70 | 3 |
| | 70 | 2 |
| | 85 | 10 |
| | 85 | 5 |
| | 85 | 2 |
| | 90 | 5 |
| | 90 | 3 |
| | 90 | 2 |
| | 100 | 5 |
| | 100 | 3 |
| | 100 | 2 |
| | 100 | 1 |
| | 110 | 3 |
| | 110 | 2 |
| | 110 | 1 |
| | 120 | 2 |
| | 120 | 1 |

In some embodiments, the electrolyte (e.g., 307) is prepared (2516) for the deposition of the counter electrode (e.g., 309). In some embodiments, this preparation includes applying adhesion promoters (e.g., AP200, AP225, AP221, AP001, or AP 310 from Silicon Resources, Inc (www.siliconresources.com)). In some embodiments, the wafers are rinsed to remove volatile organic compounds that may have accumulated on the surfaces. In some embodiments, the electrolyte is given a sputter clean. Preparation of the electrolyte surface may be needed if there is a significant delay between depositing the electrolyte and depositing the counter electrode.

A counter electrode (e.g., 309) is deposited (2518) on the wafer. Materials that can be used as counter electrodes include, without limitation, silver, copper, titanium, tantalum, aluminum, tungsten, titanium nitride, titanium tungsten, tantalum nitride, and conductive oxides such as indium tin oxide.

Many techniques can be used to deposit the counter electrode, including, without limitation, physical vapor deposition (sputtering), chemical vapor deposition, plasma-enhanced chemical vapor deposition, and thermal or electron beam evaporation. However, whichever deposition technique is used, the amount of radiation and other energy incident on the wafer should be reduced, particularly ultraviolet radiation. Such radiation may be strongly absorbed by the storage molecules, which, in turn, may induce unwanted reactions and/or decomposition of the molecules. Deposition techniques like sputtering and plasma-enhanced CVD generate radiation at the excitation wavelengths of the carrier gas molecules used to support the plasma. These wavelengths are specific to the gas used, and each gas (e.g., Ar, Kr, Xe, and He) has a distinct spectrum. These deposition techniques typically use Ar as the carrier gas. When ionized, Ar emits ultraviolet radiation at wavelengths that can damage the molecules. One way to reduce or eliminate this damaging radiation is to use other gases, such as xenon, that emit radiation at wavelengths that are not as strongly absorbed by the molecules. The amount of potentially harmful energy deposited on the wafer during deposition can also be reduced by: protecting the wafer(s) with a shutter when the sputtering targets are being cleaned with a plasma; using low deposition rates; and cooling the wafers.

Conventional, well-known BEOL semiconductor processing methods are used to make contacts to the counter electrodes (2520), encapsulate the molecular storage devices (and other components), and otherwise complete the fabrication of the molecular memory.

Figure 26:
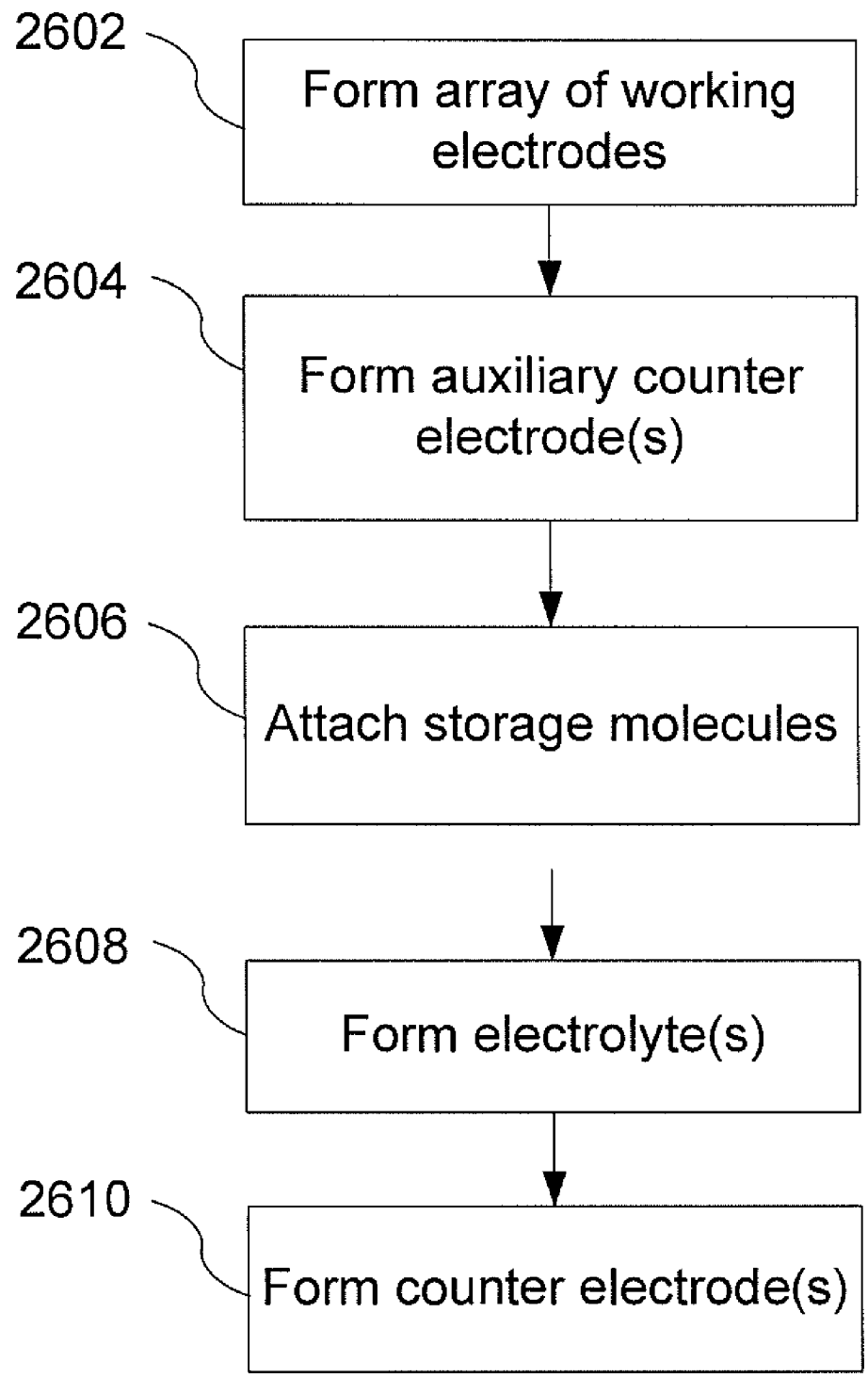
FIG. 26 is a flowchart representing a method of making molecular storage devices with auxiliary counter electrodes in accordance with one embodiment of the present invention.

FIG. 26 is a flowchart and FIGS. 27a-27i are schematic cross sections illustrating a method of making molecular storage devices with auxiliary counter electrodes in accordance with one embodiment of the present invention. Processing steps analogous to those already described will not be described in detail again here.

Figures 27A, 27B, 27C:
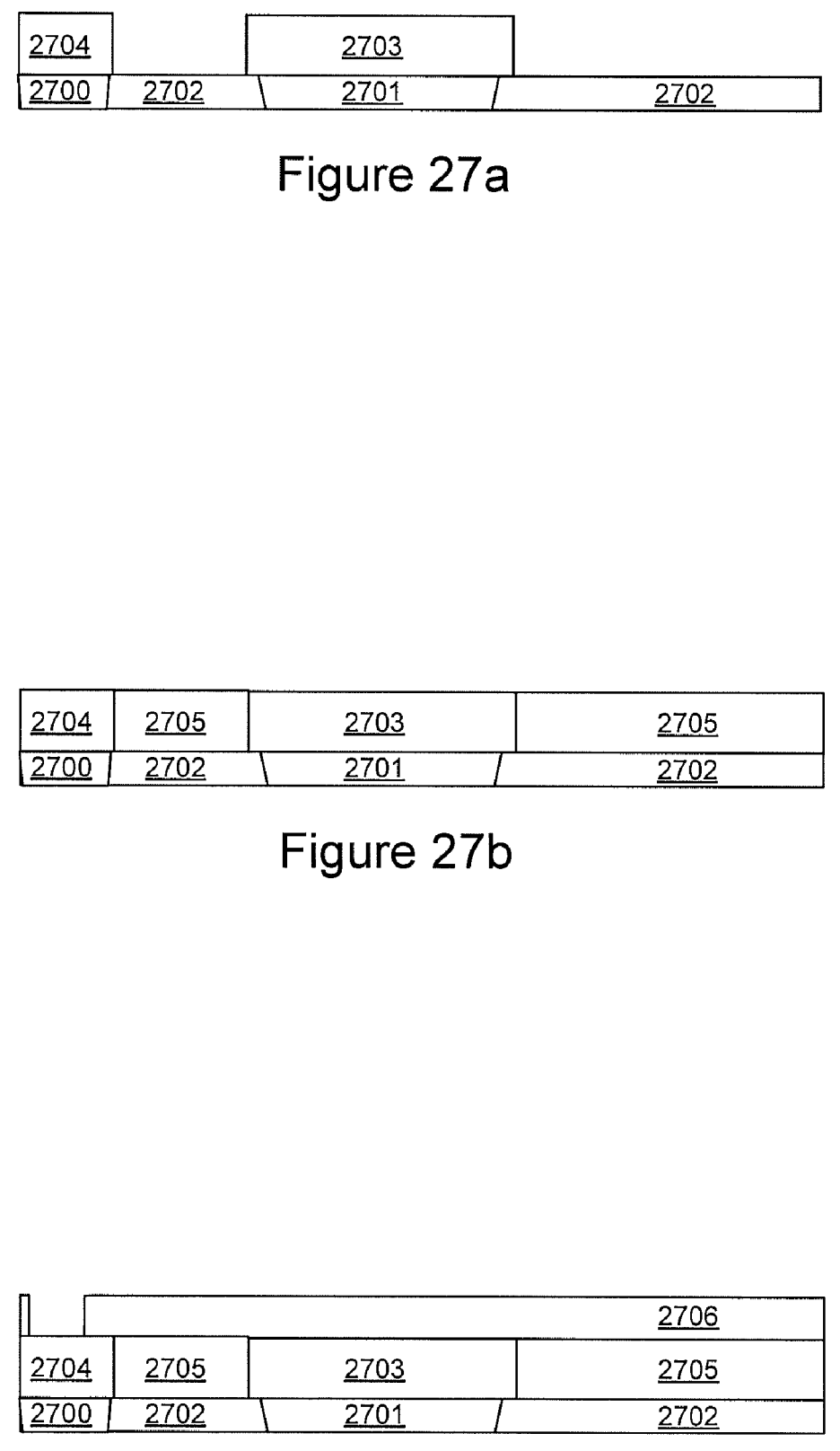

Working electrode 2703 is formed (2602) over conductive vias and/or plugs 2701 that reach down through passivation and planarization layers (e.g., 2702) to make electrical contact with an access transistor (803) or other active device. In some embodiments, the working electrode 2703 is formed by depositing, patterning and etching a conductive film over the plugs 2701 and 2700 and insulating layers 2702, which have been previously made by conventional BEOL processing (FIG. 27a). A portion 2704 of the conductive film can also be used to make an electrical connection for biasing the auxiliary counter electrode 2707 (not present in FIG. 27a).

An insulating layer 2705 (e.g., SiO2) is deposited and planarized to the top surface of the working electrode 2703 (e.g., by chemical mechanical polishing) (FIG. 27b).

An insulating layer 2706 (e.g., SiO2) is deposited (FIG. 27c). Contact holes that will connect the auxiliary counter electrode to underlying interconnect layers (e.g., 2704) are patterned and etched in insulating layer 2706.

Figure 27D:
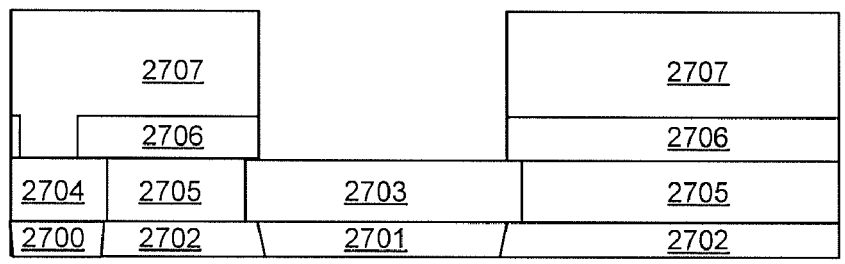

Auxiliary counter electrode 2707 is formed (2604). In some embodiments, the auxiliary counter electrode is made by depositing a conducting film over insulating layer 2706, then patterning and etching a hole through both the conducting film 2707 and the insulator 2706, thereby exposing the surface of the working electrode 2703 (FIG. 27d). The auxiliary counter electrode makes electrical contact with interconnect layer 2704 through a hole in insulator 2706.

Figure 27E:
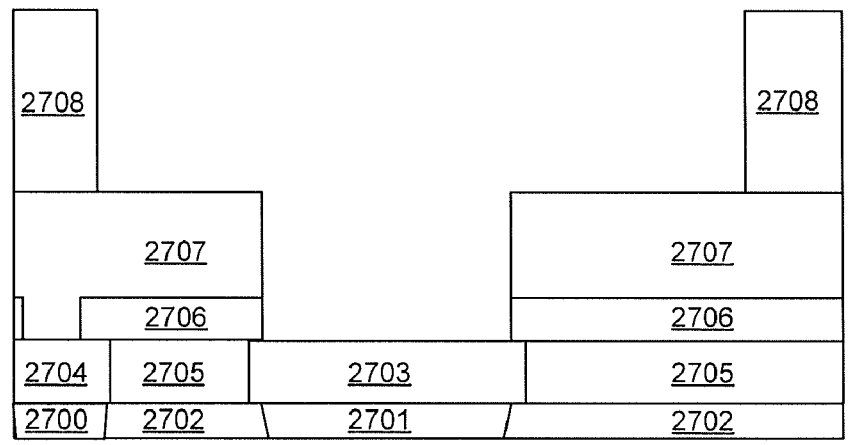

A well to hold the electrolyte 2710 is made by depositing, patterning, and etching an insulating layer (e.g., SiO$_2$) 2708 (FIG. 27e).

Figure 27F:
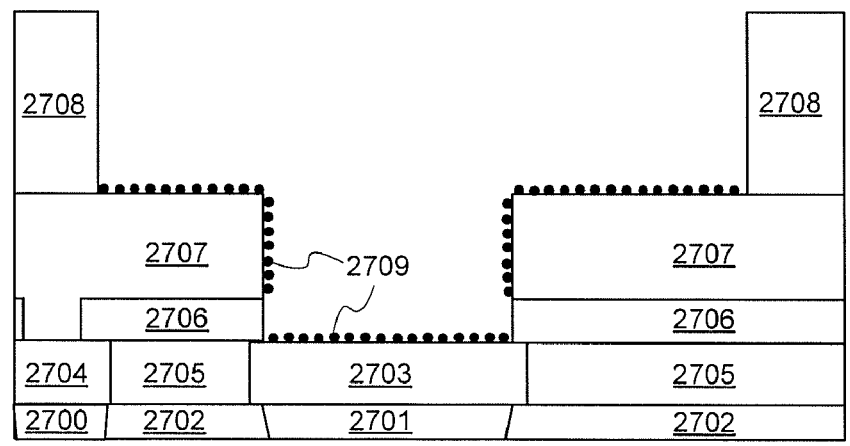
Figure 27G:
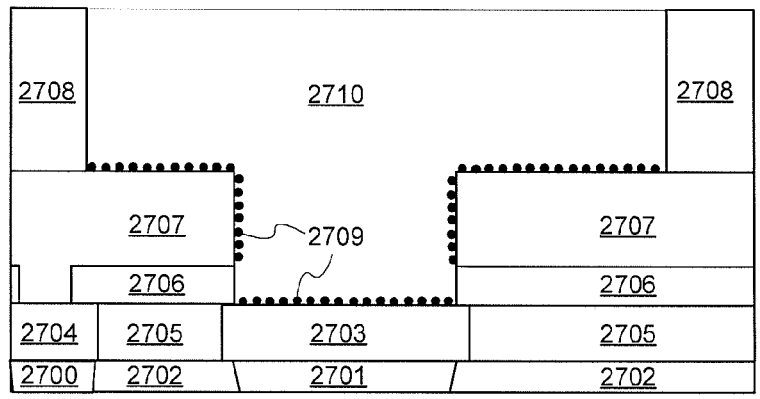
Figure 27H:
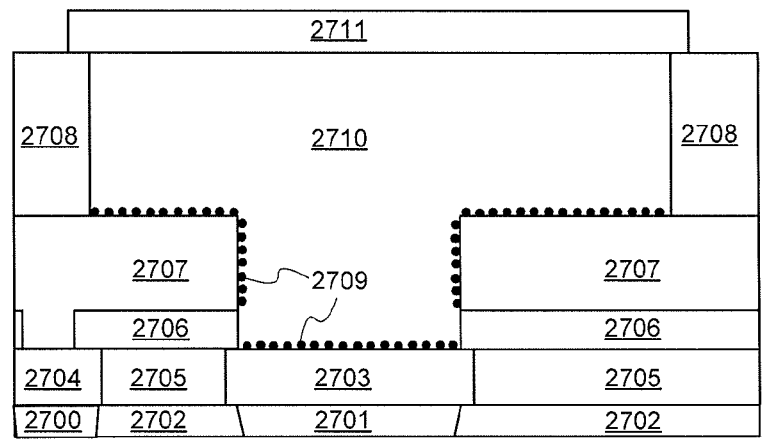
Figure 27I:
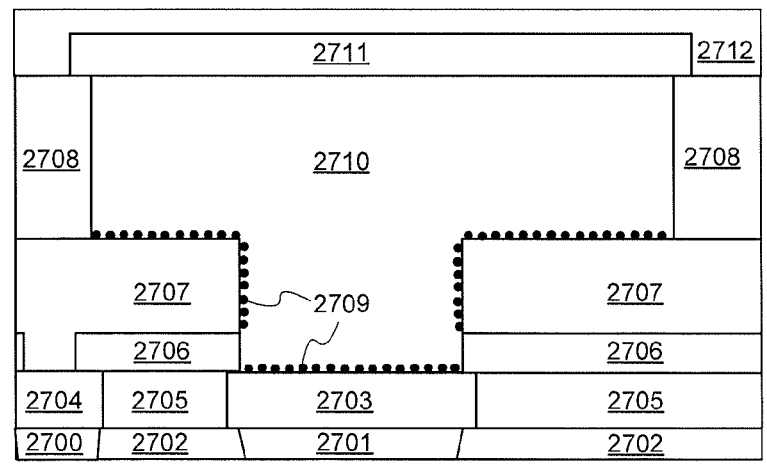

Redox-active molecules 2709 are deposited and chemically attached (2606) to the working electrode 2703 and the auxiliary counter electrode 2707, thereby electrically coupling the molecules 2709 to the electrodes (FIG. 27f). In some embodiments, a selective chemisorption process is used to attach the molecules 2709 to the working electrode 2703 and the auxiliary counter electrode 2707. In some embodiments, the molecules 2709 form one or more layers of chemisorbed species on the working electrode 2703 and the auxiliary counter electrode 2707. In some embodiments, the molecules 2709 form SAMs on the working electrode 2703 and the auxiliary counter electrode 2707. In some embodiments, the molecules 2709 electrically coupled to the working electrode 2703 are the same as the molecules 2709 electrically coupled to the auxiliary counter electrode 2707. In some embodiments, the molecules 2709 electrically coupled to the working electrode 2703 are different from the molecules 2709 electrically coupled to the auxiliary counter electrode 2707.

An electrolyte 2710 is formed (2608) (FIG. 27g), for example, by depositing and planarizing a layer containing an ionic conductor.

A counter electrode 2711 is formed (2610) (FIG. 27h), for example, by depositing, patterning, and etching a conducting layer on top of electrolyte 2710.

A layer 2712 of polymer or insulator is deposited to seal the molecular storage devices. This sealing layer can be patterned and etched to make contacts to the molecular storage devices as needed (e.g., to make electrical contacts to the counter electrodes 2711).

Molecules

There are a wide variety of suitable storage molecules for use in the present invention that are based on redox active moieties or redox active molecules. By "redox active moiety" or "redox active molecule" or "ReAM" herein is meant a moiety that is capable of being oxidized or reduced by the application of a suitable voltage.

In some embodiments, the redox active moiety has at least two or more distinguishable non-neutral oxidation states, with at least 3, 4, 5, 6, 7, 8 or higher oxidation states being useful, particularly in storing multiple bits per molecule. In some embodiments, particularly when mixtures of different ReAMs are used at each storage location, the individual ReAMs may have only a single non-neutral oxidation state, but the collection of different moieties at each location provides the multiple oxidation states for the storage density. Furthermore, in the case of ReAM polymers, the use of heteropolymers of different monomers with fewer oxidation states can also result in a plurality of oxidation states.

Alternatively, in some embodiments, storage devices with high charge densities are useful, in which multiple charges (e.g., electrons) are read at the same voltage; for example, the oxidation of the storage molecule at a particular voltage may result in the loss of 2 or 3 electrons instead of one. Thus ReAMs can be designed to have fewer oxidation states but give up more electrons at each state, leading to higher charge density on the surface.

In general, as described below, there are several types of ReAMs useful in the present invention based on polydentate proligands, including macrocyclic and non-macrocyclic moieties. A number of suitable proligands and complexes, as well as suitable substituents, are outlined in U.S. Pat. Nos. 6,212, 093; 6,728,129; 6,451,942; 6,777,516; 6,381,169; 6,208,553; 6,657,884; 6,272,038; 6,484,394; and U.S. Ser. Nos. 10/040, 059; 10/682,868; 10/445,977; 10/834,630; 10/135,220; 10/723,315; 10/456,321; 10/376,865; all of which are expressly incorporated by reference, in particular for the structures and descriptions thereof depicted therein.

Suitable proligands fall into two categories: ligands which use nitrogen, oxygen, sulfur, carbon or phosphorus atoms (depending on the metal ion) as the coordination atoms (generally referred to in the literature as sigma ($\sigma$) donors) and organometallic ligands such as metallocene ligands (generally referred to in the literature as pi ($\pi$) donors, and depicted herein as Lm).

Figure 29A:
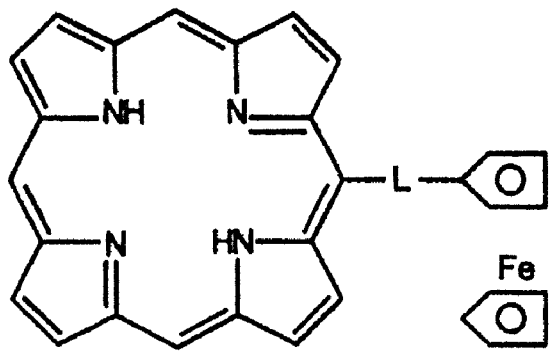
FIGS. 29a, 29b and 29c depict various redox-active molecules.
Figure 29B:
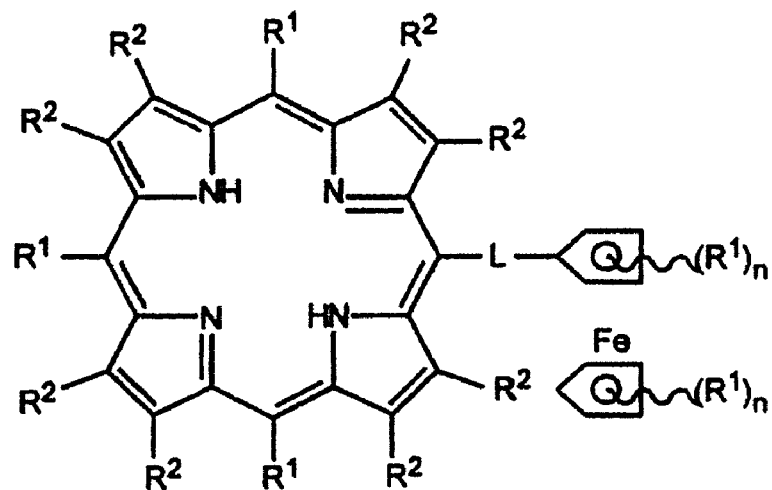
Figure 29C:
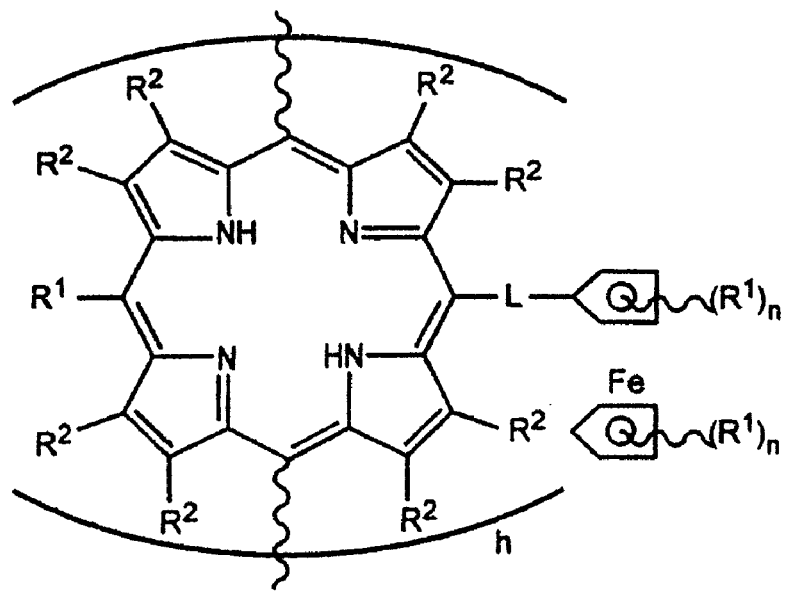

In addition, a single ReAM may have two or more redox active subunits. For example, as shown in FIG. 29A, there are two redox active subunits, a porphyrin (shown in FIG. 29 in the absence of a metal) and a ferrocene (both of which can be optionally substituted with independently selected substituents at any position, as described below and depicted in FIG. 29B), usually, but optionally, attached via a linker, L. Similarly, sandwich coordination compounds are considered a single ReAM. This is to be distinguished from the case where these ReAMs are polymerized as monomers; for example, FIG. 29C depicts a polymerized version of FIG. 29B, wherein h is an integer of 2 or more. In addition, the metal ions/complexes of the invention may be associated with a counterion, not generally depicted herein.

Macrocyclic Ligands

In one embodiment, the ReAM is a macrocyclic ligand, which includes both macrocyclic proligands and macrocyclic complexes. By "macrocyclic proligand" herein is meant a cyclic compound which contain donor atoms (sometimes referred to herein as "coordination atoms") oriented so that they can bind to a metal ion and which are large enough to encircle the metal atom. In general, the donor atoms are heteroatoms including, but not limited to, nitrogen, oxygen and sulfur, with the former being preferred. However, as will be appreciated by those in the art, different metal ions bind preferentially to different heteroatoms, and thus the heteroatoms used can depend on the desired metal ion. In addition, in some embodiments, a single macrocycle can contain heteroatoms of different types.

A "macrocyclic complex" is a macrocyclic proligand with at least one metal ion; in some embodiments the macrocyclic complex comprises a single metal ion, although as described below, polynucleate complexes, including polynucleate macrocyclic complexes, are also contemplated.

A wide variety of macrocyclic ligands find use in the present invention, including those that are electronically conjugated and those that may not be; however, the macrocyclic ligands of the invention preferably have at least one, and preferably two or more oxidation states, with 4, 6 and 8 oxidation states being of particular significance.

Figure 31:
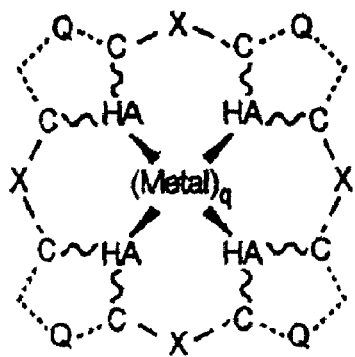
FIG. 31 depicts a broad macrocyclic ligand (e.g., the proligand (when q is 0) or the complex (when q is 1).
Figure 32A:
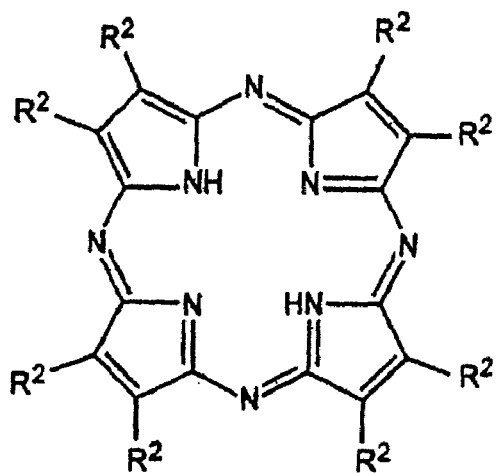
FIGS. 32a, 32b and 32c depict various redox-active molecules. These structures utilize nitrogen as the heteroatom coordination atom, although alternative heteroatoms (particularly oxygen and sulfur) can be used (although the valency of the macrocycle may alter, as will be appreciated by those in the art).
Figure 32B:
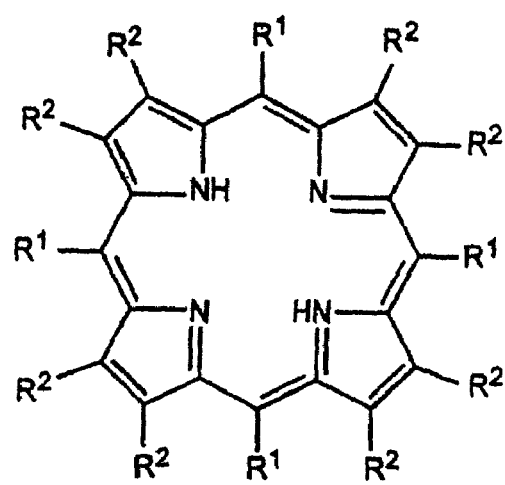
Figure 32C:
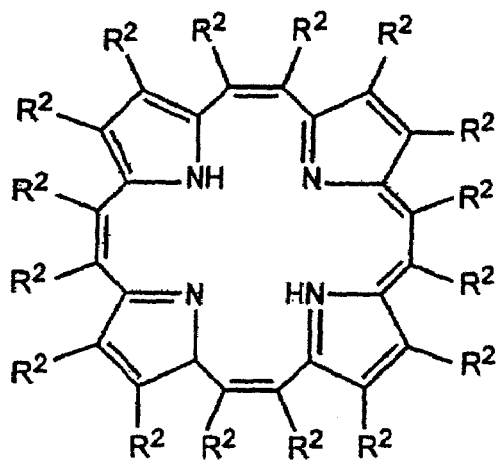
Figure 33A:
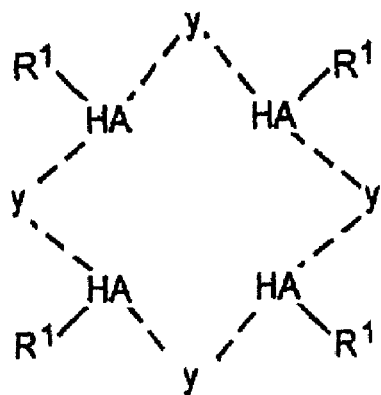
FIGS. 33a-33i depict macrocyclic proligands based on cyclen derivatives; the metal ions are not shown, and it will be appreciated that there may be additional hydrogen atoms not depicted as a result. The derivatives may be 12, 13, 14, 15 or 16 membered rings, depending the number of skeletal atoms in the —Y-structure, and the additional skeletal atoms may be carbon or a heteroatom.
Figure 33B:
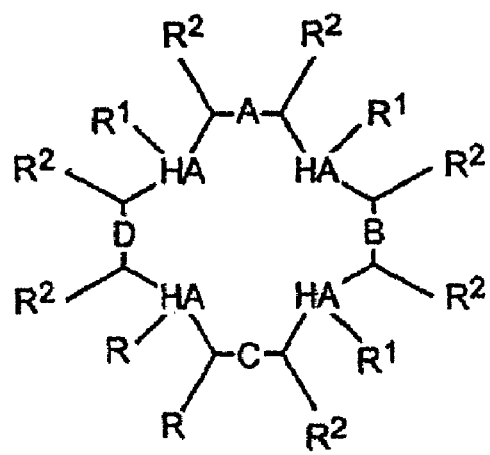
Figure 33C:
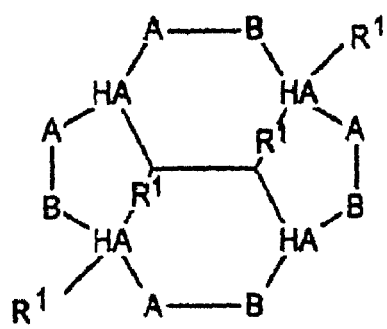
Figure 33D:
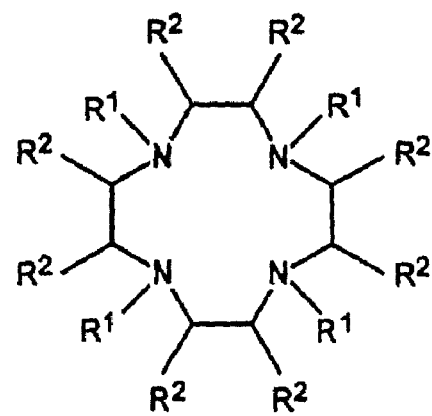
Figure 33E:
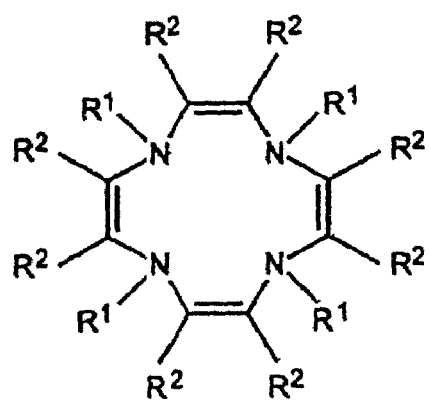
Figure 33F:
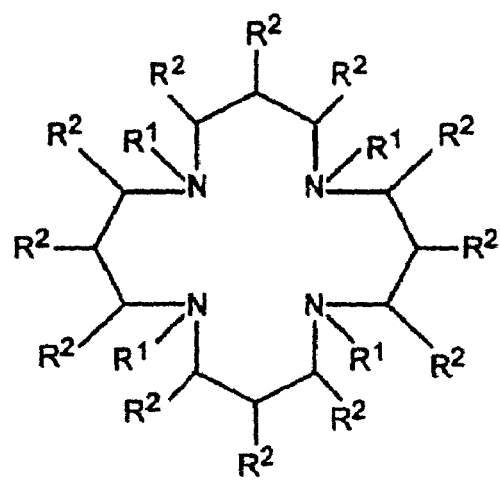
Figure 33G:
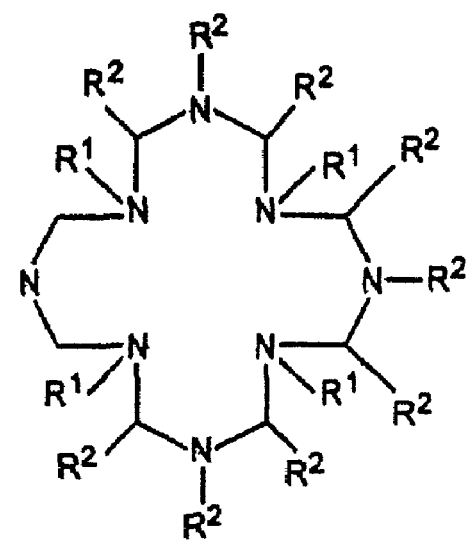
Figure 33H:
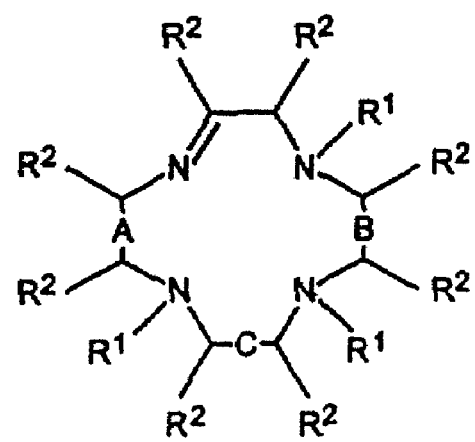
Figure 33I:
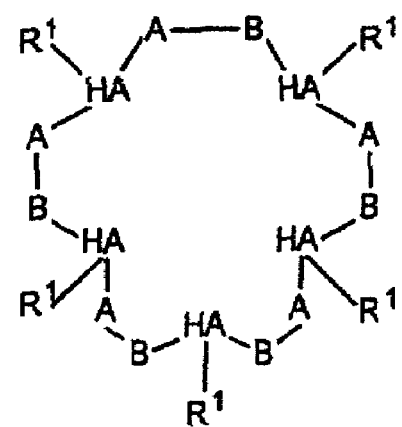

A broad schematic of a suitable macrocyclic ligand is shown and described in FIG. 31. In this embodiment, roughly based on porphyrins, a 16 member ring (when the —X— moiety contains a single atom, either carbon or a heteroatom), 17 membered rings (where one of the —X-moieties contains two skeletal atoms), 18 membered rings (where two of the —X-moieties contains two skeletal atoms), 19 membered rings (where three of the —X-moieties contains two skeletal atoms) or 20 membered rings (where all four of the —X-moieties contains two skeletal atoms), are all contemplated. Each —X-group is independently selected. The ••••Q•••• moiety, together with the skeletal —C-heteroatom-C (with either single or double bonds independently connecting the carbons and heteroatom) for 5 or 6 membered rings that are optionally substituted with 1 or 2 (in the case of 5 membered rings) or 1, 2, or 3 (in the case of 6 membered rings) with independently selected R2 groups. In some embodiments, the rings, bonds and substitutents are chosen to result in the compound being electronically conjugated, and at a minimum to have at least two oxidation states.

In some embodiments, the macrocyclic ligands are selected from the group consisting of porphyrins (particularly porphyrin derivatives as defined below), and cyclen derivatives.

Porphyrins

A particularly preferred subset of macrocycles suitable in the invention are porphyrins, including porphyrin derivatives. Such derivatives include porphyrins with extra rings ortho-fused, or ortho-perifused, to the porphyrin nucleus, porphyrins having a replacement of one or more carbon atoms of the porphyrin ring by an atom of another element (skeletal replacement), derivatives having a replacement of a nitrogen atom of the porphyrin ring by an atom of another element (skeletal replacement of nitrogen), derivatives having substituents other than hydrogen located at the peripheral (meso-, (3- or core atoms of the porphyrin, derivatives with saturation of one or more bonds of the porphyrin (hydroporphyrins, e.g., chlorins, bacteriochlorins, isobacteriochlorins, decahydroporphyrins, corphins, pyrrocorphins, etc.), derivatives having one or more atoms, including pyrrolic and pyrromethenyl units, inserted in the porphyrin ring (expanded porphyrins), derivatives having one or more groups removed from the porphyrin ring (contracted porphyrins, e.g., corrin, corrole) and combinations of the foregoing derivatives (e.g., phthalocyanines, sub-phthalocyanines, and porphyrin isomers). Additional suitable porphyrin derivatives include, but are not limited to the chlorophyll group, including etiophyllin, pyrroporphyrin, rhodoporphyrin, phylloporphyrin, phylloerythrin, chlorophyll a and b, as well as the hemoglobin group, including deuteroporphyrin, deuterohemin, hemin, hematin, protoporphyrin, mesohemin, hematoporphyrin mesoporphyrin, coproporphyrin, uruporphyrin and turacin, and the series of tetraarylazadipyrromethines.

As is true for the compounds outlined herein, and as will be appreciated by those in the art, each unsaturated position, whether carbon or heteroatom, can include one or more substitution groups as defined herein, depending on the desired valency of the system.

Figure 28A:
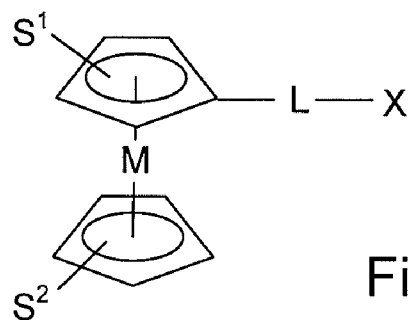
FIGS. 28a through 28h show, respectively, the formula for a redox-active molecule as a metallocene in FIG. 28a, particular embodiments thereof in the form of ferrocenes in FIGS. 28b through 28g, and a porphyrin in FIG. 28h.
Figure 28B:
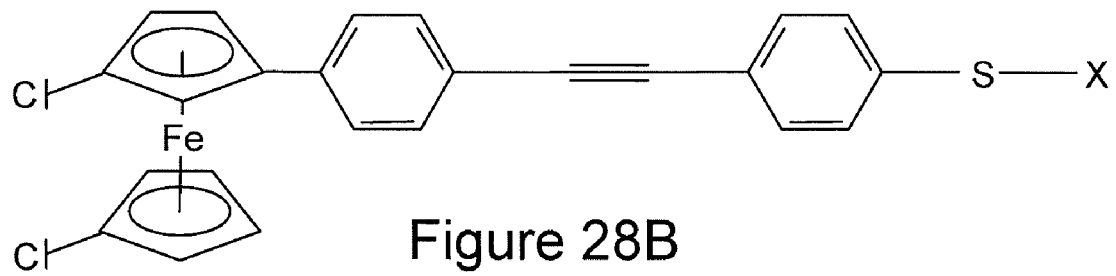
Figure 28C:
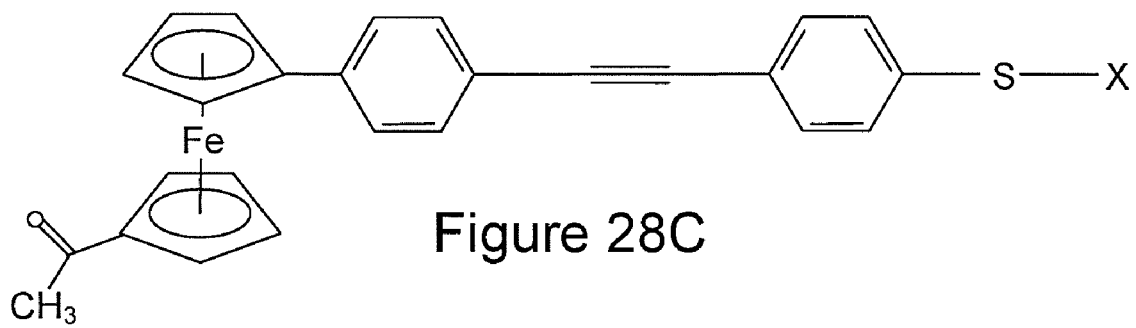
Figure 28D:
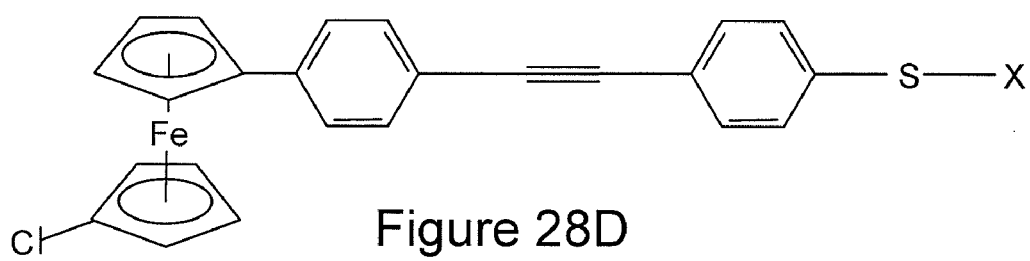
Figure 28E:
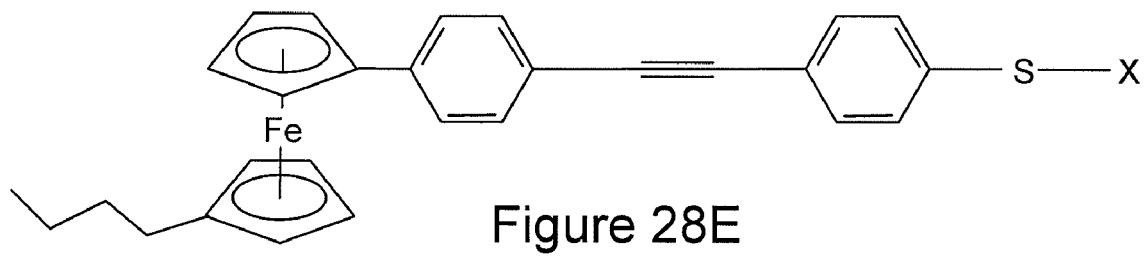
Figure 28F:
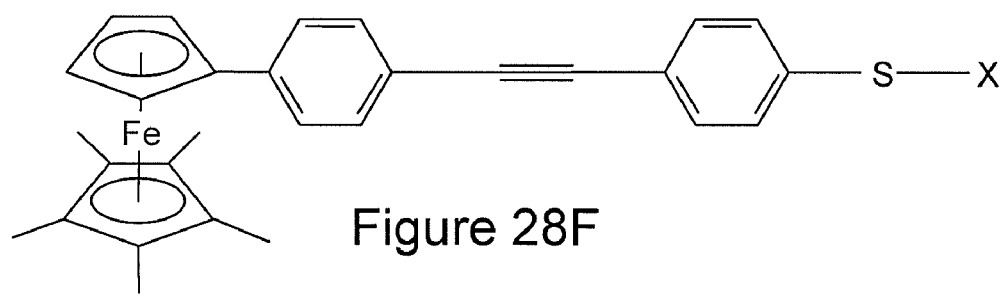
Figure 28G:
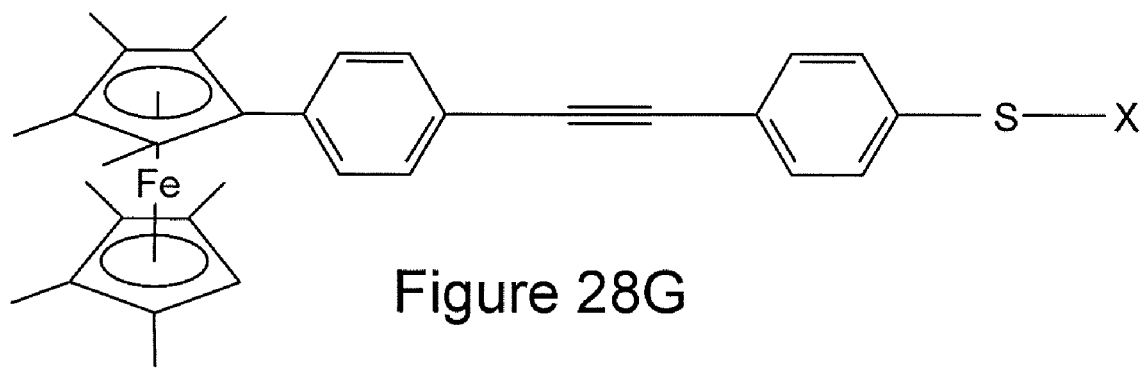

In one preferred embodiment, the redox-active molecule may be a metallocene as shown in the formula of FIG. 28A where L is a linker, M is a metal (e.g., Fe, Ru, Os, Co, Ni, Ti, Nb, Mn, Re, V, Cr, W), $S^1$ and $S^2$ are substituents independently selected from the group consisting of aryl, phenyl, cycloalkyl, alkyl, halogen, alkoxy, alkylthio, perfluoroalkyl, perfluoroaryl, pyridyl, cyano, thiocyanato, nitro, amino, alkylamino, acyl, sulfoxyl, sulfonyl, imido, amido, and carbamoyl.

In preferred embodiments, a substituted aryl group is attached to the porphyrin, and the substituents on the aryl group are selected from the group consisting of aryl, phenyl, cycloalkyl, alkyl, halogen, alkoxy, alkylthio, perfluoroalkyl, perfluoroaryl, pyridyl, cyano, thiocyanato, nitro, amino, alkylamino, acyl, sulfoxyl, sulfonyl, imido, amido, and carbamoyl.

Particularly preferred substituents include, but are not limited to, 4-chlorophenyl, 3-acetamidophenyl, 2,4-dichloro-4-trifluoromethyl, as well as substituents depicted in U.S. Pat. Nos. 6,208,553, 6,381,169, 6,657,884, 6,324,091, 6,272,038, 6,212,093, 6,451,942, 6,777,516, 6,642,376, 6,728,129 and 6,855,417, incorporated herein in their entirety, and in particular for the substitutents and compounds depicted. Preferred substituents provide a redox potential range of less than about 2 volts. X is selected from the group consisting of a substrate, a reactive site that can covalently couple to a substrate (e.g. an alcohol, a thiol, etc.). It will be appreciated that in some embodiments, L-X may be an alcohol or a thiol. L-X preferably is 4-hydroxyphenyl, 4-(2-(4-hydroxyphenyl)ethynyl)phenyl, 4-hydroxymethyl)phenyl, 4-mercaptophenyl, 4-(2-(4-mercaptophenyl)ethynyl)phenyl, 4-(mercaptomethyl)phenyl, 4-hydroselenophenyl, 4-(2-(4-hydroselenophenyl)ethynyl)phenyl, 4-(hydroselenylmethyl)phenyl, 4-hydrotellurophenyl, 4-(2-(4-hydrotellurophenyl)ethynyl)phenyl, and 4-(hydrotelluromethyl)phenyl.

The oxidation state of molecules of the formula of FIG. 28A is determined by the metal and the substituents. Thus, particular preferred embodiments are illustrated by the formulae of FIGS. 28B-28G.

The ferrocenes listed above in the formulae of these figures provide a convenient series of one-bit molecules having different and distinguishable oxidation states. Thus the molecules of these formulae have oxidation states of +0.55 V, +0.48V, +0.39 V, +0.17 V, −0.05 V, and −0.18 V, respectively, and provide a convenient series of molecules for incorporation into a storage medium of this invention. It will be appreciated that the oxidation potentials of the members of the series can be routinely altered by changing the metal (M) or the substituents.

Figure 28H:
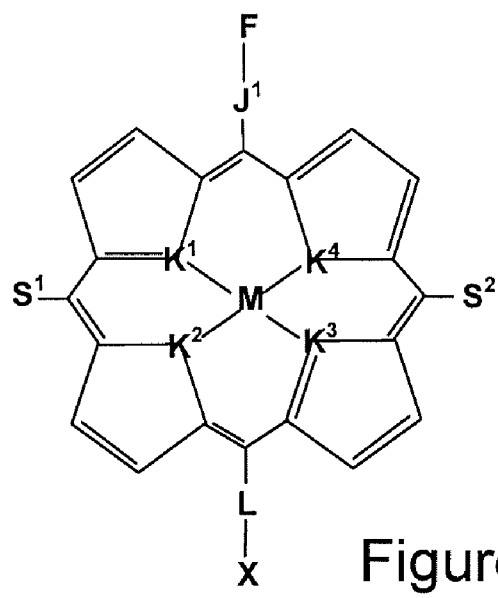

Another preferred redox-active molecule is a porphyrin illustrated by the formula of FIG. 28H where, F is a redox-active subunit (e.g., a ferrocene, a substituted ferrocene, a metalloporphyrin, or a metallochlorin, etc.), J1 is a linker, M is a metal (e.g., Zn, Mg, Cd, Hg, Cu, Ag, Au, Ni, Pd, Pt, Co, Rh, Ir, Mn, B, Al, Ga, Pb, and Sn), S1 and S2 are independently selected from the group consisting of aryl, phenyl, cycloalkyl, alkyl, halogen, alkoxy, alkylthio, perfluoroalkyl, perfluoroaryl, pyridyl, cyano, thiocyanato, nitro, amino, alkylamino, acyl, sulfoxyl, sulfonyl, imido, amido, and carbamoyl wherein said substituents provide a redox potential range of less than about 2 volts, K1, K2, K3, and K4 are independently selected from the group consisting of N, O, S, Se, and Te; L is a linker; X is selected from the group consisting of a substrate, a reactive site that can covalently couple to a substrate, and a reactive site that can ionically couple to a substrate. In preferred embodiments, X or L-X may be an alcohol or a thiol. In some embodiments L-X can be eliminated and replaced with a substituent independently selected from the same group as S1 or S2.

Control over the hole-storage and hole-hopping properties of the redox-active units of the redox-active molecules used in the memory devices of the present invention allows fine control over the architecture of the memory device.

Such control is exercised through synthetic design. The hole-storage properties depend on the oxidation potential of the redox-active units or subunits that are used to assemble the storage media. The hole-storage properties and redox potential can be tuned with precision by choice of base molecule(s), associated metals and peripheral substituents (Yang et al. (1999) J. Porphyrins Phthalocyanines, 3: 117-147), the disclosure of which is herein incorporated by this reference.

For example, in the case of porphyrins, Mg porphyrins are more easily oxidized than Zn porphyrins, and electron withdrawing or electron releasing aryl groups can modulate the oxidation properties. Hole-hopping occurs among isoenergetic porphyrins in a nanostructure and is mediated via the covalent linker joining the porphyrins (Seth et al. (1994) J. Am. Chem. Soc., 116: 10578-10592, Seth et al (1996) J. Am. Chem. Soc., 118: 11194-11207, Strachan et al. (1997) J. Am. Chem. Soc., 119: 11191-11201; Li et al. (1997) J. Mater. Chem., 7: 1245-1262, Strachan et al. (1998) Inorg. Chem., 37: 1191-1201, Yang et al. (1999) J. Am. Chem. Soc., 121: 4008-4018), the disclosures of which are herein specifically incorporated by this reference in their entirety.

The design of compounds with predicted redox potentials is well known to those of ordinary skill in the art. In general, the oxidation potentials of redox-active units or subunits are well known to those of skill in the art and can be looked up (see, e.g., Handbook of Electrochemistry of the Elements; Porphyrin Handbook). Moreover, in general, the effects of various substituents on the redox potentials of a molecule are generally additive. Thus, a theoretical oxidation potential can be readily predicted for any potential data storage molecule. The actual oxidation potential, particularly the oxidation potential of the information storage molecule(s) or the information storage medium can be measured according to standard methods. Typically the oxidation potential is predicted by comparison of the experimentally determined oxidation potential of a base molecule and that of a base molecule bearing one substituent in order to determine the shift in potential due to that particular substituent. The sum of such substituent-dependent potential shifts for the respective substituents then gives the predicted oxidation potential.

The suitability of particular redox-active molecules for use in the methods of this invention can readily be determined. The molecule(s) of interest are coupled to a surface (e.g., a hydrogen passivated surface) according to the methods of this invention. Then sinusoidal voltammetry can be performed (e.g., as described herein or in U.S. Pat. Nos. 6,272,038; 6,212,093; and 6,208,553, PCT Publication WO 01/03126, or by (Roth et al. (2000) Vac. Sci. Technol. B18:2359-2364; Roth et al. (2003) J. Am. Chem. Soc. 125:505-617) to evaluate 1) whether or not the molecule(s) coupled to the surface, 2) the degree of coverage (coupling); 3) whether or not the molecule(s) are degraded during the coupling procedure, and 4) the stability of the molecule(s) to multiple read/write operations.

In addition, included within the definition of "porphyrin" are porphyrin complexes, which comprise the porphyrin proligand and at least one metal ion. Suitable metals for the porphyrin compounds will depend on the heteroatoms used as coordination atoms, but in general are selected from transition metal ions. The term "transition metals" as used herein typically refers to the 38 elements in groups 3 through 12 of the periodic table. Typically transition metals are characterized by the fact that their valence electrons, or the electrons they use to combine with other elements, are present in more than one shell and consequently often exhibit several common oxidation states. In certain embodiments, the transition metals of this invention include, but are not limited to one or more of scandium, titanium, vanadium, chromium, manganese, iron, cobalt, nickel, copper, zinc, yttrium, zirconium, niobium, molybdenum, technetium, ruthenium, rhodium, palladium, silver, cadmium, hafnium, tantalum, tungsten, rhenium, osmium, iridium, platinum, gold, mercury, and/or rutherfordium.

Other Macrocycles

There are also a number of macrocycles based on cyclen derivatives. FIG. 33 depicts a number of macrocyclic proligands loosely based on cyclen/cyclam derivatives, which can include skeletal expansion by the inclusion of independently selected carbons or heteroatoms. In some embodiments, at least one R group is a redox active subunit, preferably electronically conjugated to the metal. In some embodiments, including when at least one R group is a redox active subunit, two or more neighboring R2 groups form cyclo or an aryl group.

Furthermore, in some embodiments, macrocyclic complexes relying organometallic ligands are used. In addition to purely organic compounds for use as redox moieties, and various transition metal coordination complexes with δ-bonded organic ligand with donor atoms as heterocyclic or exocyclic substituents, there is available a wide variety of transition metal organometallic compounds with π-bonded organic ligands (see Advanced Inorganic Chemistry, 5th Ed., Cotton & Wilkinson, John Wiley & Sons, 1988, chapter 26; Organometallics, A Concise Introduction, Elschenbroich et al., 2nd Ed., 1992, VCH; and Comprehensive Organometallic Chemistry II, A Review of the Literature 1982-1994, Abel et al. Ed., Vol. 7, chapters 7, 8, 10 & 11, Pergamon Press, hereby expressly incorporated by reference). Such organometallic ligands include cyclic aromatic compounds such as the cyclopentadienide ion [C5H5(−1)] and various ring substituted and ring fused derivatives, such as the indenylide (−1) ion, that yield a class of bis(cyclopentadieyl) metal compounds, (i.e. the metallocenes); see for example Robins et al., J. Am. Chem. Soc. 104:1882-1893 (1982); and Gassman et al., J. Am. Chem. Soc. 108:4228-4229 (1986), incorporated by reference. Of these, ferrocene [(C5H5)2Fe] and its derivatives are prototypical examples which have been used in a wide variety of chemical (Connelly et al., Chem. Rev. 96:877-910 (1996), incorporated by reference) and electrochemical (Geiger et al., Advances in Organometallic Chemistry 23:1-93; and Geiger et al., Advances in Organometallic Chemistry 24:87, incorporated by reference) electron transfer or "redox" reactions. Metallocene derivatives of a variety of the first, second and third row transition metals are useful as redox moieties (and redox subunits). Other potentially suitable organometallic ligands include cyclic arenes such as benzene, to yield bis(arene) metal compounds and their ring substituted and ring fused derivatives, of which bis(benzene) chromium is a prototypical example. Other acyclic π-bonded ligands such as the allyl(−1) ion, or butadiene yield potentially suitable organometallic compounds, and all such ligands, in conjunction with other π-bonded and δ-bonded ligands constitute the general class of organometallic compounds in which there is a metal to carbon bond. Electrochemical studies of various dimers and oligomers of such compounds with bridging organic ligands, and additional non-bridging ligands, as well as with and without metal-metal bonds are all useful.

When one or more of the co-ligands is an organometallic ligand, the ligand is generally attached via one of the carbon atoms of the organometallic ligand, although attachment may be via other atoms for heterocyclic ligands. Preferred organometallic ligands include metallocene ligands, including substituted derivatives and the metalloceneophanes (see page 1174 of Cotton and Wilkenson, supra). For example, derivatives of metallocene ligands such as methylcyclopentadienyl, with multiple methyl groups being preferred, such as pentamethylcyclopentadienyl, can be used to increase the stability of the metallocene. In some embodiments, the metallocene is derivatized with one or more substituents as outlined herein, particularly to alter the redox potential of the subunit or moiety.

As described herein, any combination of ligands may be used. Preferred combinations include: a) all ligands are nitrogen donating ligands; b) all ligands are organometallic ligands.

Sandwich Coordination Complexes

In some embodiments, the ReAMs are sandwich coordination complexes. The terms "sandwich coordination compound" or "sandwich coordination complex" refer to a compound of the formula L-Mn-L, where each L is a heterocyclic ligand (as described below), each M is a metal, n is 2 or more, most preferably 2 or 3, and each metal is positioned between a pair of ligands and bonded to one or more hetero atom (and typically a plurality of hetero atoms, e.g., 2, 3, 4, 5) in each ligand (depending upon the oxidation state of the metal). Thus sandwich coordination compounds are not organometallic compounds such as ferrocene, in which the metal is bonded to carbon atoms. The ligands in the sandwich coordination compound are generally arranged in a stacked orientation (i.e., are generally cofacially oriented and axially aligned with one another, although they may or may not be rotated about that axis with respect to one another) (see, e.g., Ng and Jiang (1997) Chemical Society Reviews 26: 433-442) incorporated by reference. Sandwich coordination complexes include, but are not limited to "double-decker sandwich coordination compound" and "triple-decker sandwich coordination compounds". The synthesis and use of sandwich coordination compounds is described in detail in U.S. Pat. Nos. 6,212,093; 6,451,942; 6,777,516; and polymerization of these molecules is described in U.S. Ser. No. 10/800,147, entitled "Procedure for Preparing Redox-Active Polymers on Surfaces," by Bocian, Liu and Lindsey, assigned to the Regents of the University of California, all of which are included herein, particularly the individual substituent groups that find use in both sandwich complexes and the "single" macrocycle" complexes.

The term "double-decker sandwich coordination compound" refers to a sandwich coordination compound as described above where n is 2, thus having the formula L'-M'-LZ, wherein each of L1 and LZ may be the same or different (see, e.g., Jiang et al. (1999) J. Porphyrins Phthalocyanines 3: 322-328) and U.S. Pat. Nos. 6,212,093; 6,451,942; 6,777, 516; and polymerization of these molecules is described in U.S. Ser. No. 10,800,147, entitled "Procedure for Preparing Redox-Active Polymers on Surfaces," by Bocian, Liu and Lindsey, assigned to the Regents of the University of California hereby incorporated by reference in its entirety.

The term "triple-decker sandwich coordination compound" refers to a sandwich coordination compound as described above where n is 3, thus having the formula L'-M' LZ-MZ-L3, wherein each of L1, LZ and L3 may be the same or different, and M1 and MZ may be the same or different (see, e.g., Arnold et al. (1999) Chemistry Letters 483-484), and U.S. Pat. Nos. 6,212,093; 6,451,942; 6,777,516; and polymerization of these molecules is described in U.S. Ser. No. 10/800,147, entitled "Procedure for Preparing Redox-Active Polymers on Surfaces," by Bocian, Liu and Lindsey, assigned to the Regents of the University of California, hereby incorporated by reference in their entirety.

In addition, polymers of these sandwich compounds are also of use; this includes "dyads" and "triads" as described in U.S. Pat. No. 6,212,093; U.S. Pat. No. 6,451,942; U.S. Pat. No. 6,777,516; and polymerization of these molecules is described in U.S. Ser. No. 10/800,147, entitled "Procedure for Preparing Redox-Active Polymers on Surfaces," by Bocian, Liu and Lindsey, assigned to the Regents of the University of California.

Non-Macrocyclic Proligands and Complexes

As a general rule, ReAMs comprising non-macrocyclic chelators are bound to metal ions to form non-macrocyclic chelate compounds, since the presence of the metal allows for multiple proligands to bind together to give multiple oxidation states.

In some embodiments, nitrogen donating proligands are used. Suitable nitrogen donating proligands are well known in the art and include, but are not limited to, NH2; NHR; NRR'; pyridine; pyrazine; isonicotinamide; imidazole; bipyridine and substituted derivatives of bipyridine; terpyridine and substituted derivatives; phenanthrolines, particularly 1,10-phenanthroline (abbreviated phen) and substituted derivatives of phenanthrolines such as 4,7-dimethylphenanthroline and dipyridol[3,2-a:2',3'-c]phenazine (abbreviated dppz); dipyridophenazine; 1,4,5,8,9,12-hexaazatriphenylene (abbreviated hat); 9,10-phenanthrenequinone diimine (abbreviated phi); 1,4,5,8-tetraazaphenanthrene (abbreviated tap); 1,4,8,11-tetra-azacyclotetradecane (abbreviated cyclam) and isocyanide. Substituted derivatives, including fused derivatives, may also be used. It should be noted that macrocyclic ligands that do not coordinatively saturate the metal ion, and which require the addition of another proligand, are considered non-macrocyclic for this purpose. As will be appreciated by those in the art, it is possible to covalent attach a number of "non-macrocyclic" ligands to form a coordinatively saturated compound, but that is lacking a cyclic skeleton.

Suitable sigma donating ligands using carbon, oxygen, sulfur and phosphorus are known in the art. For example, suitable sigma carbon donors are found in Cotton and Wilkenson, Advanced Organic Chemistry, 5th Edition, John Wiley & Sons, 1988, hereby incorporated by reference; see page 38, for example. Similarly, suitable oxygen ligands include crown ethers, water and others known in the art. Phosphines and substituted phosphines are also suitable; see page 38 of Cotton and Wilkenson.

The oxygen, sulfur, phosphorus and nitrogen-donating ligands are attached in such a manner as to allow the heteroatoms to serve as coordination atoms.

Polynucleating Proligands and Complexes

In addition, some embodiments utilize polydentate ligands that are polynucleating ligands, e.g. they are capable of binding more than one metal ion. These may be macrocyclic or non-macrocyclic.

A number of suitable proligands and complexes, as well as suitable substituents, are outlined in U.S. Pat. Nos. 6,212,093; 6,728,129; 6,451,942; 6,777,516; 6,381,169; 6,208,553; 6,657,884; 6,272,038; 6,484,394; and U.S. Ser. Nos. 10/040,059; 10/682,868; 10/445,977; 10/834,630; 10/135,220; 10/723,315; 10/456,321; 10/376,865; all of which are expressly incorporated by reference, in particular for the structures and descriptions thereof depicted therein.

Polymers

The memory elements of the invention may also comprise polymers of the ReAMs as outlined above; for example, porphyrin polymers (including polymers of porphyrin complexes), macrocycle complex polymers, ReAMs comprising two redox active subunits, etc. can be utilized. The polymers can be homopolymers or heteropolymers, and can include any number of different mixtures (admixtures) of monomeric ReAMs, wherein "monomer" can also include ReAMs comprising two or more subunits (e.g. a sandwich coordination compound, a porphyrin derivative substituted with one or more ferrocenes, etc.). ReAM polymers are described in U.S. Ser. No. 10/800,147, entitled Procedure for Preparing Redox-Active Polymers on Surfaces, Bocian, Liu and Lindsey, assigned to the Regents of the University of California, which is expressly incorporated by reference in its entirety.

Figure 30A:
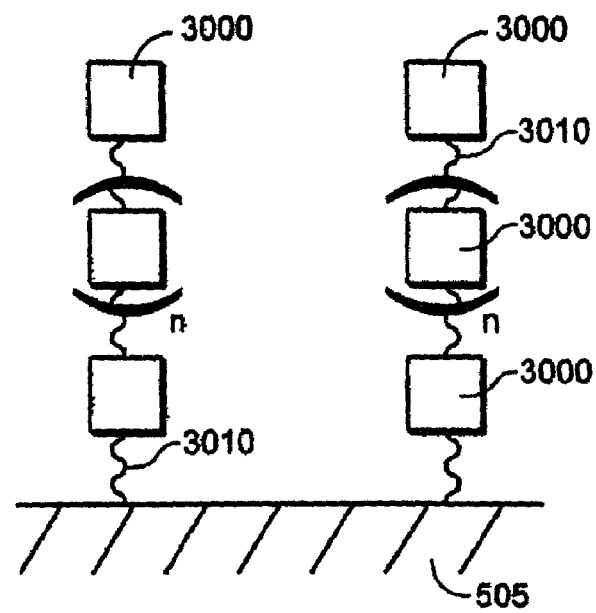
FIGS. 30a, 30b and 30c schematically depict a variety of polymer configurations.
Figure 30B:
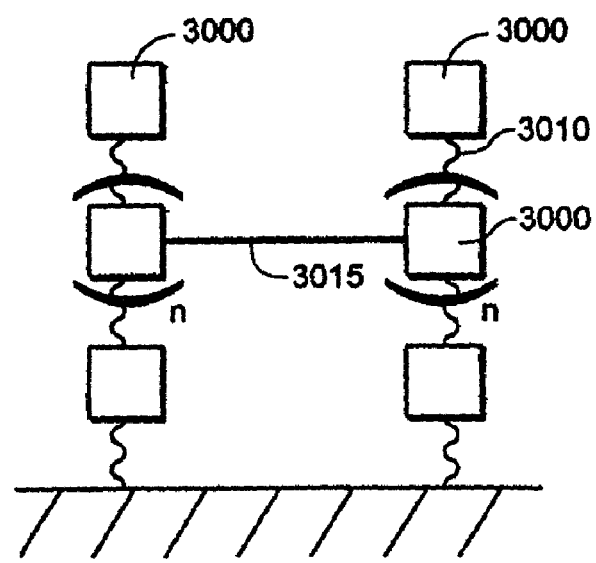
Figure 30C:
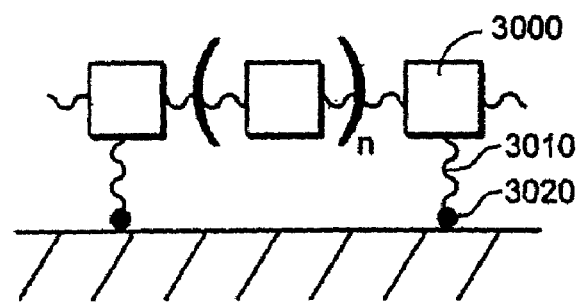

The configuration of the polymers on the electrode can vary. In some embodiments, the polymers are linear in the Z dimension (the direction perpendicular to the substrate surface, as is depicted in FIG. 30A), and can be optionally crosslinked (FIG. 30B). Branched polymers in the Z dimension are also contemplated, and can be optionally crosslinked as well. Linear polymers in the X-Y-dimension (FIG. 30C), or branched and/or crosslinked polymers are also included. In addition, mixtures of polymers can be used in any of these configurations.

In some embodiments, configurations (including selection of linkers) that control orientation and spacing of the ReAMs, whether polymeric or monomeric, are preferred, as generally higher densities of the ReAMs can be achieved, as well as better electron transfer and electron transfer rates. Linker length can contribute to the rate and retention of charge.

In general, the polymerization embodiments rely on the use of substitutents that will result in both attachment to the electrode surface as well as polymerization to additional ReAMs. As described in U.S. Ser. No. 10/800,147, entitled "Procedure for Preparing Redox-Active Polymers on Surfaces," by Bocian, Liu and Lindsey, assigned to the Regents of the University of California, there are two general methods for the synthesis of these ReAMs: "in situ" polymerization on the surface, and prepolymerization followed by addition to the surface using one or more attachment moieties, described in detail in U.S. Ser. No. 10/800,147, expressly incorporated by reference in its entirety, and with particular respect herein as to the "one-step" and "two-step" polymerization/attachment steps.

Substitutents

Many of the compounds described herein utilize substituents, generally depicted herein as "R". Suitable R groups include, but are not limited to, hydrogen, alkyl, alcohol, aryl, amino, amido, nitro, ethers, esters, aldehydes, sulfonyl, silicon moieties, halogens, cyano, acyl, sulfur containing moieties, phosphorus containing moieties, amido, imido, carbamoyl, linkers, attachment moieties and other ReAMs (e.g. subunits). It should be noted that some positions may allow two substitution groups, R and R', in which case the R and R' groups may be either the same or different, and it is generally preferred that one of the substitution groups be hydrogen.

A number of suitable proligands and complexes, as well as suitable substituents, are outlined in U.S. Pat. Nos. 6,212,093; 6,728,129; 6,451,942; 6,777,516; 6,381,169; 6,208,553; 6,657,884; 6,272,038; 6,484,394; and U.S. Ser. Nos. 10/040,059; 10/682,868; 10/445,977; 10/834,630; 10/135,220; 10/723,315; 10/456,321; 10/376,865; all of which are expressly incorporated by reference, in particular for the structures and descriptions thereof depicted therein, hereby expressly incorporated as substitutent embodiments, both for the particular macrocycle the substituents are depicted within and for further substituted derivatives.

By "alkyl group" or grammatical equivalents herein is meant a straight or branched chain alkyl group, with straight chain alkyl groups being preferred. If branched, it may be branched at one or more positions, and unless specified, at any position. The alkyl group may range from about 1 to about 30 carbon atoms (C1-C30), with a preferred embodiment utilizing from about 1 to about 20 carbon atoms (C1-C20), with about C1 through about C12 to about C15 being preferred, and C1 to C5 being particularly preferred. Also included within the definition of an alkyl group are cycloalkyl groups such as C5 and C6 rings, and heterocyclic rings with nitrogen, oxygen, sulfur or phosphorus. Alkyl also includes heteroalkyl, with heteroatoms of sulfur, oxygen, nitrogen, and silicone being preferred.

By "aryl group" or grammatical equivalents herein is meant aromatic aryl rings including mono- and multi-substituted aryl rings, mono- and multi-ring systems, mono- and multi-substituted heterocyclic rings, and heterocyclic aromatic rings and ring systems such as pyridine, furan, thiophene, pyrrole, indole and purine.

Included within the definition of "alkyl" and "aryl" are substituted alkyl and aryl groups. That is, the alkyl and aryl groups may be substituted, with one or more "R" substitution groups as defined herein. For example, a phenyl group may be a substituted phenyl group substituted with one or more R groups. Preferred alkyl groups alkylthio, perfluoroalkyl, alkylamino, and alkoxy.

By "amino groups" or grammatical equivalents herein is meant —NH2, —NHR and —NR2 groups, with R being as defined herein.

By "nitro group" herein is meant an —NO2 group.

By "sulfur containing moieties" herein is meant compounds containing sulfur atoms, including but not limited to, thia-, thio- and sulfo-compounds, thiols (—SH and —SR), and sulfides (—RSR—), including sulfoxyl and sulfonyl. By "phosphorus containing moieties" herein is meant compounds containing phosphorus, including, but not limited to, phosphines and phosphates. By "silicon containing moieties" herein is meant compounds containing silicon.

By "ether" herein is meant an —O—R group. Preferred ethers include alkoxy groups, with —O—(CH2)2CH3 and —O—(CH2)4-CH3 being preferred.

By "ester" herein is meant a —COOR group.

By "halogen" herein is meant bromine, iodine, chlorine, or fluorine. Preferred substituted alkyls are partially or fully halogenated alkyls such as CF3, etc.

By "aldehyde" herein is meant —RCHO groups.

By "alcohol" herein is meant —OH groups, and alkyl alcohols —ROH.

By "amido" herein is meant —RCONH— or RCONR— groups.

By "ethylene glycol" herein is meant a —(O—CH2-CH2)n-group, although each carbon atom of the ethylene group may also be singly or doubly substituted, i.e. —(O—CR2-CR2)n-, with R as described above. Ethylene glycol derivatives with other heteroatoms in place of oxygen (i.e. —(N—CH2-CH2)n- or —(S—CH2-CH2)n-, or with substitution groups) are also preferred.

Attachment Moieties

As depicted herein, attachment moieties (depicted herein as "Z") are used to attach the ReAMs of the invention to the electrodes. "Molecules bearing an attachment group" include molecules wherein the attachment group is an intrinsic component of the molecule, molecules derivatized to add an attachment group, and molecules derivatized so they bear a linker comprising an attachment group.

The nature of the attachment moiety depends on the composition of the electrode substrate. In general, attachment moieties, together with the linkers, if present, allow the electronic coupling of the storage molecule to the electrode.

Generally, suitable attachment moieties include, but are not limited to, carboxylic acids, carboxylic esters, alcohols, thiols (including S-acetylthiols) selenol, tellurol, phosphonic acids, phosphonothioate, amines, amides, trimethylsilylarenes, nitrile, aryl and alkyl groups, including substituted aryl and alkyl groups such as iodoaryls and bromomethyls. U.S. Ser. No. 10/800,147, entitled "Procedure for Preparing Redox-Active Polymers on Surfaces," by Bocian, Liu and Lindsey, assigned to the Regents of the University of California, incorporated by reference herein for this purpose, provides an extensive list of suitable attachment moieties and linkers (both independently and as "L-Z" groups); see paragraphs 107 to 113). It should be noted that the attachment moieties can result in a ReAM (or linker attached to a ReAM) being attached via a single group (e.g. "monopodal" attachment) or multiple groups ("polypodal" attachment). In some embodiments, polypodal attachment, such as tripodal attachment, results in a more fixed orientation of the ReAM (including ReAM polymers) which can lead to higher density and cleaner signals. Polypodal (including tripodal) attachment moieties utilizing thiol, carboxylic acid, alcohol or phosphonic acids are particularly attractive. As outlined in the referenced application, some embodiments utilize attachment moieties based on triphenylmethane or tetraphenylmethane units, wherein 2 or 3 of the phenyl units are substituted with a suitable functional group for attachment (e.g. thiols such as Z-acetylthiol, or dihydroxylphosphoryl groups).

Linkers

Linkers are used in a variety of configurations in the present invention, including to link attachment moieties to the ReAMs of the invention, for linking together redox a active subunits of ReAMs, and in polymerization of ReAMs. Linkers are used In order to achieve fast writing and/or erasing at low voltages and a small cell size, the scaling of the linkers for use in the present invention can be optimized. Optimum linker size can be calculated theoretically (see U.S. Ser. No. 60/473,782, hereby expressly incorporated). Alternatively linkers (and in fact, the suitability of ReAMs as well) can be evaluated empirically simply by coupling the ReAM to the surface as described herein and in the cited references, and performing voltammetry to evaluate the electrochemical properties of the attached polymer.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated.

What is claimed is:

1. A molecular storage device, comprising
   a micron or sub-micron size electrochemical cell that includes:
   a working electrode electrically coupled to a layer of chemisorbed storage molecules at a working electrode surface;
   a counter electrode electrically coupled to a layer of chemisorbed redox-active molecules at a counter electrode surface, wherein the working electrode surface and the counter electrode surface are coplanar with each other; and
   an electrolyte that contacts the working electrode and the counter electrode.

2. The molecular storage device of claim 1, wherein the layer of chemisorbed storage molecules and the layer of chemisorbed redox-active molecules are coplanar with each other.

3. A molecular storage device, comprising
   a micron or sub-micron size electrochemical cell that includes:
   a working electrode electrically coupled to a layer of chemisorbed storage molecules at a working electrode surface;
   a counter electrode electrically coupled to a layer of chemisorbed redox-active molecules at a counter electrode surface; and
   an electrolyte that contacts the working electrode and the counter electrode, wherein the layer of chemisorbed storage molecules is formed by:
   physically depositing storage molecules on the surface of a partially fabricated semiconductor wafer in a first processing ambient;
   monitoring water and oxygen gases in the first processing ambient;
   chemically attaching some of the storage molecules to a plurality of working electrode surfaces on the wafer in a second processing ambient;
   monitoring water and oxygen gases in the second processing ambient; and
   removing chemically unattached storage molecules from the wafer.

4. A molecular storage device, comprising
   a micron or sub-micron size electrochemical cell that includes:
   a working electrode electrically coupled to a layer of chemisorbed storage molecules at a working electrode surface;
   a counter electrode electrically coupled to a layer of chemisorbed redox-active molecules at a counter electrode surface; and
   an electrolyte that contacts the working electrode and the counter electrode, wherein the layer of chemisorbed storage molecules and the layer of chemisorbed redox-active molecules are deposited in an apparatus, comprising:

a coating unit configured to deposit the layer of chemisorbed storage molecules and the layer of chemisorbed redox-active molecules on a partially fabricated semiconductor wafer;

an enclosed chamber that contains the coating unit;

one or more gas sensors that monitor one or more gases in the enclosed chamber; and a control system that manages the operation of the coating unit.

5. A memory element, comprising a transistor coupled to a micron or sub-micron size electrochemical cell, wherein the electrochemical cell includes:

a working electrode electrically coupled to a layer of chemisorbed storage molecules at a working electrode surface;

a counter electrode electrically coupled to a layer of chemisorbed redox-active molecules at a counter electrode surface; and an electrolyte that contacts the working electrode and the counter electrode.

6. The memory element of claim 5, wherein the layer of chemisorbed storage molecules and the layer of chemisorbed redox-active molecules are coplanar with each other.

7. A memory array, comprising an array of memory elements, wherein at least some of the memory elements comprise a transistor coupled to a micron or sub-micron size electrochemical cell, wherein the electrochemical cell includes:

a working electrode electrically coupled to a layer of chemisorbed storage molecules at a working electrode surface;

a counter electrode electrically coupled to a layer of chemisorbed redox-active molecules at a counter electrode surface; and an electrolyte that contacts the working electrode and the counter electrode.

8. The memory array of claim 7, wherein the layer of chemisorbed storage molecules and the layer of chemisorbed redox-active molecules are coplanar with each other.

9. A computing device, comprising a central processing unit coupled to a molecular memory that includes an array of memory elements, wherein at least some of the memory elements comprise a transistor coupled to a micron or sub-micron size electrochemical cell, wherein the electrochemical cell includes:

a working electrode electrically coupled to a layer of chemisorbed storage molecules at a working electrode surface;

a counter electrode electrically coupled to a layer of chemisorbed redox-active molecules at a counter electrode surface; and an electrolyte that contacts the working electrode and the counter electrode.

10. The computing device of claim 9, wherein the layer of chemisorbed storage molecules and the layer of chemisorbed redox-active molecules are coplanar with each other.

11. A method of reading a molecular memory device, comprising:

coupling a bit line to an electrochemical cell, wherein the electrochemical cell includes:

a working electrode electrically coupled to a layer of chemisorbed storage molecules at a working electrode surface;

a counter electrode electrically coupled to a layer of chemisorbed redox-active molecules at a counter electrode surface, wherein the working electrode surface and the counter electrode surface are coplanar with each other; and an electrolyte that contacts the working electrode and the counter electrode; and monitoring the bit line for changes in potential indicative of the oxidation state of the storage molecules.

12. A method of writing to a molecular memory device, comprising:

coupling a bit line to an electrochemical cell, wherein the electrochemical cell includes:

a working electrode electrically coupled to a layer of chemisorbed storage molecules at a working electrode surface;

a counter electrode electrically coupled to a layer of chemisorbed redox-active molecules at a counter electrode surface, wherein the working electrode surface and the counter electrode surface are coplanar with each other; and an electrolyte that contacts the working electrode and the counter electrode; and applying a voltage to the bit line to set the oxidation state of the storage molecules.

13. The molecular storage device of claim 3, wherein the working electrode surface and the counter electrode surface are coplanar with each other.

14. The molecular storage device of claim 3, wherein the partially fabricated semiconductor wafer includes a plurality of transistors.

15. The molecular storage device of claim 4, wherein the working electrode surface and the counter electrode surface are coplanar with each other.

16. The molecular storage device of claim 4, wherein the partially fabricated semiconductor wafer includes a plurality of transistors.

17. The memory element of claim 5, wherein the working electrode surface and the counter electrode surface are coplanar with each other.

18. The memory array of claim 7, wherein the working electrode surface and the counter electrode surface are coplanar with each other.

19. The computing device of claim 9, wherein the working electrode surface and the counter electrode surface are coplanar with each other.

* * * * *